United States Patent
Drillman et al.

(10) Patent No.: US 12,320,757 B2
(45) Date of Patent: *Jun. 3, 2025

(54) SEMICONDUCTOR INSPECTION TOOL SYSTEM AND METHOD FOR WAFER EDGE INSPECTION

(71) Applicant: CAMTEK LTD, Migdal Ha'emek (IL)

(72) Inventors: Carmel Yehuda Drillman, Haifa (IL); Moshe Edri, Kiryat Tivon (IL); Menachem Regensburger, Shimshit (IL); Baheej Bathish, Haifa (IL); Mordi Dahan, Kiryat Bialik (IL)

(73) Assignee: CAMTEK LTD, Migdal Ha'emek (IL)

( * ) Notice: Subject to any disclaimer, the term of this patent is extended or adjusted under 35 U.S.C. 154(b) by 31 days.

This patent is subject to a terminal disclaimer.

(21) Appl. No.: 18/216,162

(22) Filed: Jun. 29, 2023

(65) Prior Publication Data

US 2024/0003826 A1    Jan. 4, 2024

Related U.S. Application Data

(63) Continuation of application No. 18/080,006, filed on Dec. 13, 2022, now Pat. No. 11,828,713.

(Continued)

(51) Int. Cl.
*G01N 21/95*     (2006.01)
*G01N 21/88*     (2006.01)
*H01L 21/66*     (2006.01)

(52) U.S. Cl.
CPC ..... *G01N 21/9503* (2013.01); *G01N 21/8806* (2013.01); *G01N 2021/8825* (2013.01); *G01N 2021/8841* (2013.01); *H01L 22/12* (2013.01)

(58) Field of Classification Search
CPC .... E02D 2200/1685; E02D 2250/0046; E02D 2300/0032; E02D 2300/0034;
(Continued)

(56) References Cited

U.S. PATENT DOCUMENTS 7,773,212 B1    8/2010  Wolters
10,008,424 B2 *  6/2018  Wimplinger ............ H01L 22/12
(Continued)

FOREIGN PATENT DOCUMENTS

JP          200925003 A    2/2009
KR    1020100053038 A    5/2010

OTHER PUBLICATIONS

International Search Report for corresponding application PCT/IL2023/050661 filed Jun. 27, 2023: Mail date Sep. 13, 2023.
(Continued)

*Primary Examiner* — Tri T Ton
(74) *Attorney, Agent, or Firm* — CANTOR COLBURN LLP

(57) ABSTRACT

A semiconductor inspection tool system is disclosed. The system comprises a first illumination setup for generating at least one first illumination radiation and for directing the at least one first illumination radiation to at least one bonding region non-filled volume formed between two layers of a multi-layer stack. The system also comprises a second illumination setup being for generating at least one second illumination radiation and for directing the at least one second illumination radiation at multi-layer stack edges. The second illumination radiation is configured for illuminating at least a normal edge of at least two layers, the second illumination setup has different radiation parameters than the first illumination setup. The system further includes a bonding region sensor unit for collecting reflected electromagnetic radiation from a bonding region volume and generating at least one sensing data being indicative of the bonding region.

31 Claims, 37 Drawing Sheets

Related U.S. Application Data

(60) Provisional application No. 63/367,440, filed on Jun. 30, 2022.

(58) Field of Classification Search
CPC ....... E02D 2600/20; E02D 5/223; E02D 5/30; E02D 5/58; G01N 2021/8825; G01N 2021/8841; G01N 21/8806; G01N 21/9503; H01L 22/12; H01L 21/67092; H01L 21/67253
See application file for complete search history.

(56) References Cited

U.S. PATENT DOCUMENTS

| | | | |
|---|---|---|---|
| 11,828,713 B1* | 11/2023 | Drillman | G01N 21/8806 |
| 2005/0036671 A1* | 2/2005 | Watkins | G01N 21/9503 |
| | | | 382/145 |
| 2008/0212084 A1 | 9/2008 | Watkins | |
| 2009/0161094 A1 | 6/2009 | Watkins | |
| 2009/0196489 A1 | 8/2009 | Le | |
| 2010/0246934 A1 | 9/2010 | Hayashi | |
| 2011/0064297 A1 | 3/2011 | Sakaguchi | |
| 2013/0215258 A1 | 8/2013 | Gaglin | |
| 2015/0270175 A1* | 9/2015 | Hu | H01L 29/66795 |
| | | | 257/798 |
| 2015/0355106 A1 | 12/2015 | Horn | |
| 2015/0370175 A1 | 12/2015 | Nicolaides et al. | |
| 2017/0140524 A1 | 5/2017 | Karsenti | |

OTHER PUBLICATIONS

Written Opinion for corresponding application PCT/IL2023/050661 filed Jun. 27, 2023: Mail date Sep. 13, 2023.

* cited by examiner

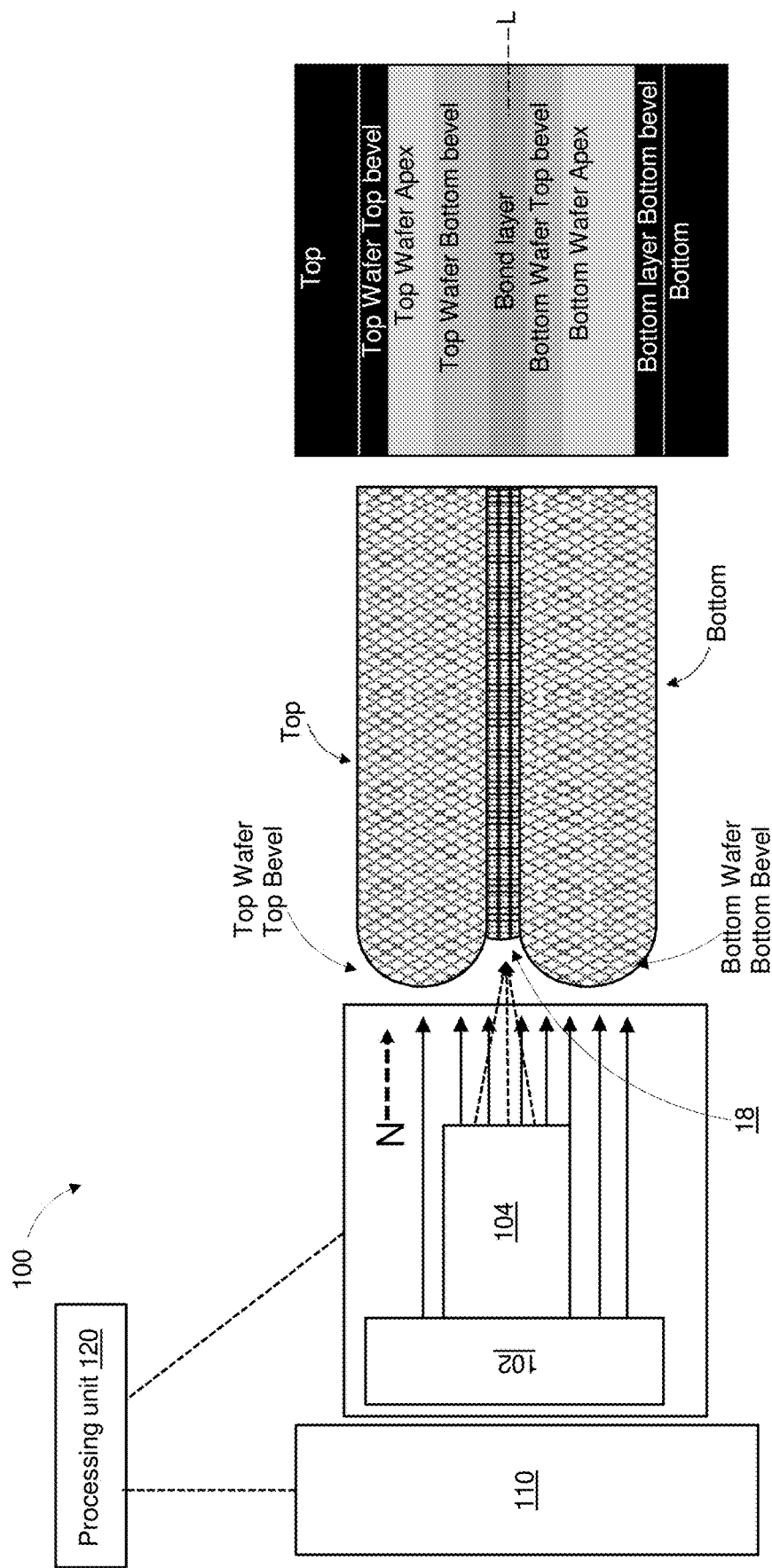

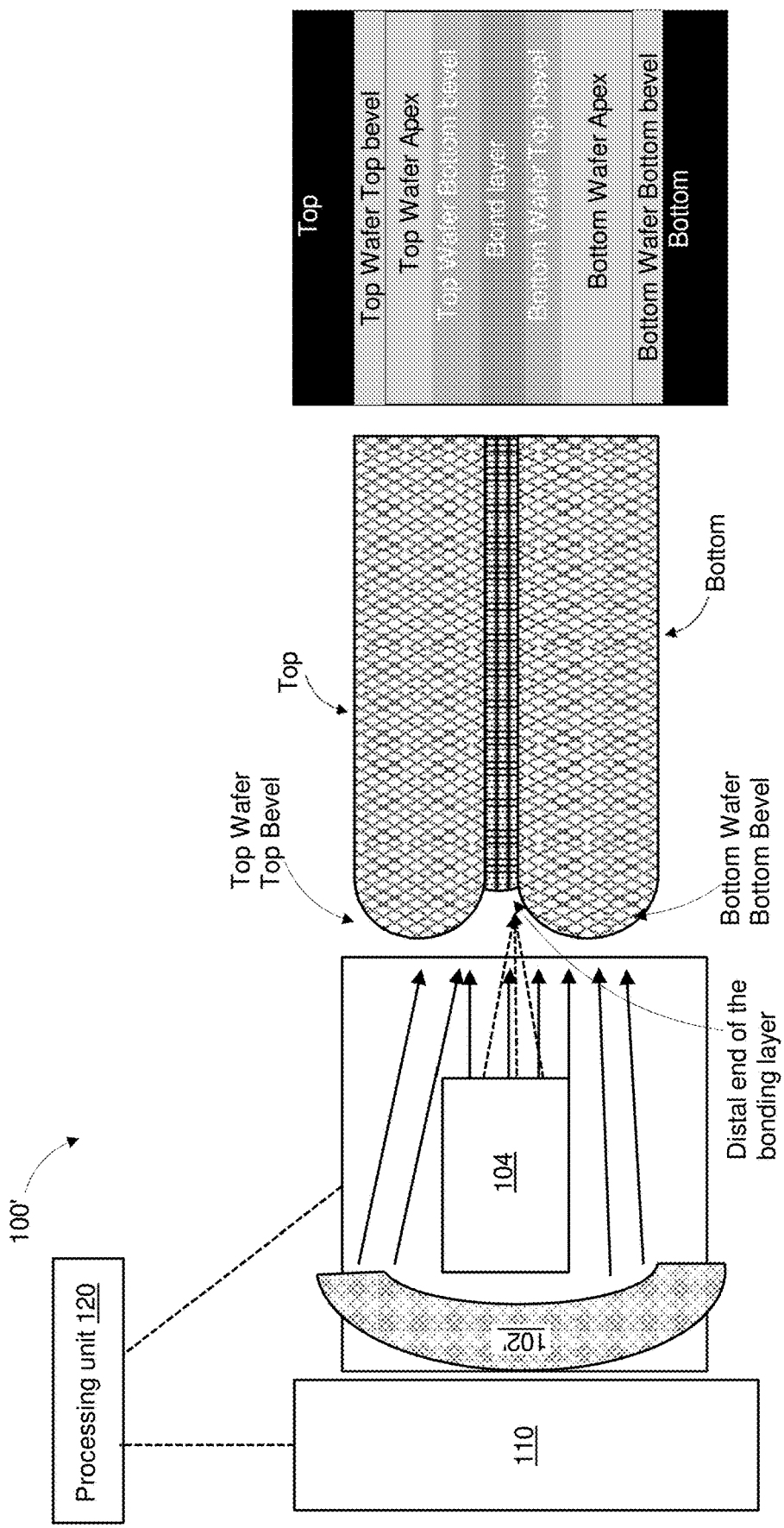

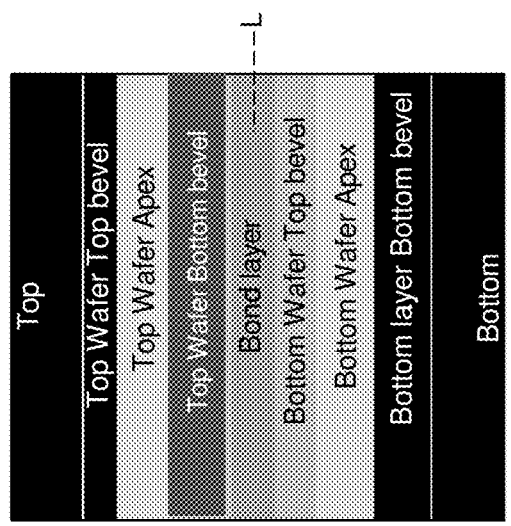
FIG. 5C
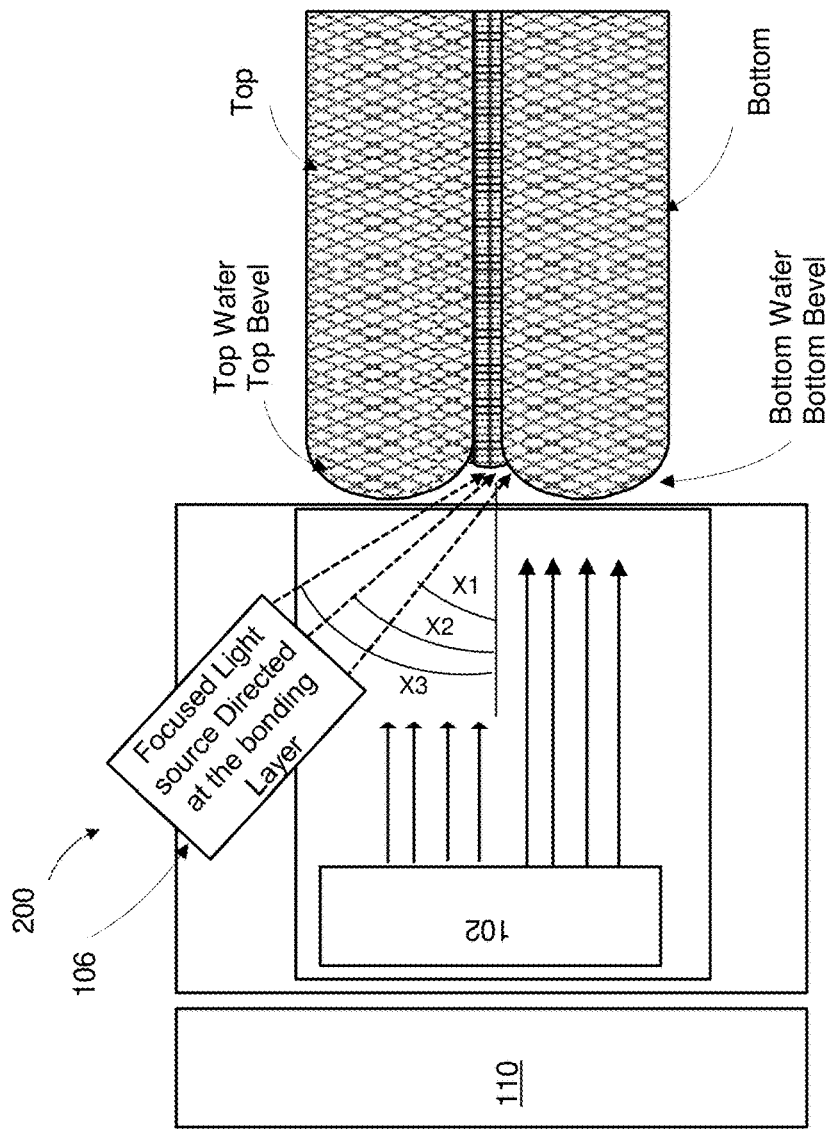
FIG. 5B
FIG. 5A

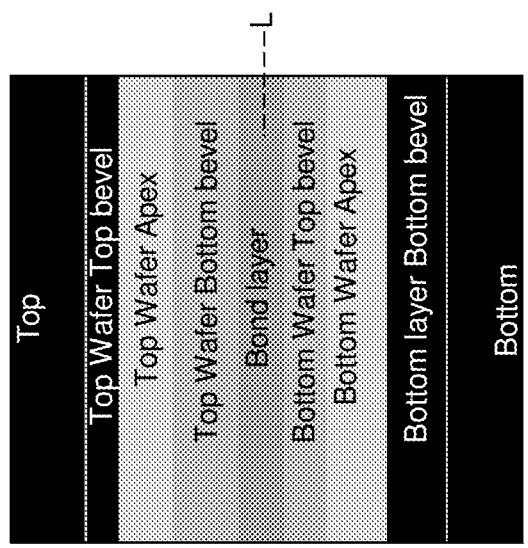
FIG. 5F
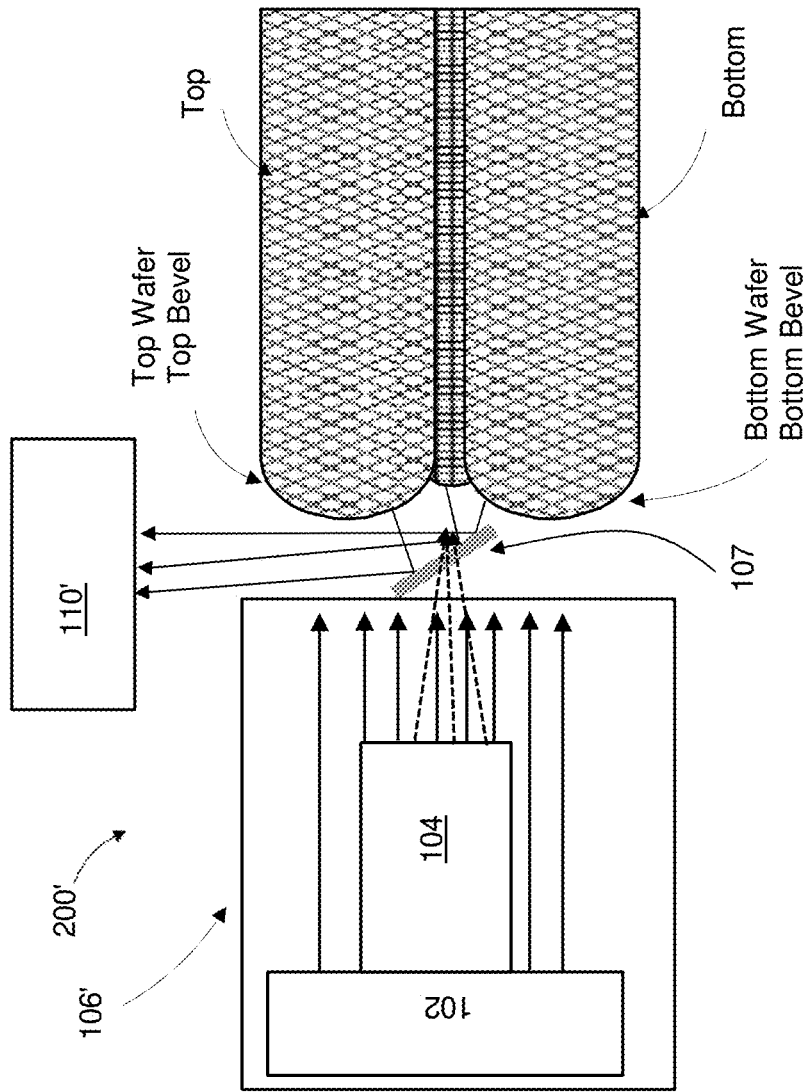
FIG. 5E
FIG. 5D

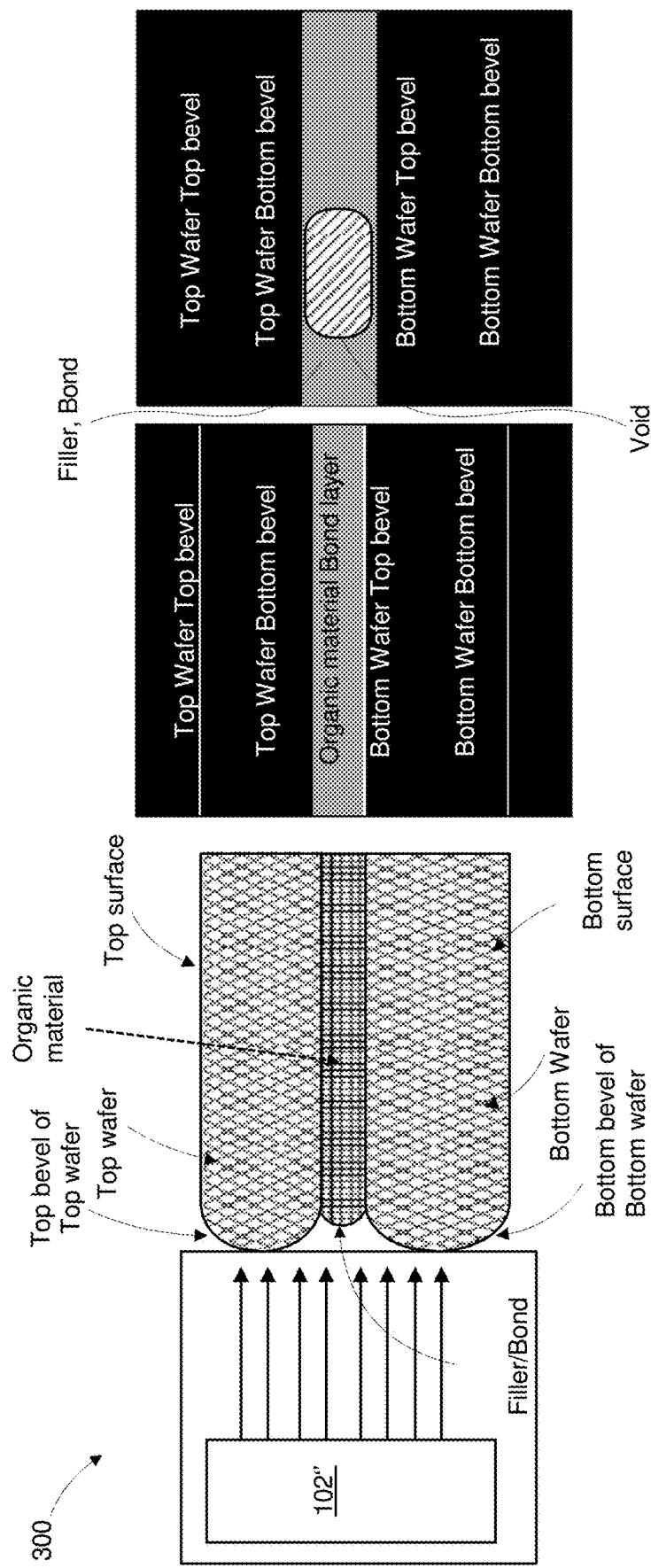

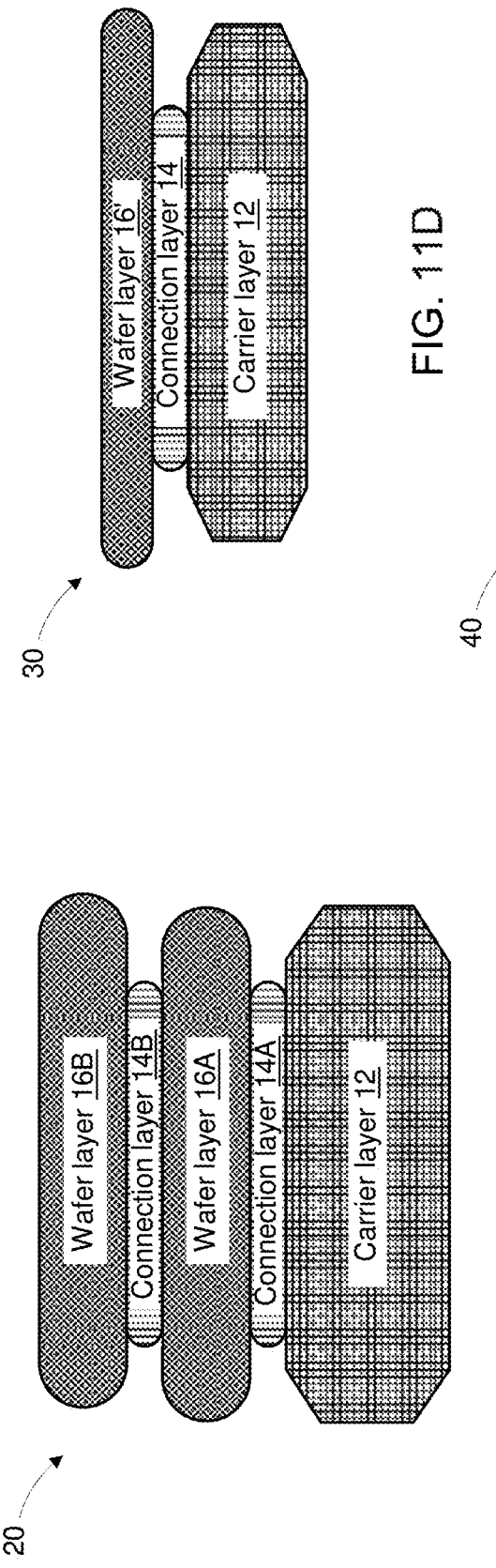
FIG. 11C
FIG. 11D
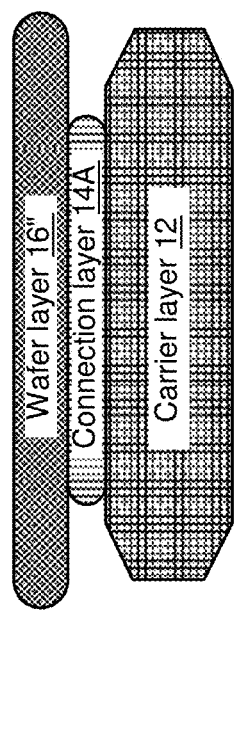
FIG. 11E
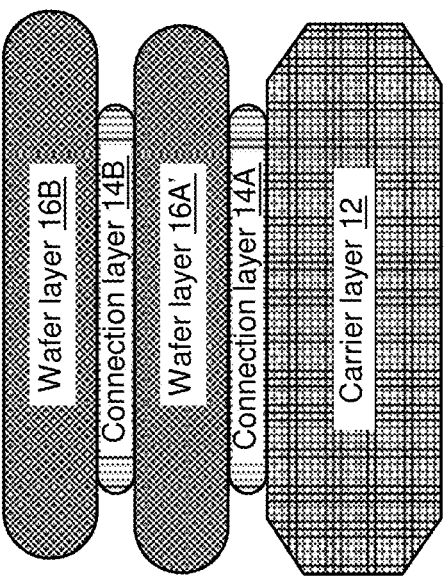
FIG. 11F

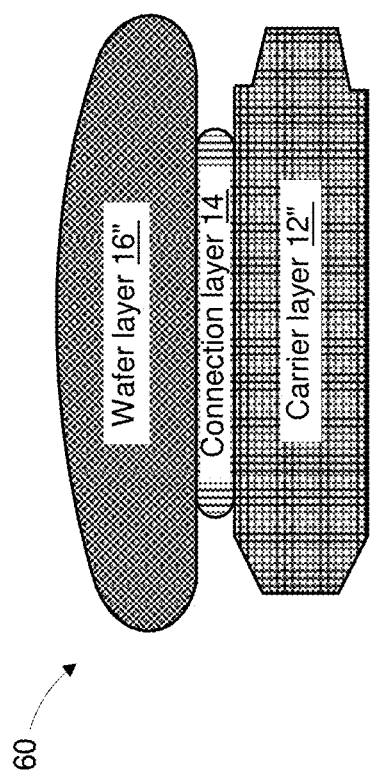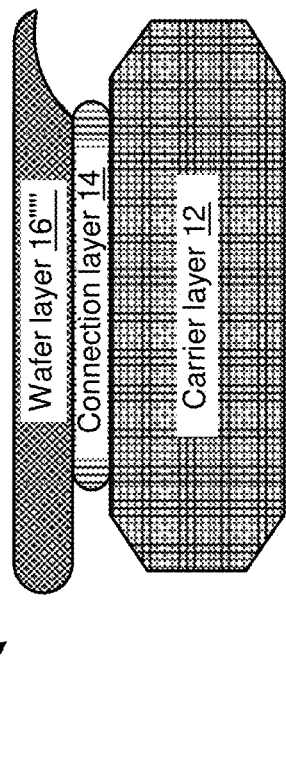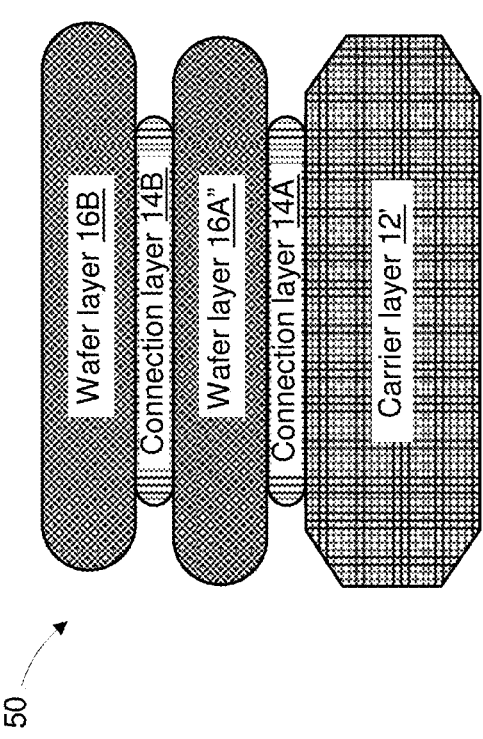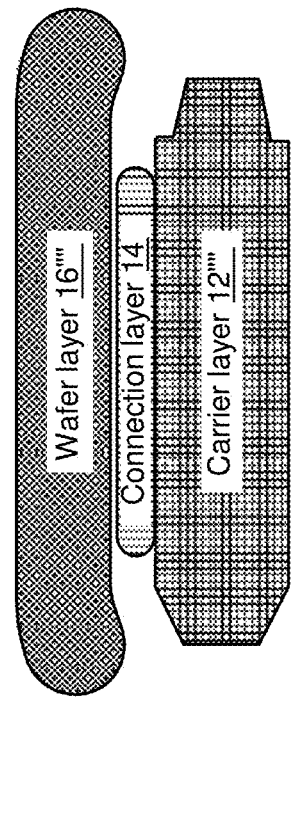
FIG. 11H
FIG. 11J
FIG. 11G
FIG. 11I

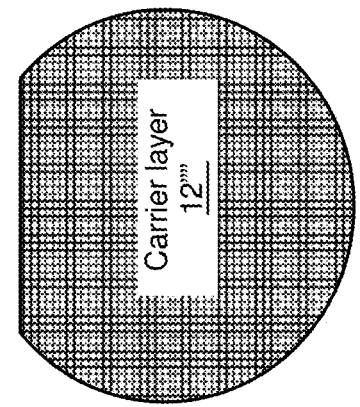
FIG. 13D
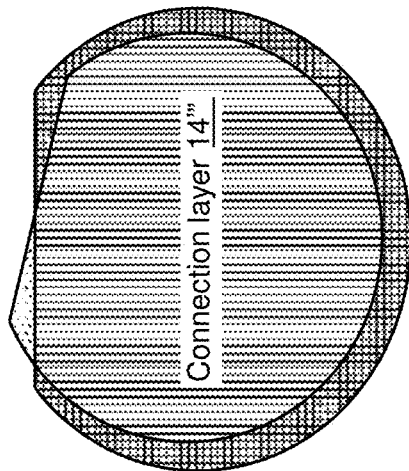
FIG. 13F
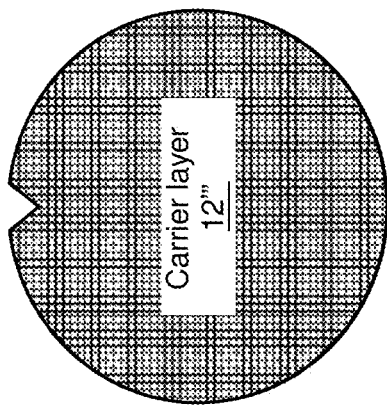
FIG. 13C
FIG. 13E

SEMICONDUCTOR INSPECTION TOOL SYSTEM AND METHOD FOR WAFER EDGE INSPECTION

CROSS REFERENCE TO RELATED APPLICATIONS

This application is a continuation of U.S. patent application Ser. No. 18/080,006 filed on Dec. 13, 2022, which claimed priority to U.S. Provisional Patent Application Ser. No. 63/367,440 filed on Jun. 30, 2022, where the entire content of both of said applications is herein incorporated by reference.

TECHNOLOGICAL FIELD

The present disclosure relates generally to a wafer inspection process. More specifically, the present disclosure relates to a semiconductor inspection tool system and method for inspecting semiconductor components.

BACKGROUND ART

References considered to be relevant as background to the presently disclosed subject matter are listed below:
US Patent Publication No. 2009/0196489
US Patent Publication No. 2015/0355106
KR Patent Publication No. 20100053038
US Patent Publication No. 2008/0212084

Acknowledgment of the above references herein is not to be inferred as meaning that these are in any way relevant to the patentability of the presently disclosed subject matter.

BACKGROUND

Inspection of the Edge & Bevel (E&B) is a common process step in wafer manufacturing. E&B inspection includes the wafer edge surface, being the outwards radially facing edge, as well as the rims of the top and bottom wafer (product) surfaces, also referred to as bevels. The E&B inspection is often faster and cheaper than the top or bottom side inspection and is sometimes conducted prior to other types of inspection.

The E&B inspection provides insights with respect to the wafer/product state, as well as to the manufacturing process. In manufacturing, it can provide data that is indicative of process stability. It can be also used in process development phases, after each stage of the manufacturing processes being developed.

In some cases, data obtained in the inspection of the E&B can be used to decide whether to continue the inspection process and/or the manufacturing process. In some cases, data obtained in the E&B inspection can be integrated with top or bottom side inspection results, to present a more complete picture of the wafer condition.

The development of multi-stack packages has increased the need for E&B inspection. In some cases, an inspection of the wafer edge provides insights of the internal aspects of the multi-stack package. Insights that cannot easily be obtained by other inspection means.

A typical stack (i.e., multi-stack) configuration includes multiple wafer layers with layers of bonding material in between. In some cases, the bonding layer is a glue, a resin, or a material that holds the stack layers physically connected. A typical stack configuration has, thus, more than one edge and more than one bevel, or more than one pair of bevels. The edge and bevel of the wafer stack define a bonding region volume. The bonding interface volume includes an interstitial space between every two layers of the stack and an external region between the bevels of each two layers of the stack.

General Description

Obtaining sensing data of at least one bonding region between two layers in a multi-stack package (e.g., advanced packaging) can provide interesting layer data indicative of the internal aspects of the multi-stack package. However, it should be understood that, typically, the outwards radially facing edge of a bonding layer is positioned inwardly with respect to the edge of the wafer(s), such that if an image of the bonding region is captured using the typical side and/or top and/or bottom edge imaging sensors, it would not be able to clearly see the edge of a bonding layer and indicative layer data in this volume might not be observable. The bonding region dimensions prevent effective inspection of the bonding layer's radial outer aspects or of the bonding region's top and bottom surfaces. Indeed, the portion of the captured image corresponding to the bonding region would present a black line, since not enough amount of light can penetrate the bonding region and/or is reflected from the inner aspects of the bonding region (i.e., the outer surface of the wafer edge).

There is thus a need to inspect the bonding region from the outer diameter of the bonding material to the edge and bevels of the wafer(s).

The term "wafer" refers hereinafter to any substrate (i.e. base material) made of silicon, glass, or any other semiconductor material such as germanium, gallium arsenide, silver (Ag), gold (Au), aluminum (Al), copper (Cu), tantalum (Ta), tin (Sn), tungsten (W), Palladium (Pd), aluminum nitride, aluminum phosphide, aluminum antimonide, and aluminum arsenide. The wafer can be round, elliptical, square, hectogon, or may have any other geometrical shape. The substrate edge can be trimmed, polished, or treated in any other manner. The wafer's top surface may include one or more patterned layers or may be bare. The wafer may further include at least a portion of an integrated circuit, a thin-film head die, a micro-electro-mechanical system (MEMS) device, flat panel displays, magnetic heads, magnetic and optical storage media, other components that may include photonics and optoelectronic devices such as lasers, waveguides and other passive components processed on wafers, print heads, and bio-chip devices processed on wafers.

The term "multi-layer stack" or "stack" refers hereinafter to any possible configuration including more than one wafer layer, such as a two-layer stack that includes a bottom layer and a top layer wherein the top layer is mounted/bonded/glued on the bottom layer.

In an embodiment, the multi-layer stack includes three layers, including a bottom layer, (layer number 1), a middle layer (layer number 2), and a top layer (layer number 3).

In an embodiment, the multi-layer stack includes N layers, including a bottom layer (layer number 1), middle layers (layers 2 to (N−1)), and a top layer (layer number N).

The wafer does not have any limited thickness and may for example have a thickness of less than 10, 50, 100, 500, 600, 750, 1000, 1500, 3000, 5000, or 10000 microns.

The multi-layer stack does not have any limited thickness and may for example have a thickness that is less than 10, 50, 100, 500, 600, 750, 1000, 1500, 3000, 5000, 15,000, 25,000, 50,000, 100,000, or 250,000 microns.

The bottom and the top layers of a wafer or of the multi-stack wafer can be roughly divided into a flat portion and an edge region located at the distal end of the layer. The edge region includes curved segments and or substantially flat-angled segments. The term "substantially" hereinafter refers to more or less 5 degrees.

The term "edge" or "bevels" refers hereinafter to the non-flat part of the layer(s). The term edge also applies to the bonding layer distal aspects.

The term "carrier" or "carrier layer" refers hereinafter to any substrate being configured to hold the semiconductor layer in the course of its processing. The carrier substrate may be a wafer. The carrier substrate is not limited to any material (for example it may be made of silicon, epoxy or glass, or any other wafer material), it may also be a PCB. The carrier may be opaque or translucent.

The term "bonding layer", "bond layer", or "connection layer" refers hereinafter to any filler layer separating wafers in a stack. In an embodiment, the bonding layer is configured to hold the parts of the multi-layer stack together. In an embodiment, the bonding layer provides isolation between wafers of the multi-layer stack. The bonding layer is not limited to any material and to any dimension and may be made for example of resin, glue, or organic material having for example a thickness of less than 1 µm, 10 µm, 25 µm, 50 µm, 75 µm, 100 µm, 200 µm, 500 µm, or 1000 µm. In an embodiment, the bonding layer thickness is less than the thickness of a wafer in the stack. In an embodiment, the bonding layer includes multiple layers of different material properties.

The term "wafer bonding region" or "bonding region" refers hereinafter to a section of the stack that includes a bonding layer and the top and bottom surfaces of the wafers interfacing with the bonding layer including filled and non-filled volumes. The surfaces of the wafers interfacing with the bonding layer include the flat portions (i.e., top and bottom), respective bevels (i.e., top and bottom), and the apex zone which may be radial, sectioned, or flat.

For example, in a multi-layer stack, the top plane of the bottom wafer is the bonding interface plane. It interfaces with the bonding layer. For example, in a three-layer stack, the top and bottom planes of the middle wafer are bonding interfaces because they interface with a bonding layer. The term "interstitial space opening" and "bonding region non-filled volume" are used interchangeably.

The term "bonding region non-filled volume" refers hereinafter to a subset of the bonding region defining the non-filled volume (without bonding layer material) defined between two layers of a multi-layer stack (i.e., the top and bottom wafers) as well as the volume in between top-wafer-bottom-bevel and the bottom-wafer-top-bevel forming an interstitial space. The interstitial space spans the bonding region non-filled volume from the outer diameter (i.e., distal end) of the bonding layer, to the edge and bevels of the layers of the stack (i.e., the closest distal end of either of the top or bottom layers, as seen in the cross-section view).

The bonding region non-filled volume, as seen in a cross-section view, can be further segmented, into 1) a rectangular region also referred to as the linear region, or interstitial space between the top and bottom flat layers of wafers; and 2) a triangular region (as seen in a cross-section view) between the bevels of the top and bottom layers of wafers in the stack. The triangular region is also referred to as the outer aspects or external region of the bonding region non-filled volume.

In some embodiments, the height of the interstitial space or thickness of the bonding layer is 1, 5, 10, 15, 20, 30, 40, 50, 60, 70, 80, 90, 100, 150, 200, 350, 500, 750, 1000 microns.

In some embodiments, the height of the interstitial space is substantially the same as the bonding layer thickness.

In some embodiments, the height of the interstitial space varies across its length.

In some embodiments, the height of the interstitial space is thicker in one portion of the interstitial space than in other portions of the interstitial space.

In some embodiments, the depth-to-thickness-ratio of the interstitial space is less than 0.1, 02, 0.5, 0.6, 0.7, 0.8, 0.9, 1.0, 2.0, 3.0, 5.0, 10.0, 15.0, 20.0, 30.0, 100.0.

The term "sensing data" refers hereinafter to any information that was reflected and collected from the surfaces of the wafer and layers.

In other words, it, therefore, refers to any information related to the area of interest collected by the bonding region sensor as will be detailed further below.

In the case of an imaging sensor, the sensing data is an image. If the imaging sensor is a line camera, the sensing data is a line image, if the imaging sensor is an area camera, the sensing data is an image area. In the case of a fluorescence detector, the sensing data is a fluorescent image. The sensing data includes triangulation data, leading to height and thickness measurements. During data processing patterns, abnormalities and metrology parameters can be identified.

In an embodiment, sensing data includes data being indicative of at least one of 2D geometrical dimensions, 3D geometrical dimensions, and surface characteristics such as color, roughness, and continuity. The 3D data may be sensed using triangulation systems, White Light Interferometry (WLI), and/or Chromatic Confocal Sensors. The term "sensing data" also refers to any data being indicative of anomalies and variations along the edge of the wafer including geometrical dimension variations, anomalies of shape, and anomalies of reflections characteristics. The data referring to any anomaly and variations along the edge of the wafer includes but are not limited to data being related to particles (e.g., resist particles, embedded particles), debris, chips, stains, cracks, scratches, copper-overflow, delamination, blisters, corrosion, surface roughness, discoloration, or any combination thereof. In an embodiment, sensing data may be categorized as defect data.

Detecting sensing data enables either re-work, discontinuing processing, or process enhancement to achieve better yields. Moreover, the sensing data, as viewed from the side or top, or bottom, can be external to the wafer, as will be detailed below for example with respect to external glue residue, or internal to the wafer, as in voids. In this connection, it should be noted that the discoloration is an indication of an anomaly. It is an indication of a possible event such as a material or manufacturing anomaly. In a specific and non-limiting example, the rate of discoloration can be an indication of thickness variation, contamination, and/or glue residue. In an embodiment, the rate of discoloration can be identified by thin film interference. In a specific and non-limiting example, the rate of discoloration indicates the presence of additional material with different reflectance properties. Different reflectance properties include but are not limited to wavelength, angle of incidence, intensity, and polarization.

In an embodiment, metallic particles can be identified by their shape, reflectance, color, and material properties. In an embodiment, metallic particles include Au, Ag, Cu, Al, and Pd particles.

According to a broad aspect of the present disclosure, there is provided a semiconductor inspection tool system being configured to inspect a bonding region being formed between two wafers in a multi-layer configuration by providing at least one illumination radiation being configured to illuminate the bonding region volume. The terms "illumination radiation", "light radiation", "radiation" or "light" are hereinafter used interchangeably. The at least one illumination radiation may be directed at the bonding region non-filled volume.

More specifically, there is provided a semiconductor inspection tool system comprising: a first illumination setup being configured and operable to generate at least one first illumination radiation and to direct the at least one first illumination radiation to at least one bonding region non-filled volume being formed between two layers of a multi-layer stack; a second illumination setup being configured and operable to generate at least one second illumination radiation and to direct the at least one second illumination radiation at multi-layer stack edges, the at least one second illumination radiation being configured for illuminating at least a normal edge of at least two layers, wherein the second illumination setup has different radiation parameters than the first illumination setup; and a bonding region sensor unit being configured and operable for collecting reflected electromagnetic radiation from a bonding region and generating at least one sensing data being indicative of the bonding region.

This technique can be a stand-alone technique aimed at inspecting the bonding region itself or may be combined with conventional edge and bevel inspection technique to improve the analysis of the edge and bevel inspections. The technique of the present disclosure enables to measure the bonding region dimensions (i.e., depth and thickness) and/or to inspect the bonding region's top and bottom surfaces and/or to sense the bonding layer's outer aspects, while the wafer stack is rotating at a speed of, for example, 10, 20, 40, 50, 60, 70, 80, 90, 100, 120, 150, 180, 200, 270 or 360 deg/sec. In this connection, it should be understood that in some cases, the bonding layer is not inspected to save time. Therefore, the inspection of the bonding region together with the inspection of the edge and bevels, or separately, enables to provide layer data that cannot be obtained by using other inspection processes. In this connection, it should be noted that the technique of the present disclosure enables to provide layer data being indicative of parameters in the bonding layer. The parameters in the bonding layer may include data being indicative of metrology measurements or changes in image properties indicative of material changes. The layer data can include defect data as described above or process data being indicative of processes or other events that occurred prior to the inspection of the bonding layer. The bonding region inspection can provide different types of defect data and variations along the edge of the wafer such as detecting the presence of particles (e.g., resist particles, embedded particles), debris, chips, stains, cracks, scratches, copper-overflows, delaminations, blisters, corrosion.

In an embodiment, the bonding region inspection can enable measuring debris' size (e.g. less than 1, 2, 3, 4, 5, 6, 7, 8, 9, 10, 20, 30, 50, 75, 100, 200, 350, 500, 750, 1000 µm) and estimating surface roughness.

The technique of the present disclosure is not limited to any specific configuration of the wafers in the multi-layer stack and may be able to provide a simultaneous inspection of both the E&B and the bonding region, for multiple wafers in the stack. The multiple wafers may have identical or different diameters and/or the same or different thicknesses.

In some embodiments, the second illumination radiation comprises omnidirectional or isotropic light. The second illumination radiation may be further configured and operable for illuminating at least one of a top bevel or a bottom bevel of at least one layer.

To be able to provide clear sensing data (e.g., having a better resolution, contrast, and picture clarity) being indicative of the bonding region, increased illumination should be provided. This may be implemented by increasing the sensor exposure time and/or by providing a dedicated illumination radiation source. If the exposure time of the sensor is increased, increased illumination may be obtained without changing the illumination set-up. However, this may affect the throughput of the system and result in light saturation on some areas of the sensor.

In an embodiment, a High Dynamic Range (HDR) image of a wafer region, may be created, by combining multiple images that were captured using different exposure rates. This may be implemented while compensating for differences in rotational velocity.

In some embodiments, the system may take more than one inspection pass (i.e., rotation) i.e., the wafer (stack) may be rotated multiple times. In different passes, the exposure rate and or other exposure parameters may be varied. At each rotation, i.e., inspection pass, the exposure rates may differ.

In an embodiment, the one illumination radiation is parallel to the bonding region center plane. More specifically, the first illumination radiation may be directed towards a bonding region at a direction substantially parallel to the bonding region center plane. At least one of the first or second illumination setups may comprise optical elements for at least one of directing or affecting the illumination radiations.

In an embodiment, the one illumination radiation is at an angle to the bonding region center plane.

In an embodiment, the first illumination beam parameters are configured to generate an illumination beam having a diameter in the same order of magnitude larger than a bonding region thickness. The diameter may be smaller than 2, 3, or 5 multiples of the bonding region thickness.

In some embodiments, parameters are changed during the inspection pass, within a rotation cycle.

In some embodiments, filters may be applied to remove saturation glare.

In some embodiments, the output of the multiple passes is used to present a composite picture of the apex surfaces of a multi-stack, including the apex radial surfaces (i.e. bevels) of at least one of the wafers.

In some embodiments, the output of the multiple passes, wherein at least two passes are at different focus positions, are used to present a composite, all-in-focus image, of at least one section of the apex surface of a multi-stack.

In some embodiments, the at least one illumination radiation is configured to provide a high-power focused light radiation directed at the bonding region's inner aspects i.e., in a two-layer stack, the volume above a bottom layer and below a top layer is also defined as the plane at the mid-height of the bonding region.

In some embodiments, including a multi-stack with more than two layers, and more than one bonding interface, the at least one illumination radiation is configured to provide a high-power focused light radiation directed at multiple bonding interface inner aspects.

In some embodiments, including a multi-stack with more than two layers, and more than one bonding interface, more than one illumination radiation is configured to provide a high-power focused light radiation directed at each of the bonding interface's inner aspects.

In some embodiments, including a multi-stack with more than two layers, and more than one bonding interface, at least one illumination radiation is configured to provide a high-power focused light radiation directed at each of the bonding interface inner aspects.

In an embodiment, the illumination radiation is an illumination beam. The dimension of the illumination beam is not limited, however, to be effective the diameter of the illumination beam should not exceed 10, 20, 50, 75, 100, 250, 500, 750, or 1000 μm. A beam shaper may also be used to create a spot whose shape is round or ellipsoidal, a line or rectangle, substantially triangular, or any other illumination beam having a shape corresponding to the bonding region. The beam shape (i.e., profile cross-section and redistribution of the irradiance and phase of a beam of radiation) as well as the diameter of the beam affect the amount of light being able to enter the interstitial space opening.

In some embodiments, the semiconductor inspection tool system comprises a dedicated external light source being configured and operable to generate the high-power focused light radiation and to direct the illumination radiation by using single/multiple light guides towards the bonding region. The external light source is not limited to any configuration and may have single or multiple light sources with different spectral distributions. For example, the light source types may be Xenon, Arc lamp, flash lamp, incandescent lamp, light-emitting diode (LED), laser driven light source, or laser Alternatively, the high-power focused light radiation may be generated by any of the conventional side and/or top and/or bottom edge illumination sources generating illumination radiations(s) being directed towards the stack edge layers. For example, the high-power focused light radiation may be generated by at least one focused LED being positioned (or being an integral part) on a conventional illumination arc. The illumination radiation being generated by the LED may be focused by using converging optics (e.g., not diverging or diffusing) towards the center of the bonding region. The high-power focused light radiation may also be generated by using off-axis illumination (e.g., conventional dark field illumination) in order to highlight diffusive defects/contaminations and suppress specular reflections.

In some embodiments, the light radiation is a collimated light beam projected from a distance.

In some embodiments, the collimated light beam is directed with optical elements, e.g., a reflective surface, or a prism, shaped lens.

In some embodiments, the collimated light beam enables overcoming "system real-estate" constraints.

In some embodiments, the collimated light beam directed with optical elements enables overcoming "system real-estate" constraints.

In some embodiments, the semiconductor inspection tool system comprises a bonding region sensor unit being configured and operable to collect radiation from a bonding region and to generate at least one sensing data of the bonding region being defined between two layers of a stack of wafers.

In some embodiments, the bonding region sensor unit is configured and operable to collect radiation reflected at least from the bonding region, substantially, in the normal direction of the multi-stack's edge (illustrated FIG. 4A). The bonding region sensor unit may be positioned at the height of the bonding region horizontal center plane (i.e., the plane at the center of the bonding region).

In an embodiment, the bonding region sensor is positioned at a different location, and the radiation reflected at least from the bonding region is re-directed to it with an optical element (illustrated FIG. 5D). The bonding region sensor unit may include non-imaging detectors e.g., spectrometer, power meter, or imaging detectors, such that sensing data may include imaging data or non-imaging data.

In some embodiments, the bonding region sensor unit may comprise an apex sensor being positioned facing the center of the stack, such that its focal plane is placed at the distal end of the bonding interface layer, or at the distal end of the bonding region non-filled volume and within the field of view. The apex sensor is configured for collecting radiation reflected at least from the apex and the top and bottom bevels illustrated by regions Z2, Z3, Z4 in FIG. 7A. Optionally, the distal end of the bonding interface layer is in the center of the field of view. Optionally, the apex sensor is also configured and operable to collect radiations from the top and bottom flat regions (e.g., Z1 and Z5 of FIG. 7A).

In other words, the apex sensor can detect particles on at least one portion of at least one wafer of a multi-stack. The portions include the wafer apex (e.g., Z3 of FIG. 7A), the wafer top or bottom surfaces (e.g., Z1 or Z5 FIG. 7A), the wafer bevels (e.g., Z2 and Z4 FIG. 7A), in the bonding region non-filled volume, in the non-bonded region, on the distal edge of the bonding layer (e.g., Z6 of FIG. 7B), or on any combination thereof.

In some embodiments, the bonding region sensor unit may comprise a side sensor facing the apex of a wafer and or of a multi-stack (which is in the direction of the apexes of the wafers in the stack) and being positioned at any place defining an angle with the normal direction (i.e. at non-normal (i.e., angular) direction with the edge of the multi-layer stack of the wafer). The angle may be any angle in the range up to about +/−60 deg.

In some embodiments, the semiconductor inspection tool system further comprises at least one of an edge top sensor for obtaining sensing data of a top surface of a layer proximal to an outer edge of the layer or an edge bottom sensor for obtaining sensing data of a bottom surface of a layer proximal to an outer edge of the layer. The term "proximal" refers to being close to the outer edge of the layer being less than 20, 15, 5 mm. More specifically, when looking from above, at the top wafer/layer, proximal is measured from the tip of the apex of the top wafer, radially inwards, towards the wafer center, when looking from below, at the bottom wafer/layer, proximal is measured from the tip of the apex of the bottom wafer, radially inwards, towards the wafer center. In some embodiments, the illumination radiation has a direction being coaxial with the bonding region sensor's optical axis to enable the collection of the reflected radiation beam(s) while enabling illumination of the bonding region. The bonding region sensor unit may include any commercially available sensor and is not limited to any configuration. For example, it may include a line sensor such as a single line (e.g., monochrome), a bi-linear or a tri-linear sensor (i.e., RGB), photo-multiplier tubes (PMTs), charge-coupled devices (CCDs), a Time Delay Integration (TDI) sensor having a monochromatic, RGB or Bayer spectral coverage operable in global or rolling shutter modes. The area sensor may define a large area of pixels, Alternatively, at least a portion of radiation reflected from the bonding region's inner aspects may be collected by any of the conventional side and/or top and/or bottom edge imaging sensors facing the edges of the wafer stack and generating at least one image of the bonding region being defined between two layers of a stack of wafers.

In an embodiment, the bonding region sensor unit includes a processing unit.

In an embodiment, the one image being indicative of the bonding region is in focus (plus/minus 0.5 degrees of focus).

In an embodiment, the one image being indicative of the bonding region has uniform light conditions. The term "uniform light conditions" refers, as commonly known in the art, to the ratio of a minimum lighting level to an average lighting level in a specified area, or to the ratio of a minimum lighting level to a maximum lighting level in a specified area.

In some embodiments, the semiconductor inspection tool system comprises a plurality of sensors (e.g., bonding region sensor unit and/or edge top and/or edge bottom), each sensor being configured and operable to generate at least one image of each wafer edge surface in a stack of wafers respectively in a single shot or in multiple shots and calibration setting.

In an embodiment, the sensing data generated by multiple image sensors overlap. For example, an image generated by an edge top sensor includes portions of the top surface and portions of the top bevel.

In an embodiment, the image generated by a top sensor overlaps an image generated by the bonding region sensor unit, that includes portions of the top bevel. Similarly for images generated by a bottom imaging sensor.

The semiconductor inspection tool system may be connected to a processing unit being configured and operable for receiving and analyzing sensing data from at least one of the following sensors: the bonding region sensor unit, the edge top sensor, or the edge bottom sensor. The processing unit may be further configured and operable to analyze the sensing data and determine at least one of layer data, layer anomalies, or defect data.

In an embodiment, the processing unit includes a control unit being configured and operable to control the positioning of at least one of (i) at least some elements of the illumination setup, (ii) the bonding region sensor unit including the bonding region sensor and the optical elements directing reflected radiation towards the bonding region sensor if any, or (iv) the wafer stack and the bonding region, to be in the plane of the light source and/or of the bonding region sensor.

In some embodiments, the processing unit is configured and operable to receive and analyze at least one sensing data generated by the sensor(s). The processing unit is capable of identifying specific layer data e.g., identifying substrate layer defects, identifying adhesive layer defects as well as identifying metrology date, e.g., adhesive layer thickness variations.

The term "wafer notch" refers hereinafter to an indentation or incision on an edge or surface of the wafer that indicates the wafer's rotational orientation. The notch depth may be less than 0.5, 0.75, 1.0, 1.1, 1.5, 2.0, 3.0, or 5.0 mm.

In some embodiments, the illumination system includes a dedicated sub-illumination setup, focused on the apex. In some embodiments, the illumination setup includes a dedicated sub-illumination setup, focused on the bonding region non-filled volume. In some embodiments, the illumination setup includes multiple sub-illumination setups.

In some embodiments, the illumination radiation enters the non-filled volume of the bonding region at an angle lower than 0°, 1°, 2°, 5°, 8°, 10°, 20°, or 30° with respect to the bonding layer center plane. A low angle ensures that sufficient light can enter and exit the non-filled volume of the bonding region. The term "sufficient light" may be defined by the sensor sensitivity and dynamic range. Sufficient light may also be characterized by a sensor response in which the signal is above the dark noise threshold and below saturation levels.

In some embodiments, the illumination setup includes an optical element that focuses the light radiation toward the bonding region non-filled volume or toward the distal end of the bonding layer or any point in between.

In some embodiments, the illumination setup includes an optical element that focuses the light radiation towards a point in front of the bonding region non-filled volume or towards a point beyond the distal end of the bonding layer.

The edge and bevels inspection system (i.e. the measurement device) may include at least one of a non-imaging scatterometer, a scatterometer, a spectroscopic scatterometer, a reflectometer, a spectroscopic reflectometer, an ellipsometer, a spectroscopic ellipsometer, a bright field imaging device, a dark field imaging device, a bright field, and dark field imaging device, a bright field non-imaging device, a dark field non-imaging device, a bright field, and dark field non-imaging device, a coherence probe microscope, an interference microscope, an optical profilometer, or any combination thereof.

In some embodiments, the illumination radiation is created by an additional light source providing a high-power illumination and being positioned to direct the illumination radiation (s) towards the bonding region non-filled volume, parallel to the bonding region center plane. In this specific and non-limiting example, at least one of the LEDs of the apex illumination module positioned parallel to the bonding region center plane is replaced by a high-power illumination source to provide illumination radiation at the bonding region non-filled volume.

In some embodiments, the bonding region sensor is configured to collect light reflected from the entire cross-section of the bonding region non-filled volume as well as the apexes of either or both the bottom and top layers. For the bonding region sensor to function effectively, the light reflected from the apex and the bonding region should be on the same order of magnitude. If the difference between the light reflected from the apex and the bonding region is significant, two possible scenarios can occur. In one example, the amount of light reflected from the apex provides a sharp image on the bonding region sensor, and the amount of light reflected from the apex is significantly larger than the light reflected from the bonding region non-filled volume. The image of the bonding region non-filled volume would be a black line or black area. In another example, the amount of light reflected from the bonding region non-filled volume provides a sharp image on the bonding region sensor, and the amount of light reflected from the bonding region non-filled volume is significantly smaller than the light reflected from the apex. The image of the apex would be saturated.

In some embodiments, the statement "significantly larger of a value x," is 2×, 3×, 5×, or orders of magnitude larger, e.g., 1E3, 1E4, 1E5.

In some embodiments, the diameter of the area covered by the bonding region sensor is less than 100, 150, 200, 300, 400, 500, 750, 1000, 1500, 2000, 2500, 5000, 10E3, microns. In a cross-section view, as shown, the diameter is the height of the area.

In some embodiments, at least one of the first or the second illumination setups is configured and operable to generate a fluorescence emission of the bonding layer. The bonding region sensor may be configured and operable for collecting fluorescent emission.

In some embodiments, the first illumination setup is a part of the second illumination setup. The first and second illumination setups may comprise the same type of illumination setup. The first and second illumination setups may comprise at least one of (i) at least one bright field illumination setup or (i) at least one dark field illumination setup.

In some embodiments, the second illumination radiation parameters comprise at least one of, focusing, beam size, power, polarization, or direction. The second illumination radiation parameters may comprise beam propagation parameters comprising at least one of, collimation, convergence, or divergence.

According to another broad aspect of the present disclosure, there is provided a method for semiconductor inspection of a multi-layer stack. The method comprises generating at least one first illumination radiation and directing the at least one first illumination radiation at least one bonding region non-filled volume being formed between two layers of a multi-layer stack; generating at least one second illumination radiation and directing the at least one second illumination radiation at multi-layer stack edges, the at least one second illumination radiation being configured for illuminating at least a normal edge of at least two layers, wherein the second illumination radiation has different beam parameters than the first illumination radiation; collecting reflected electromagnetic radiation from at least one bonding region and generating at least one sensing data being indicative the bonding region.

In some embodiments, the method further comprises receiving sensing data being indicative of the bonding region and analyzing the sensing data to provide at least one of layer data being indicative of parameters of the bonding layer, layer anomalies, or defect data. Analyzing the sensing data may comprise measuring the bonding region dimensions, inspecting the bonding region's top and bottom surfaces, and identifying the bonding layer's outer aspects.

In some embodiments, the method further comprises illuminating at least one of a top bevel and a bottom bevel of the at least two layers.

In some embodiments, the method further comprises obtaining sensing data of a top surface of a layer proximal to an outer edge of the layer or obtaining sensing data of a bottom surface of a layer proximal to an outer edge of the layer.

In some embodiments, the method further comprises providing a simultaneous inspection of the edge and bevels of wafers in the multi-layer stack and of the bonding region between them.

In some embodiments, the method further comprises inspecting a plurality of wafer layers having different diameters and/or thicknesses and/or materials and/or outer shapes to identify at least one geometrical difference between the different layers or abnormal geometrical edge configuration.

In some embodiments, the method further comprises generating and collecting a fluorescence emission of the bonding layer.

In some embodiments, the method further comprises controlling the operation of each illumination radiation and the synchronization between them.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 4A shows a schematic block diagram of a possible configuration of the semiconductor inspection tool system according to some embodiments of the present disclosure; FIG. 4B shows a schematical cross-sectional view of a multi-layer stack; FIG. 4C shows a corresponding image of a side of the multi-layer stack of FIG. 4B captured by a bonding region sensor;

FIG. 4D shows a schematic block diagram of another possible configuration of the semiconductor inspection tool system according to some embodiments of the present disclosure having an arc-shaped illumination setup; FIG. 4E shows a schematical cross-sectional view of a multi-layer stack; FIG. 4F shows a corresponding image of a side of the multi-layer stack of FIG. 4E captured by a bonding region sensor;

FIG. 5A and FIG. 5D show schematic block diagrams of possible configurations of the semiconductor inspection tool system according to some embodiments of the present disclosure; FIG. 5B and FIG. 5E show a schematical cross-sectional view of a multi-layer stack; FIG. 5C and FIG. 5F show corresponding images of a side of the multi-layer stack of FIG. 5B and FIG. 5E captured by a bonding region sensor;

FIG. 6A shows a schematic block diagram of a possible configuration of the illumination setup of a semiconductor inspection tool system being capable of detection fluorescent radiation being emitted by the bonding region according to some embodiments of the present disclosure; FIG. 6B shows a schematical cross-sectional view of a multi-layer stack; FIG. 6C shows a corresponding image of a side of the multi-layer stack of FIG. 6B captured by a bonding region sensor; FIG. 6D shows an image of a side of a multi-layer stack having an internal defect captured by a bonding region sensor;

FIGS. 11A-11K show schematical cross-sectional views of possible multi-layer stacks;

FIGS. 13C-13D show a schematical top view of the carrier layer having a notch and flat respectively; FIGS. 13E-13F show a schematical top view of the carrier layer and a bonding layer deposited on top of the carrier layer having a notch and flat respectively;

DETAILED DESCRIPTION OF EMBODIMENTS

Figure 1B:
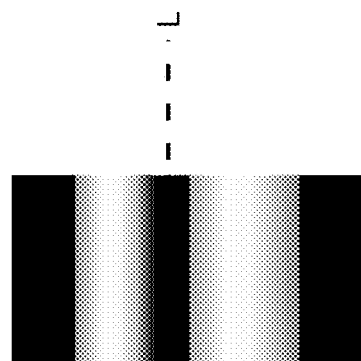
FIG. 1B shows an image of a side of the multi-layer stack of FIG. 1A captured by a side imaging sensor, using a commercially available semiconductor inspection system.

As described above, obtaining sensing data of at least one bonding region defined by the gap between two wafers in a multi-layer stack can provide interesting layer data being indicative of the internal aspects of the multi-layer stack. Reference is made to FIG. 1A showing a schematical cross-sectional view of a typical multi-layer stack 10. Elements in the figures are illustrated for simplicity and clarity and have not necessarily been drawn to scale. Multi-layer stack 10 is composed of a bottom layer 12 supporting a top layer 16 via a bonding layer 14 in between layer 12 and layer 16. In this specific and non-limiting example, bottom layer 12 is a carrier layer. The side aspects of multi-layer stack 10 illustrate a region referred hereinafter as a bonding region 18 defining the volume in between the outwards radially facing edges of bottom layer 12, bonding layer 14 and top layer 16, and of the rims of bottom layer 12 and top layer 16 defining the bevels. More specifically, bonding region 18 may be roughly divided into an interstitial non-filled space 18A in between the top and the bottom layers defining a linear region and a "triangular" region 18B in between the edge of the bottom surface of the top layer and the edge of the top surface of the bottom bordering interstitial space 18A. The opening of the interstitial space 18A is defined from the distal end of the flat regions of the top and bottom layers to the distal end of the bonding layer. As clearly shown in the figure, bonding region 18 is characterized by a non-planar outer surface for which the imaging of its inner aspects is challenging. Moreover, the thickness of bonding layer 14 has a dimension much smaller than the thickness of top layer 16 and bottom layer 12 and is positioned typically inwardly with respect to the edge of top layer 16 and of bottom layer 12. In an embodiment, much smaller may refer to being less than 0.7, 0.5, 0.3, 0.2 multiple of the top layer 16 or bottom layer 12 thickness. The bonding region dimensions prevent effective inspection of the bonding layer's radial outer aspects and/or of the bonding region's top and bottom surfaces that are defined by the top and bottom wafers. More specifically, in order to obtain sensing data being indicative of the distal end of the bonding layer, light rays must enter the non-filled volume of the bonding region and reflect outwards toward a sensor.

Figure 1A:
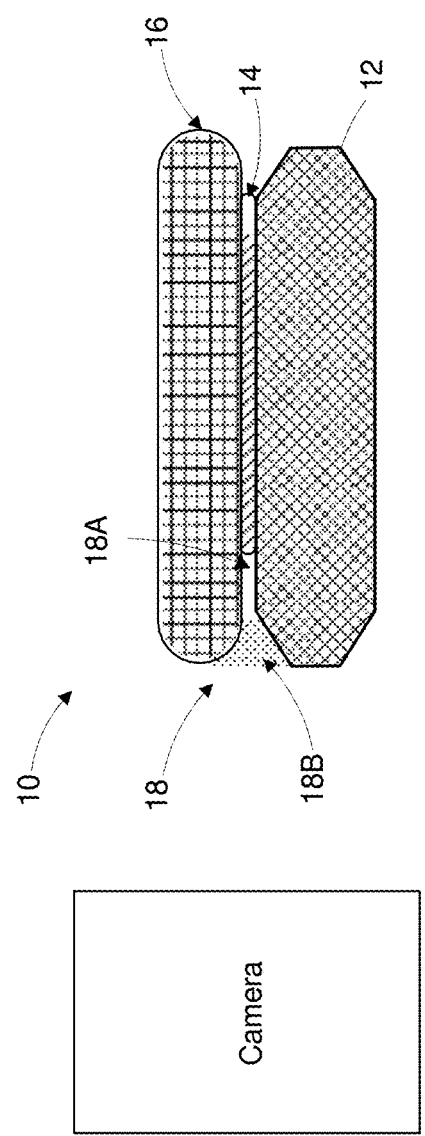
FIG. 1A shows a schematical cross-sectional view of a typical multi-layer stack.

FIG. 1B illustrates an image of the side aspects of multi-layer stack 10 that would be obtained using a commercially available side camera. The image presents a black line L at its center corresponding to the mid-height of the bonding region 18. The image is black because not enough light penetrates the bonding region area and/or not enough light is reflected from the inner aspects of the bonding region (i.e., the outer surface of the wafer and carrier edges). Therefore, as it is clearly shown by multiple examples, the image does not provide sufficient information to detect, classify or identify abnormalities and or defects. The image does not provide sufficient information to enable accurate measurement of geometrical parameters relating to the inner aspects of the bonding region.

Figures 2A, 2B, 2C:
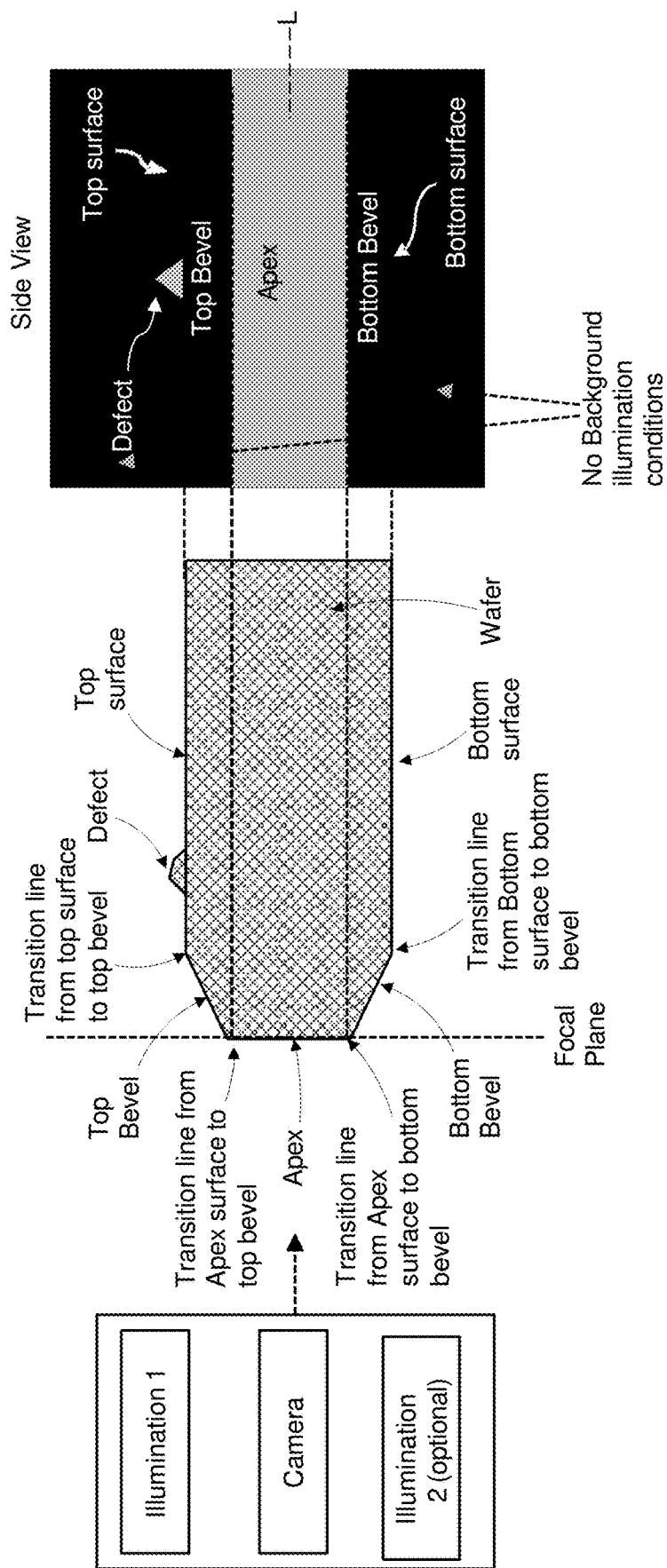
FIG. 2A shows a schematic block diagram of a commercially available semiconductor edge and bevels inspection system.
FIG. 2B shows a schematical cross-sectional view of a flat edge of an unstacked wafer having a defect on its top surface.
FIG. 2C shows a corresponding image of a side of the unstacked wafer of FIG. 2B captured by a side imaging sensor.
Figure 2D:
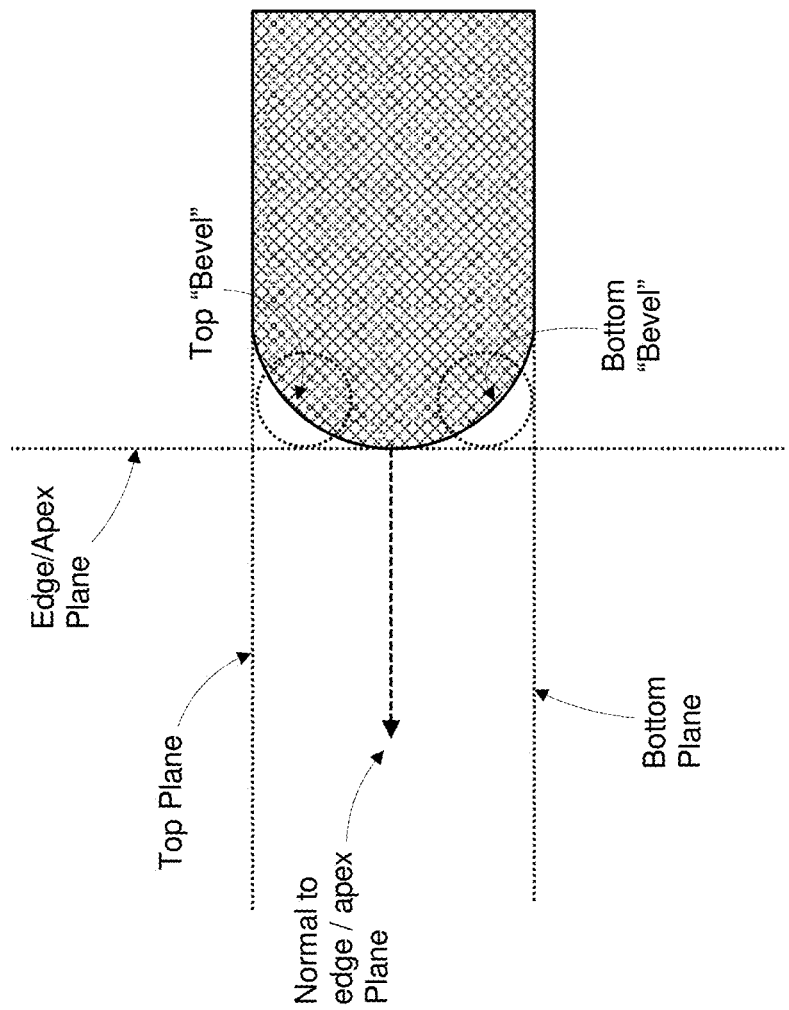
FIG. 2D shows a schematical cross-sectional view of a rounded edge of a single wafer.

Reference is made to FIGS. 2A-2D showing a schematic block diagram of a conventional edge and bevels inspection system (FIG. 2A), a flat edge of an unstacked/wafer having a defect on its top surface (FIG. 2B), a corresponding image of the side view of the unstacked wafer edge (FIG. 2C) and a rounded edge of an unstacked wafer (FIG. 2D). The edge and bevels inspection tool system of FIG. 2A includes inter alia a first illumination module being configured and operable to generate at least one illumination radiation(s) being directed towards the wafer/stack edge layer, a sensor (e.g. line camera in this example) being configured and operable to collect the reflected radiation from the apex plane, in the normal direction of the wafer/multi-stack's edge and an optional second illumination module being configured and operable to illuminate at least one of the following regions: top bevel, normal edge, and a bottom bevel of the at least one stack layer. The unstacked wafer of FIG. 2B generally defines a top and a bottom surface. The distal end of the layer forms an apex surface that can be flat or rounded. The apex surface includes all of the surfaces of the layer facing the apex sensor, from the top plane to the bottom plane, including the top and bottom bevels and the apex (also referred to as normal edge) surface. The apex surface defines a focal plane according to which the position of the sensor is typically oriented. In an embodiment, the apex plane is approximately parallel to the sensor plane. The apex area reflects light effectively towards the sensor, enabling it to provide a high resolution of details. The top and bottom bevels are located between the apex surface and the top and bottom surfaces, respectively. Transition lines connect between the top and bottom surface and the top and bottom bevels, respectively. The transition lines form the border between the top and bottom bevels and the apex surface. The image of FIG. 2C obtained by the camera is a side view showing the bottom and top surfaces, having undefined background illumination conditions (i.e., background illumination being undefined by any light source), the top and bottom bevels, and the apex. The bevel areas are black because light reflected from these surfaces does not reach the sensor. In an embodiment, the bevel areas are not completely black indicating that some amount of light reflected from these surfaces does reach the sensor. The defect, positioned on the top surface in FIG. 2B is clearly identified in the image, FIG. 2C. FIG. 2D illustrates a rounded edge configuration of an unstacked wafer. The unstacked wafer defines a top plane, a bottom plane, and an edge/apex plane being perpendicular to the flat surface of the wafer. Top and bottom bevels, defining areas at the edge of the wafer in which the plane is neither vertical nor horizontal with respect to the wafer's flat surface, are also shown in the figure. The apex surface includes all of the surfaces of the layer facing the apex sensor, from the top plane to the bottom plane, including the top and bottom bevels and apex (also referred to as normal edge) surface. The normal edge surface defines the normal direction at the distal end of the wafer radius, between bevels being substantially perpendicular to the apex. The normal edge surface may have any shape and may be rounded, substantially flat, or even angled.

Figures 3A, 3B:
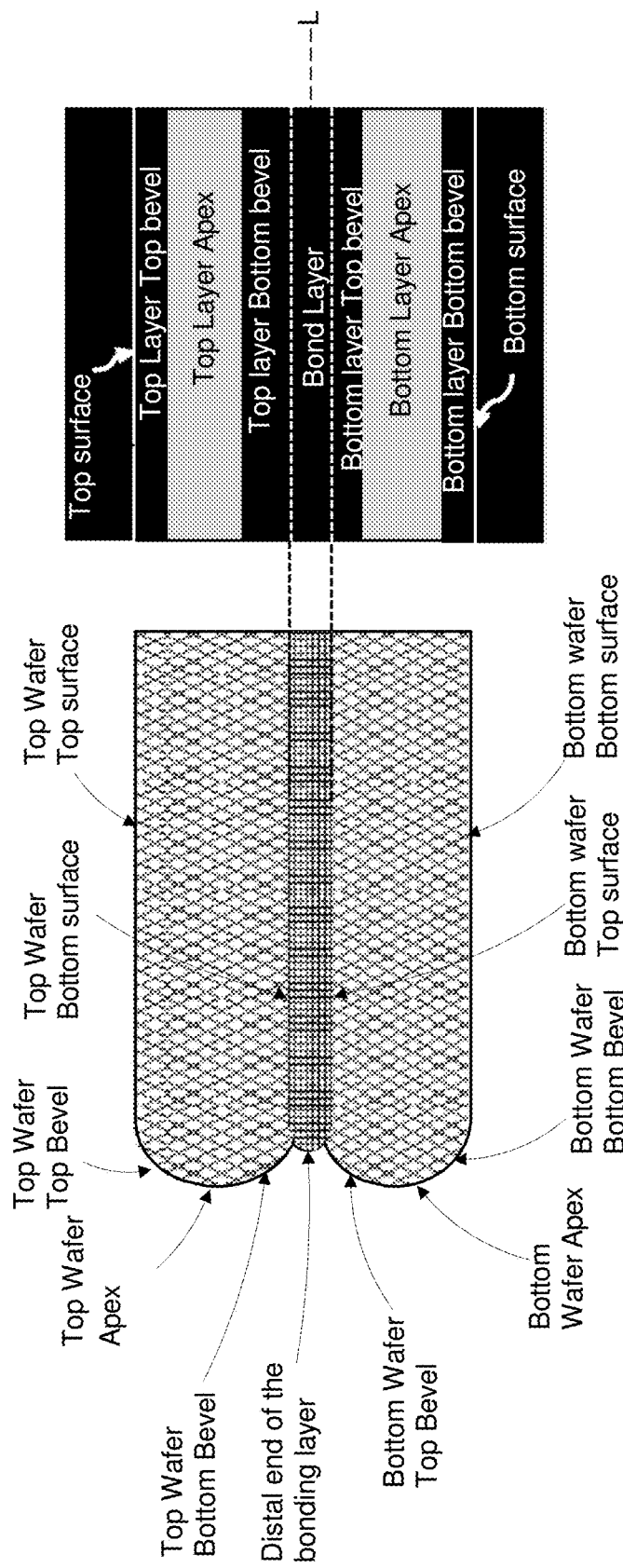
FIG. 3A shows a schematical cross-sectional view of a possible multi-layer stack.
FIG. 3B shows a corresponding image of a side of the multi-layer stack of FIG. 3A captured by a side imaging sensor.

Reference is made to FIGS. 3A-3B showing a schematic illustration of a multi-layer stack and a corresponding image obtained by using a conventional inspection edge and bevels tool/system. The multi-layer stack of FIG. 3A includes a top layer and a bottom layer attached via a bonding layer. The distal end of the bonding layer is shown in the figure. The top layer defines the upper portion of the stack, including a flat top surface, top and bottom bevels formed at the distal non-flat portion of the top layer, and a top layer apex located at the apex plane. The bottom layer defines the bottom portion of the stack with similar elements: a flat bottom surface, top and bottom bevels formed at the distal non-flat portion of the bottom layer, and a bottom layer apex located at the apex plane.

The stack apex surface includes all of the surfaces of the multi-layer stack, facing the apex sensor, from the top plane of the top layer to the bottom plane of the bottom layer, including the bonding layer filled and non-filled volumes. Image FIG. 3B is a side view of the multi-layer stack of FIG. 3A providing imaging data, including from top to bottom: the top flat surface, the top layer top bevel, the top layer apex, the top layer bottom bevel, the bonding layer, the bottom layer top bevel, the bottom layer apex, the bottom layer bottom bevel, and the bottom flat surface. More specifically, the black section in the side view image of FIG. 3B includes three sub-sections. From top to bottom: the bottom bevel of the top layer, the interstitial space opening, which is in the same plane as the bonding layer, and the top bevel of the bottom layer. The top and bottom layer apexes reflect light effectively towards the sensor enabling to identify the details of the apexes. As in FIG. 2B above, the image obtained in FIG. 3B is a side view clearly shows the bottom and top surfaces having undefined background illumination conditions (i.e., background illumination being undefined by any light source). Also, as clearly shown in the figure, the bottom layer top bevel, the bonding layer itself, and the top layer bottom bevel are represented in the figure as a black region without any capability to distinguish between these different regions. The internal bonding layer is in the gap between the top and bottom wafer/carrier and therefore cannot be directly imaged including its distal end. Due to the geometrical properties of this region, only a small portion of light emitted by the illumination module is reflected back to the sensor plane. Moreover, the top layer bottom bevel and the bottom layer top bevel border reduce the ability to identify the boundaries of the bonding layer, e.g., its top and bottom surfaces and distal edge.

Figures 3C, 3D:
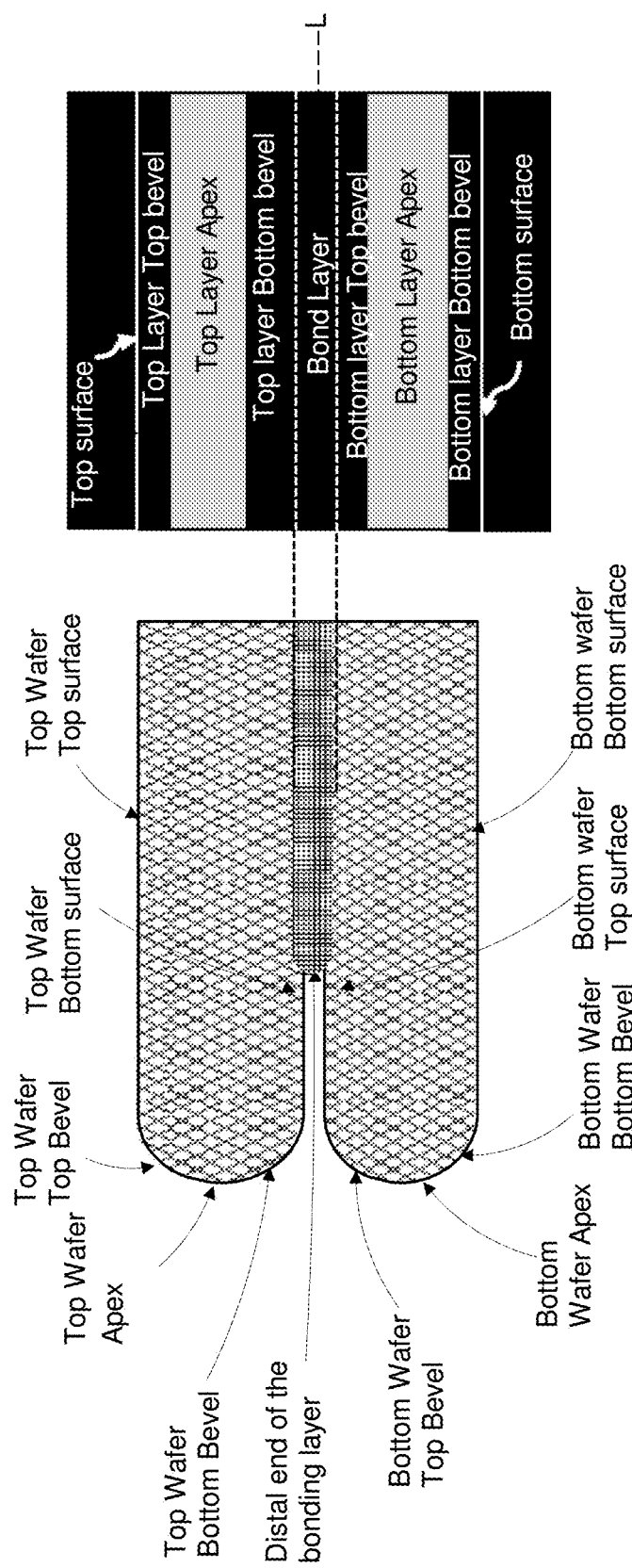
FIG. 3C shows a schematical cross-sectional view of another possible multi-layer stack.
FIG. 3D shows a corresponding image of a side of the multi-layer stack of FIG. 3C captured by a side imaging sensor.

Reference is made to FIGS. 3C-3D showing a schematic illustration of a multi-layer stack and a corresponding image obtained by using a conventional inspection edge and bevels tool/system. The multi-layer stack of FIG. 3A includes a top layer and a bottom layer attached via a bonding layer. The distal end of the bonding layer is shown in the figure and is at a larger distance from the bottom and top wafer apexes than the distal end of FIG. 3A. This situation may be indicative of an abnormality with the bonding layer, e.g., a concentricity variation between the bonding layer and the top and or bottom layers, or of an inlet or void in the bonding layer as seen in a cross-section. Although the multi-layer stack of FIG. 3C is different from the multi-layer stack of FIG. 3A with respect to the bonding layer diameter (i.e., the bonding layer does not reach the bonding region as in a void, or inlet), the image of FIG. 3D is identical to the image of FIG. 3B.

Reference is made to FIG. 4A illustrating a schematic block diagram of a part of a possible inspection tool system 100 including inter alia two illumination setups: a first illumination setup 104 being configured and operable for providing focused illuminating radiation directed at the bonding region non-filled volume and a second illumination setup 102 being configured and operable for illuminating the apex plane of a multilayer stack such as the multi-layer stack of FIG. 4B. Although in the figure, first and second illumination setups 104 and 102 respectively are represented as different entities, first illumination setup 104 may be a part of the second illumination setup 102. More specifically, second illumination setup 102 may include some parts of the first illumination setup 104 having different properties. First and second illumination setups 104 and 102 may be physically located in the same housing and may be controlled by the same or different processing unit as will be described further below. In particular, second illumination setup 102 is configured and operable to generate omnidirectional or isotropic radiation being directed towards the stack edge layers in the normal direction N referred to hereinafter as a normal to the multi-stack apex edge plane. In an embodiment, second illumination module 102 is configured and operable to generate collimated illumination beam(s).

More specifically, first illumination module 104 is configured and operable to generate at least one illumination radiation being directed towards the bonding layer, including bonding region 18, interstitial non-filled space 18A of FIG. 1A, and "triangular" region 18B of FIG. 1A in between the edge of the top layer bottom surface and the edge of the bottom layer top surface, both bordering interstitial space 18A of FIG. 1A.

Figure 7A:
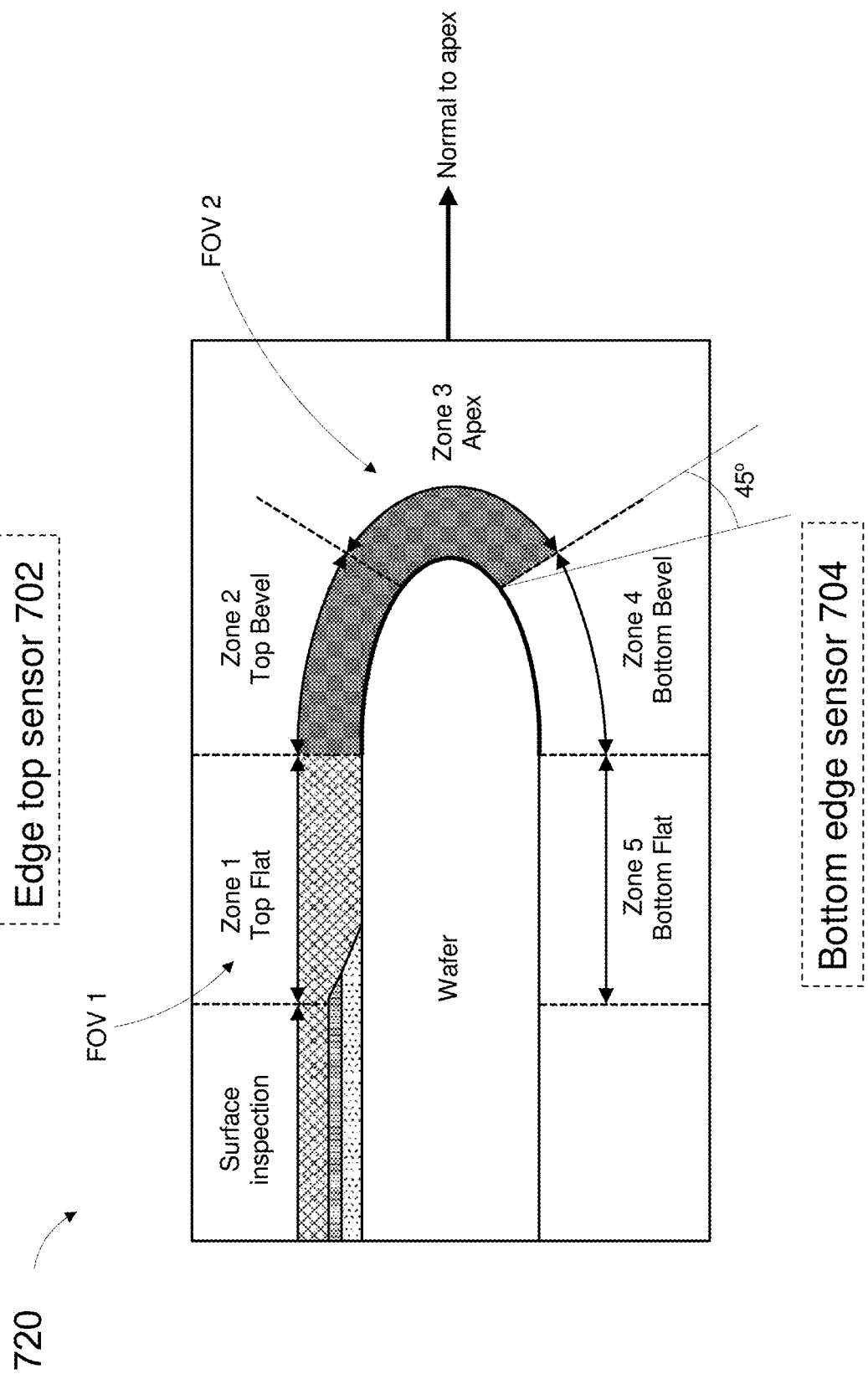
FIG. 7A is a schematic illustration of the different zones of an unstacked wafer to be inspected.

As detailed above, the inspection tool system 100 includes inter alia a first illumination setup 104 comprising an illumination module being configured and operable to generate at least one illumination radiation and to direct the at least one illumination radiation towards the wafer/stack edge layer, a bonding region sensor unit 110 (e.g. line or area camera, fluorescence detector) being configured and operable to collect at least a part of the reflected radiation from the apex plane, in the normal direction of the wafer/multi-stack's edge, a second illumination setup 102 comprising an illumination module being configured and operable to generate omnidirectional or isotropic light and to illuminate at least one of the following regions: top bevel, normal edge as will be detailed further below, and a bottom bevel of the at least one stack layer and an optional processing unit 120 being configured and operable to receive images from bonding region sensor unit 110, and/or analyze images and/or determine layer data, for example, layer anomalies and/or defect data to thereby identify different types of defect data and variations along the edge of wafer. Bonding region sensor unit 110 is configured and operable for collecting reflected electromagnetic radiation from a bonding region and generating at least one sensing data being indicative of the bonding region. However, inspection tool system 100 may also include other sensors such as edge top and/or edge bottom sensors as illustrated in FIG. 7A further below.

As shown in FIG. 4A, second illumination setup 102 may comprise an edge collimated light source being configured and operable to generate parallel illumination beams. In general, the first and second illumination setups 104 and 102 may include radiation source(s), optionally optical elements for directing the illumination radiation, and additionally or alternatively diffuser or homogenizer elements for affecting the illumination radiation. The illumination setups 102 and 104 may also comprise an internal control unit (not shown) being configured and operable to control the beam/radiation parameters. The beam parameters include at least one of focusing, beam size, power, polarization, or direction, and of beam propagation parameters, e.g., collimation, convergence, and divergence. The beam parameters are a function of wavelength. Additionally, or alternatively, the illumination setups 102 and 104 may also comprise a power source.

The image obtained by the bonding region sensor unit 110 in FIG. 4C is a side view clearly showing at the center area of the image three distinct regions: the bottom layer top bevel, the top layer bottom bevel, and the bonding layer in between them. Also shown in the figure, is the mid-height L of the bonding region. These sections were dark in the previous setups that did not include illumination setups 102 and 104. In this connection, it should be noted that the layers in the figure schematically represent the different regions of the multi-layer stack of FIG. 4B, but these regions do not necessarily have a layered shape and the difference in the darkness between the layers of FIG. 4C are not necessarily representative of the real ratio of light intensity. It should be noted that most of the collimated light beams that are reflected from the top wafer top bevel and the bottom wafer bottom bevel, do not reach the bonding region sensor.

Reference is made to FIG. 4D illustrating a schematic block diagram of a part of a possible inspection tool system 100' including inter alia two illumination setups: a first illumination setup 104 being configured and operable for providing a focused illuminating radiation directed at the bonding layer and a second illumination setup 102' being configured and operable for illuminating the apex plane of a multilayer stack such as the multi-layer stack of FIG. 4E. In this example, the light source of second illumination setup 102' is arc-shaped and configured and operable to generate omnidirectional or isotropic light being directed towards the stack edge layers in the normal direction referred to hereinafter as "a normal edge" with the layer's edge. The arc span can be larger than 15, 30, 45, 60, 90, 120, 180, 210, 240, 270, and 300 degrees. The light beams generated by the arc illuminator can reach the bevel area at a certain angle enabling their reflection from the top wafer top bevel and the collection by the bonding region sensor. This configuration enables a larger portion of the light beams reflected from the bevel areas to reach the bonding region sensor area as compared to the linear design of FIG. 4A. This implementation provides an image of the top wafer top bevel and the bottom wafer bottom bevel. The image obtained by the bonding region sensor unit 110 in FIG. 4F is a side view clearly showing at the center area of the image three distinct regions: the bottom layer top bevel, the top layer bottom bevel, and the bonding layer in between them, as described in FIG. 4C, as well as the top wafer top bevel and the bottom wafer bottom bevel.

Figures 4G, 4H:
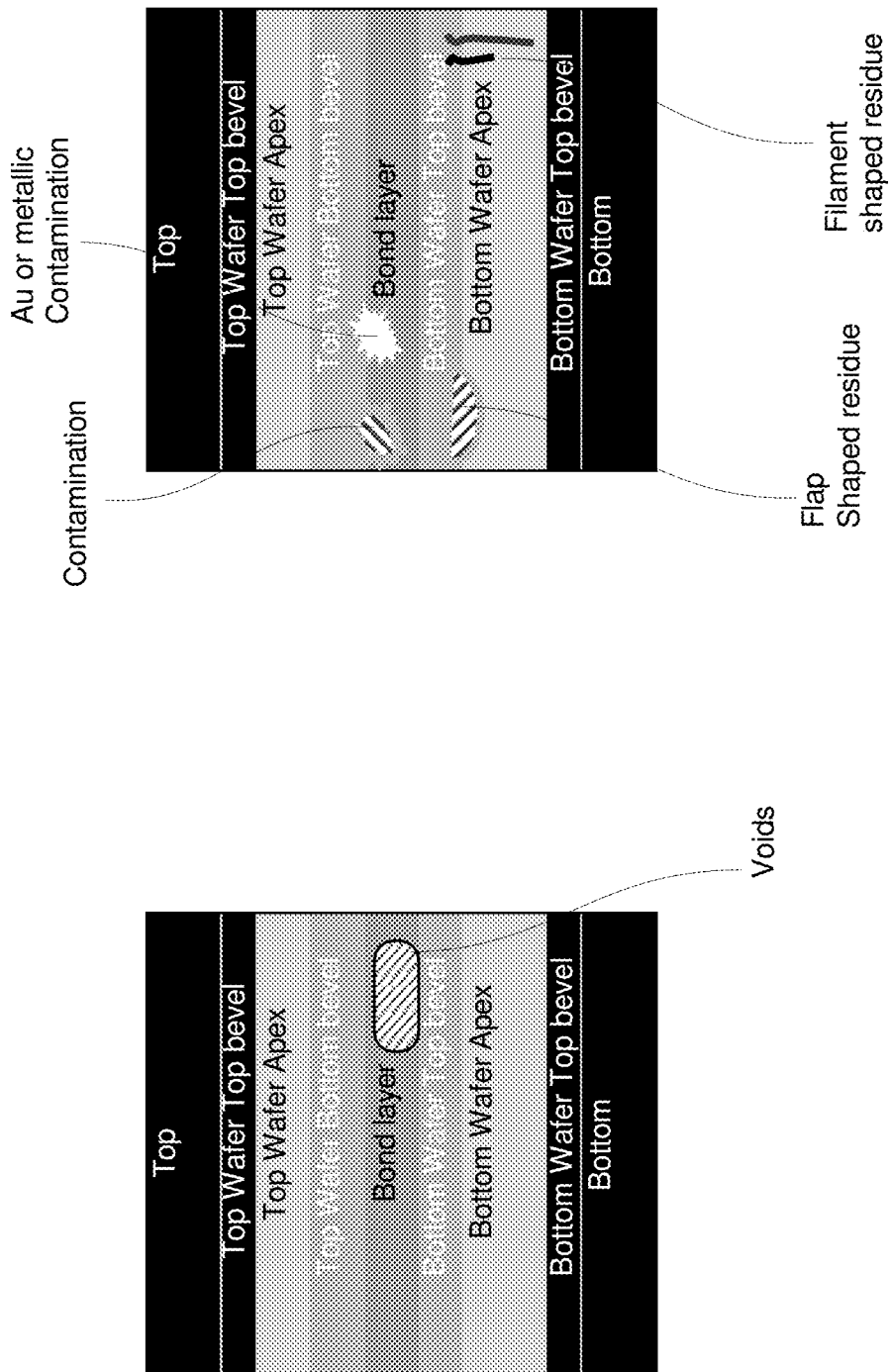
FIGS. 4G-4H show images of a side of a multi-layer stack having different defects captured by a bonding region sensor.

As illustrated in FIG. 4G, voids (e.g., open or closed) may be formed in the bonding layer. The presence of a void generally refers to missing material in the bonding region layer. The technique of the present disclosure enables the detection of such a void. In particular, the semiconductor inspection tool system of the present disclosure including a bonding region sensor and an appropriate illumination setup enables the detection of open voids, of all shapes and dimensions. Closed voids (e.g., located near the edge of the wafer) can be detected using infrared illumination.

In an embodiment, closed voids (e.g., located near the edge of the wafer) can be detected by observing anomalies of the bonding material color or image contrast. FIG. 4H illustrates other possible defects being identified by the technique of the present disclosure such as contaminations (e.g., metallic, Si, dust) and adhesive material residue in the form of flap or filament. As illustrated in the figure, the adhesive residue may be in the form of a thin filament, hair or string-like, flat-ribbon like, a flap, also referred to as a skirt, wherein the area, is relatively large, compared to the thickness or a glob, cluster, or an undefined shape, wherein the area is relatively small compared to the thickness. The adhesive residues typically indicate a problem with production processes and can be fragile and or brittle. The adhesive residues sometimes break off during handling or randomly. Adhesive residues that have broken off are a source of contamination which may harm production equipment, degrade the manufacturing process, and may have an adverse effect on production yield.

Figure 4J:
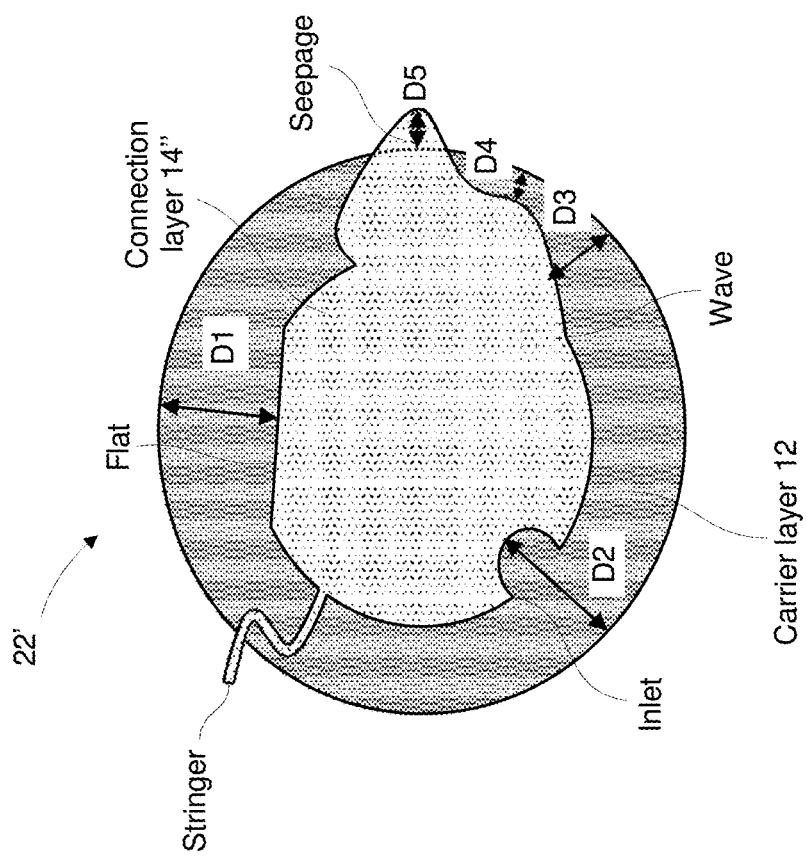
FIG. 4I shows a schematical top view of a bonding layer placed on top of a wafer layer being prepared under ideal conditions and FIG. 4J shows a schematical top view of the bonding layer placed on top of the carrier layer being prepared under defective processes.
Figure 4I:
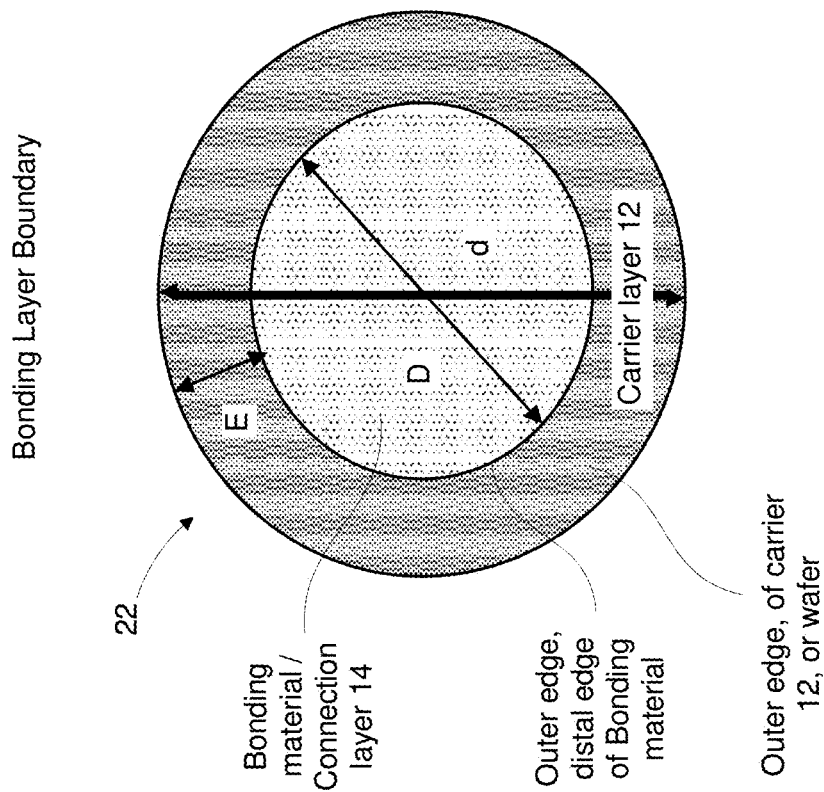

Reference is made to FIG. 4I showing a wafer and a bonding layer, of a multi-layer stack 22 being manufactured under ideal conditions. FIG. 4I showing bonding layer 14 of diameter d arranged concentrically with respect to carrier layer 12 of diameter D. The bonding region boundary defines a uniform ring having a width of B=D-d. FIG. 4G illustrates possible anomalies and different defects that could occur during the manufacturing processes of a multi-layer stack 22'. As clearly shown in the figure, the bonding region boundary of FIG. 4J is not uniform and defines a variation of diameters (D1-D5) that can be identified during the inspection of the bonding region. For example, during the deposition of the bonding layer 14" on the carrier layer 12, an inlet may be accidentally created. Alternatively, or additionally, the outer surface of the bonding layer 14" may be non-substantially circular leading to the creation of at least one portion having a wave-like contour and/or flat contour. Alternatively, or additionally, the material of the bonding layer 14" (e.g. resin, glue, or filler) might leak onto the bonding region covering at least some portions of the carrier layer 12 or even exceeding the boundary of the carrier layer outer surface. Alternatively, or additionally, the material of the bonding layer 14" might leak onto the bonding region in the form of filaments or strings.

Reference is made to FIG. 5A illustrating a schematic block diagram of a part of a possible inspection tool system 200 including an illumination setup 106 being configured and operable for illuminating the bonding region non-filled volume of the multi-layer stack of FIG. 5B by providing focused illuminating radiation directed at the bonding region non-filled volume. Illumination setup 106 is configured and operable to generate at least one illumination radiation being directed toward the stack edge layers at different possible angles $x_1$, $x_2$, $x_3$ with respect to the layer's edge normal direction. The angle directions $x_1$, $x_2$, $x_3$ refer to the axis of the light radiation forming a light beam cone angle. Illumination setup 106 may also include an off-axis illumination (e.g., conventional dark field illumination) in order to highlight diffusive defects/contaminations and suppress specular reflections. The image obtained by the imaging bonding region sensor in FIG. 5C is a side view, clearly showing the bonding layer at the center area of the image. The bottom layer bottom bevel, and the top layer top bevel, are black in this example, showing that radiation reflected from these surfaces does not reach the sensor. The top layer bottom bevel, is darker than the bottom layer top bevel, showing that less radiation is reflected from the top layer bottom bevel than from the bottom layer top bevel. In this example, the top layer bottom bevel is partially shielded from the illumination source 106, while the top layer bottom bevel is in plain sight.

Reference is made to FIG. 5D illustrating a schematic block diagram of a part of a possible inspection tool system 200' including an illumination setup 106' being configured and operable for illuminating the bonding region non-filled volume of the multi-layer stack of FIG. 5E, a bonding region sensor unit 110' including an optical element 107. Bonding region sensor unit 110' is positioned at an off-normal angle, and optionally to the side of the illumination setup. Optical element 107 is positioned to deflect reflected electromagnetic radiation from the multi-layer stack and bonding region towards bonding region sensor unit 110'. The image obtained by the imaging bonding region sensor in FIG. 5F is similar to the image obtained in FIG. 5C. In an embodiment, optical elements include any radiation deflection element such as an optical lens, a beam splitter, a mirror, a prism, or a reflective surface.

Reference is made to FIG. 6A illustrating a schematic block diagram of a part of a possible inspection tool system 300 including inter alia an illumination setup 102 similar to the illumination setup of FIG. 4A being configured and operable for illuminating the apex plane of the multi-layer stack of FIG. 6B. In this embodiment, an organic material may be embedded in the bonding layer such that illumination setup 102'' enables the creation of fluorescence emission by the bonding layer. This configuration enables obtaining the side view image illustrated in FIG. 6C in which the central area of the image shows a distinguishable bonding layer. FIG. 6D illustrates a similar image in which a void, as detailed above with respect to FIG. 4D, can be identified. In an embodiment, the illustrated void is an internal void.

FIG. 7A illustrates different zones (zones 1-5) of an unstacked wafer having a rounded edge being inspected by using the teachings of the present disclosure. As described above, the semiconductor inspection tool system may be connected to a processing unit being configured and operable for receiving and analyzing sensing data from at least one of the following sensors: the bonding region sensor unit, the edge top sensor 702, or the edge bottom sensor 704. In some embodiments, the semiconductor inspection tool system 720 further comprises at least one of an edge top sensor 702 for obtaining sensing data of a top surface of a layer proximal to an outer edge of the layer or an edge bottom sensor 704 for obtaining sensing data of a bottom surface of a layer proximal to an outer edge of the layer. Semiconductor inspection tool system 720 may thus comprise a plurality of sensors (e.g., bonding region sensor unit (not shown) and/or edge top sensor 702 and/or edge bottom sensor 704), each sensor being configured and operable to generate at least one image of each wafer edge surface in a stack of wafers respectively in a single shot or in multiple shots and calibration setting. The sensing data may be generated by multiple image sensors overlap. For example, an image generated by an edge top sensor 702 includes portions of the top surface and portions of the top bevel. The surface inspection is typically covered by the top and/or bottom inspection tools and the inspection tool of the present disclosure enables to inspect at least one of: Zone 1 being the top flat region of the rounded edge, Zone 2 being the top bevel region of the rounded edge, Zone 3 being the apex region of the rounded edge, Zone 4 being the bottom bevel region of the rounded edge or Zone 5 being the bottom flat region of the rounded edge or any combination thereof. More specifically, the top inspection tool (top camera) is capable to collect reflected light from the top plane and a portion of the top bevel per depth-of-field indicated in the figure as FOV1, and the bonding region sensor of the present disclosure is capable to collect reflected light from the normal aspects and portions of the top and bottom bevels per depth-of-field, indicated in the figure as FOV2. There is an overlap between FOV1 and FOV2. The same applies to the bottom inspection tool having a bottom camera with a FOV1 and a bonding region sensor of the present disclosure with a FOV2 (not shown in the figure). Also indicated in the figure are the edge normal direction and approximate zone boundary lines. Vertical zone boundary lines between Z1 and Z2, and Z2 and Z3 as well as angled zone boundary lines between Z2 and Z3, and Z3 and Z3.

Figure 7B:
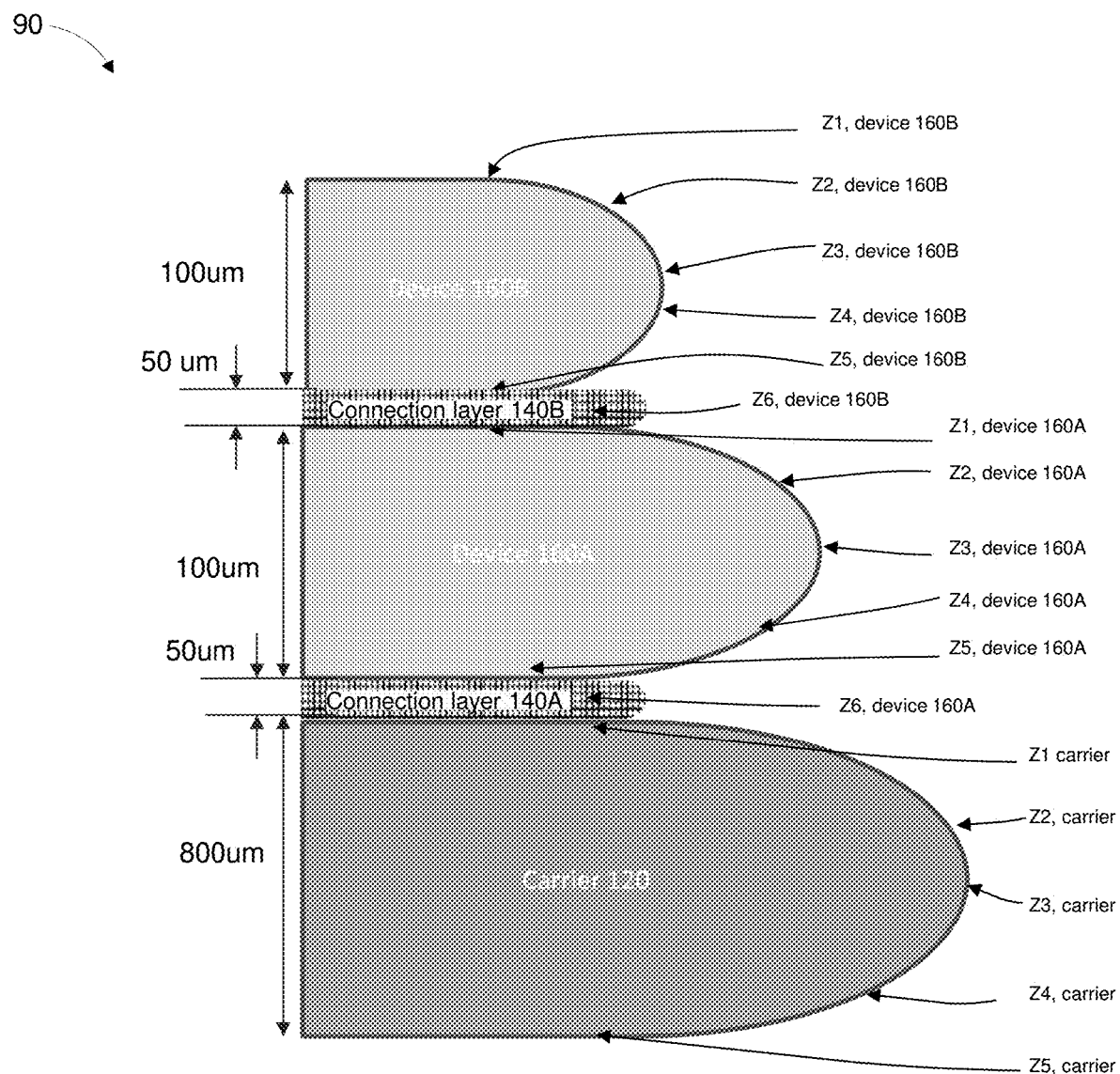
FIG. 7B is a schematic illustration of a cross-sectional view of a possible configuration of a multi-layer stack.

Reference is made to FIG. 7B showing a possible configuration of a multi-layer stack 90 including a carrier layer 120 having a thickness of about 800 μm, a first bonding layer 140A having a thickness of about 50 μm, a first wafer layer 160A having a thickness of about 100 μm, a second bonding layer 140B having a thickness of about 50 μm and a second wafer layer 160B having a thickness of about 100 μm. As shown in the figure, the different layers may have different diameters. In particular, in this example, first wafer layer 160A has a diameter larger than that of the top second wafer layer 160B. Multi-layer stack 90 includes two bonding regions. The first bonding region is defined in between (i) the top outer surface of the carrier layer 120 characterizing region z4, (ii) the outer surface of the first bonding layer 140A characterizing region z3, and the bottom outer surface of the first wafer layer 160A characterizing region z2. The second bonding region 140B is defined in between (i) the top outer surface of the first wafer layer 160A characterizing region z4, (ii) the outer surface of the second bonding layer 140B characterizing region z3 and (iii) the bottom outer surface of the second wafer layer 160B characterizing region z2. The multi-layer stack may have a plurality of bonding layers and thus a plurality of bonding regions to be inspected. Regions z/and z5 define the top and bottom surfaces of each layer. Region z6 defines the bonding region non-filled volume.

Figures 8A, 8B, 8C:
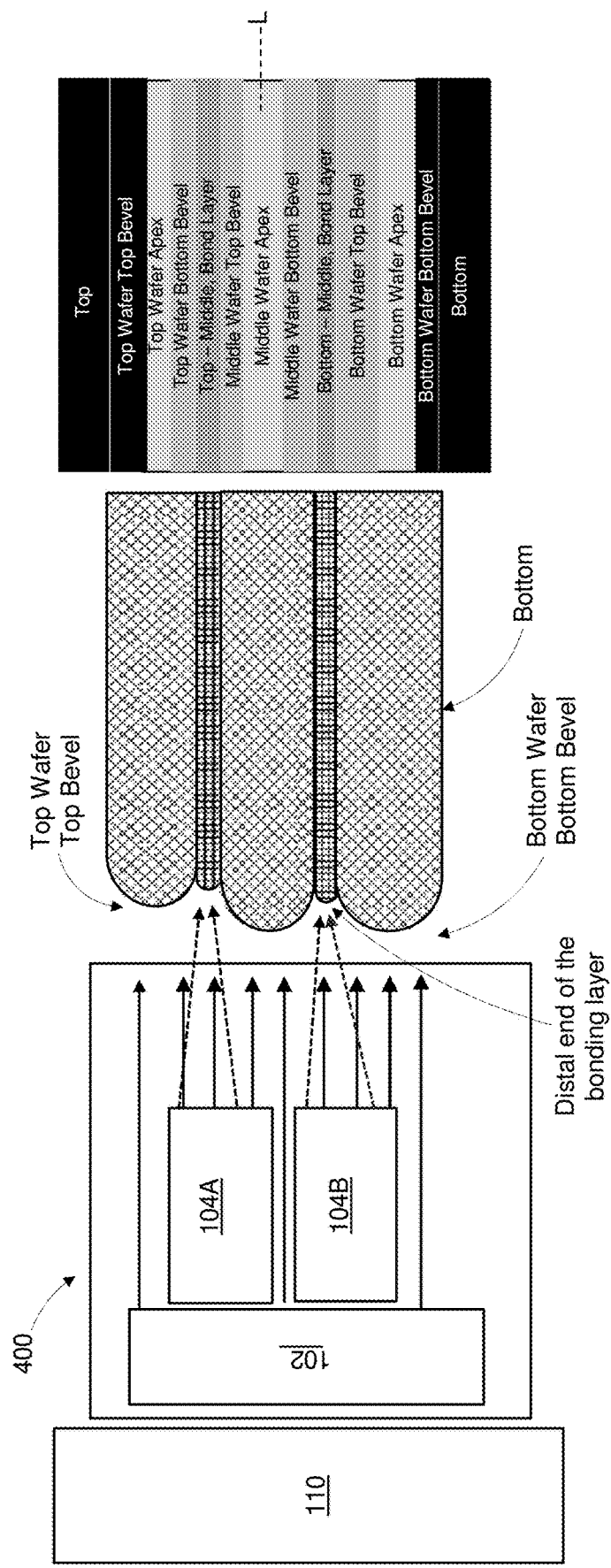
FIG. 8A is a schematic illustration of a cross-sectional view of a possible configuration of a semiconductor inspection tool system according to some embodiments of the present disclosure.
FIG. 8B shows a schematic block diagram of a possible configuration of the semiconductor inspection tool system according to some embodiments of the present disclosure.
FIG. 8C shows a schematical cross-sectional view of a multi-layer stack.

Reference is made to FIG. 8A illustrating a schematic block diagram of a part of a possible inspection tool system 400 including inter alia a second illumination setup 102 similar to the illumination setup of FIG. 4A being configured and operable for illuminating the apex plane of the multi-layer stack of FIG. 8B and a first illumination setup comprising two focused light sources 104A and 104B, each light source being configured and operable for providing focused illuminating radiation directed at a bonding layer. In an embodiment, light sources 104A and 104B are identical in configuration and illumination parameters. In an embodiment, light sources 104A and 104B are different with respect to configuration and or illumination parameters. As shown in the figure, the different layers may have different diameters. The image obtained by bonding region sensor unit 110, in this setup, is shown in FIG. 8C. FIG. 8C is a side view clearly showing all of the surfaces between the top wafer top bevel and the bottom wafer bottom bevel. The surfaces shown include the apexes of the three wafers, both bonding region non-filled volumes and the top wafer bottom bevel, both bevels of the middle wafer, and the bottom wafer top bevel. Also shown in the figure, in the mid-height L of the bonding region.

Figure 9A:
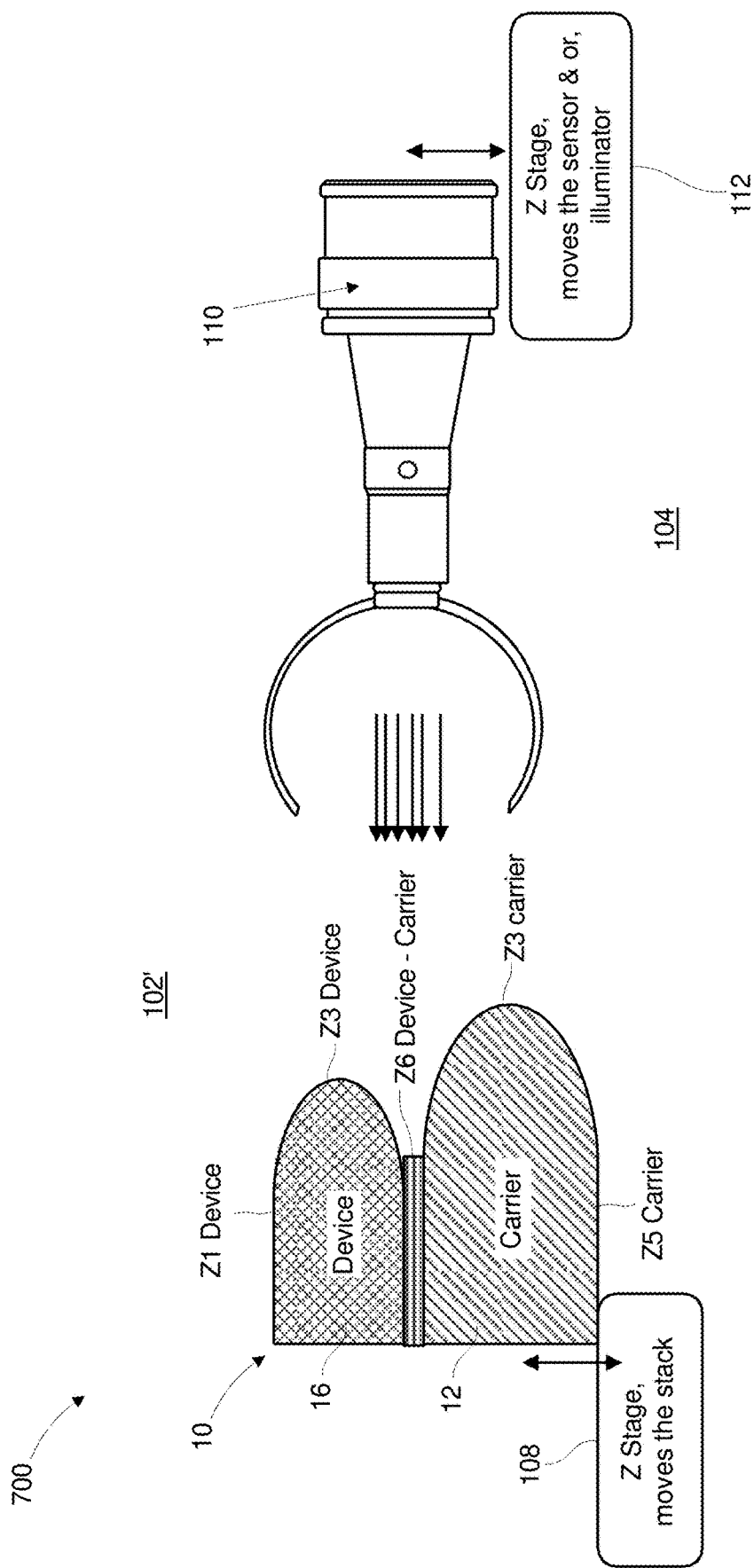
FIG. 9A shows a corresponding image of a side of the multi-layer stack of FIG. 8C captured by a bonding region sensor.

Reference is made to FIG. 9A showing another possible configuration of a semiconductor inspection tool system 700 being integrated into a commercially available edge and bevels semiconductor inspection system according to some embodiments of the present disclosure. In this specific and non-limiting example, the edge and bevels inspection system includes inter alia (i) a second illumination setup 102' comprising an apex illumination module having a plurality of LEDs being arranged along an illumination arc, the apex illumination module being configured and operable to illuminate multi-layer stack 10, (ii) a first illumination setup 104 being configured and operable for providing focused illuminating radiation directed at the bonding layer (iii) a bonding region sensor unit 110 and (iv) a first Z stage 108 being configured and operable to provide height changes to multi-layer stack 10 along the Z axis (assuming that multi-layer stack 10 is located in an imaginary XY plane).

In some embodiments, inspection tool system 700 may be associated with a second Z stage 112 being configured and operable to adjust (manually or automatically) the position of the light source and/or the bonding region sensor with respect to the bonding region along the Z axis.

In this specific and non-limiting example, multi-layer stack (e.g., stacked wafer) 10 includes a two-layer stack i.e., a bottom carrier layer 12 having a thickness of about 1000 μm, a top wafer layer 16 having a thickness of about 800 μm and a bonding layer having a thickness of about 50 μm in between. Multi-layer stack 10, in which the diameter of the carrier is larger than the diameter of the device includes a plurality of zones Z1-Z5 corresponding to the multi-layer stack edge zones and a plurality of wafer edge zones described by the example in FIG. 7B. Including, from top to bottom, (i) wafer layer 16 including regions Z1 Device, Z2 Device (not shown), Z3 Device, and Z4 Device (not shown), (ii) the bonding layer including regions Z6 Device—Carrier; and (iii) carrier layer 12, including regions Z2 Carrier (not shown), Z3 Carrier, Z4 Carrier (not shown), and Z5 Carrier. The upward-facing surfaces are typically imaged by the top camera, for example, wafer layer 16, regions Z1 Device and Z2 Device, and in some cases, regions carrier layer 12, Z5 Carrier. Similarly, downwards-facing aspects are typically imaged by the bottom camera, for example, carrier layer 12, regions Z4 Carrier (not shown), and Z5 Carrier.

First illumination setup 104 is configured and operable to generate at least one bonding region focused illumination radiation configured to illuminate the bonding region volume defined by regions Z3 and Z4 Device, Z6 Device-Carrier, and Z2 and Z3 Carrier.

Figure 9B:
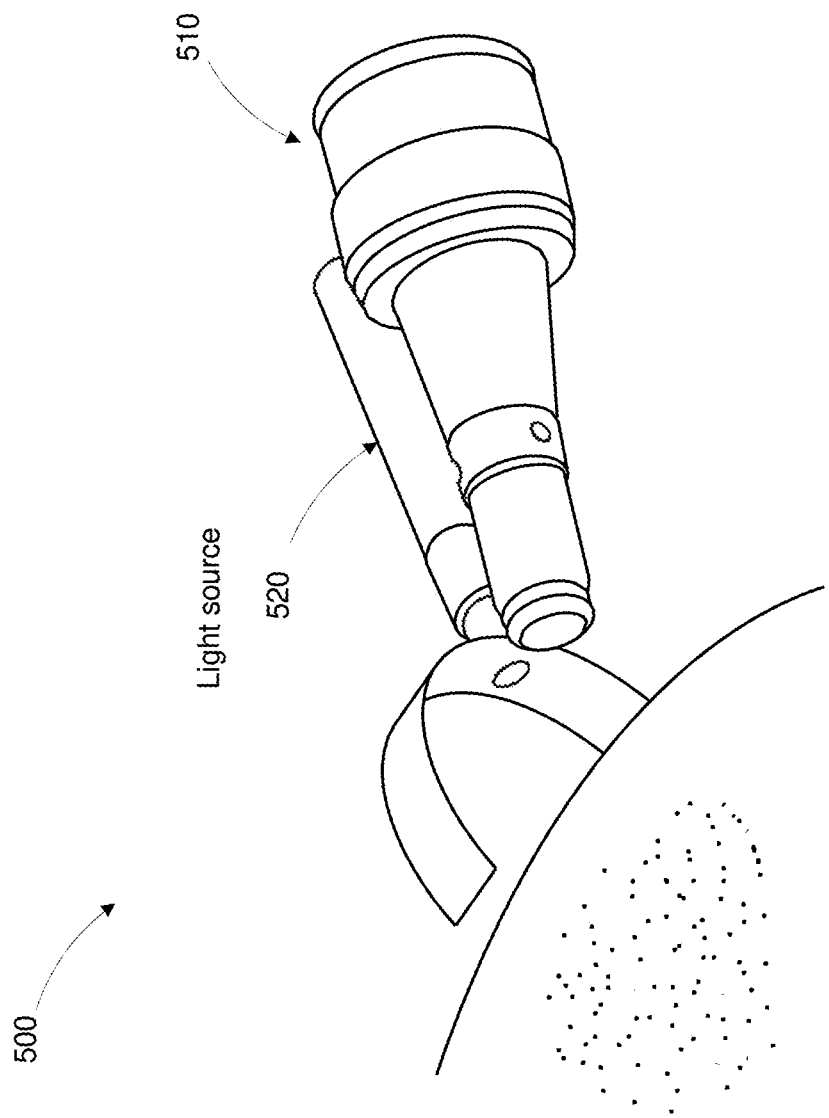
FIG. 9B shows a top partial view of a possible configuration of the inspection tool system according to some embodiments of the present disclosure.

Reference is made to FIG. 9B showing a possible configuration of the inspection tool system 500 of the present disclosure, in which the illumination module is arranged along an illumination arc and may also include at least one guiding element (e.g., fiber) 520 connected to a light source 510. Inspection tool system 500 is configured and operable to direct light radiation at the bonding region non-filled volume of a multi-layer stack, parallel to the bonding region center plane.

As described above with respect to FIG. 8B, the multi-layer stack may have a plurality of bonding layers and thus a plurality of bonding regions to be inspected. In some embodiments, the inspection tool system of the present disclosure is configured and operable to generate two bonding region illumination radiations, each illumination radiation being configured to illuminate each bonding region volume z2, z3, and z4, respectively. At least two images being indicative of the bonding regions are then obtained, respectively. The at least two images are then processed to provide the bonding region dimensions, depth, and thickness.

Figure 9C:
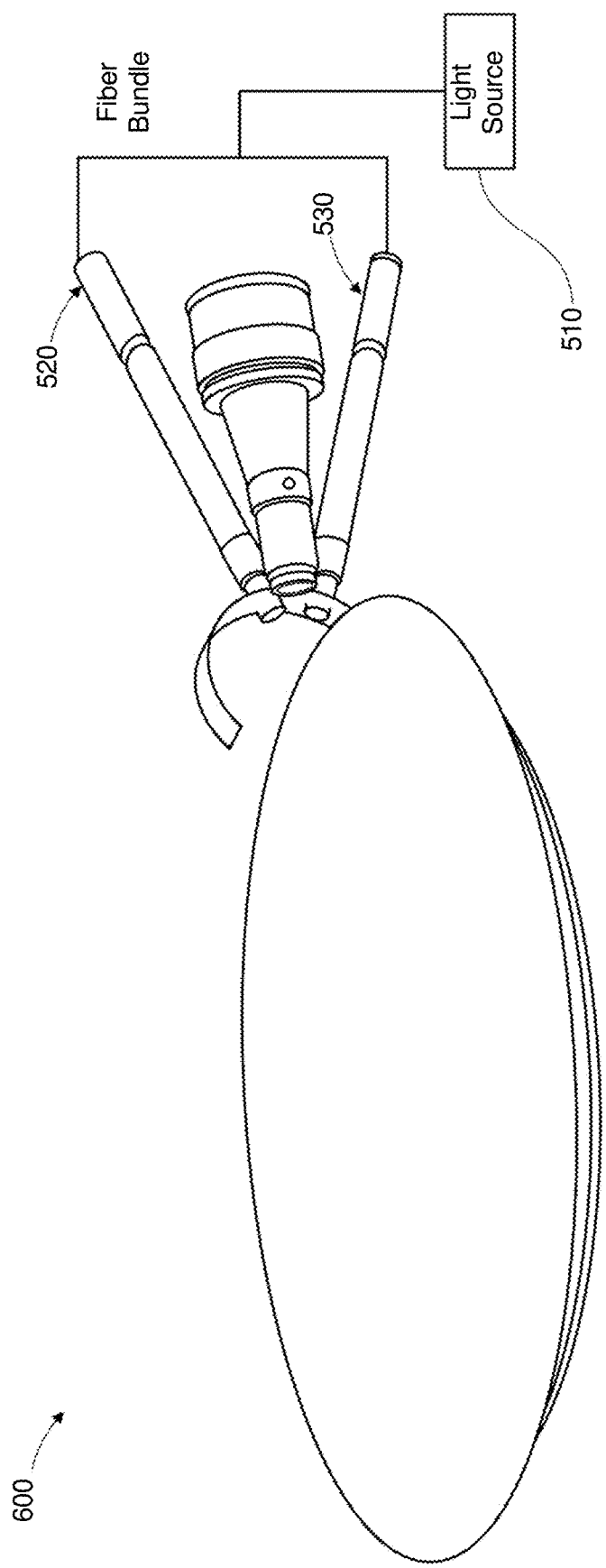
FIG. 9C shows a partial view of a possible configuration of the semiconductor inspection tool system according to some embodiments of the present disclosure.

FIG. 9C shows another possible configuration of the inspection tool system 600 of the present disclosure, in which the illumination module being arranged along an illumination arc may also include two guiding elements 520 and 530 forming for example a fiber bundle and being connected to light source 510. Each guiding element is configured and operable to direct light radiation at a different bonding region non-filled volume of the multi-layer stack, parallel to the bonding region center plane. The inspection of the plurality of the bonding regions may be performed simultaneously by using inspection tool system 600 or may be performed sequentially by using inspection tool system 500 and displacing (automatically or manually) guiding element 520 toward each bonding region sequentially. The guiding elements described above are operable to convey electromagnetic radiation.

Figure 10A:
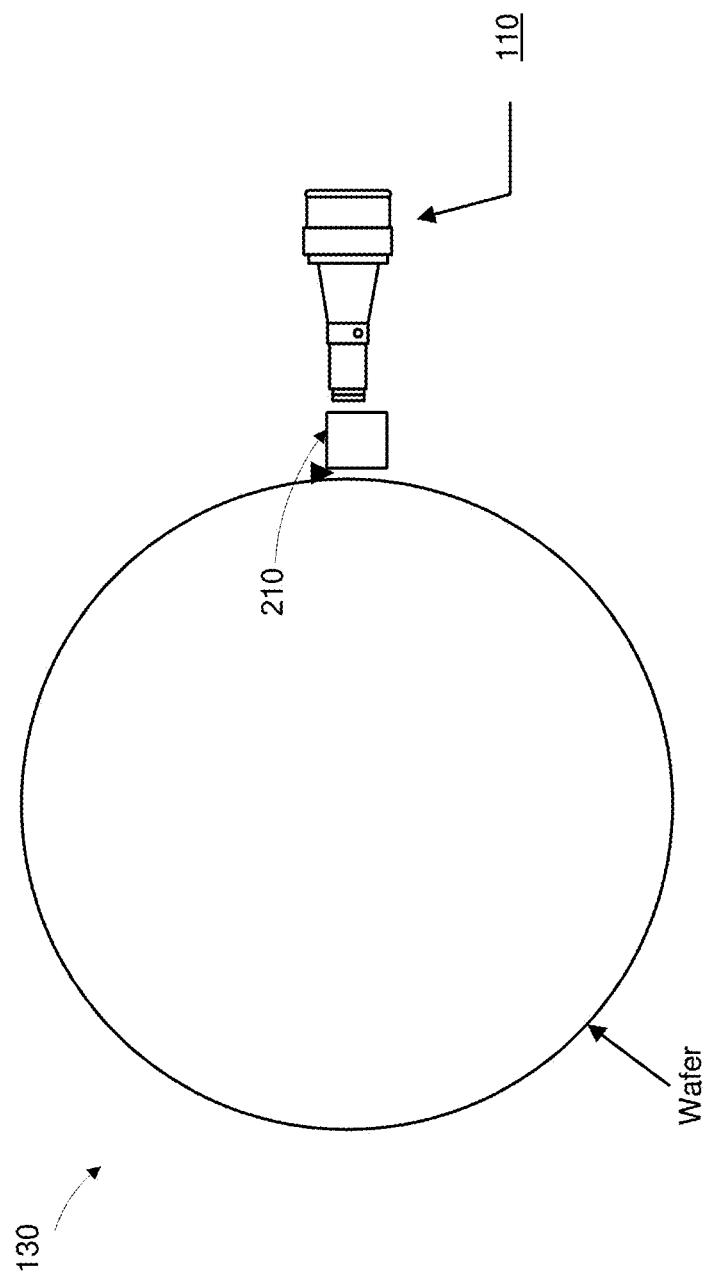
FIGS. 10A-10C show schematic possible configurations of the semiconductor inspection tool system according to some embodiments of the present disclosure.

As described above, bonding region sensor unit 110 is configured and operable to collect reflected electromagnetic radiation from the bonding region being directed at a normal or non-normal (i.e., angular) direction with the edge of the multi-layer stack of wafer W. Reference is made to FIG. 10A, showing an inspection tool system 130 in which bonding region sensor unit 110 comprises a side sensor being configured and operable to collect reflected electromagnetic radiation from the bonding region being directed at a non-normal (i.e., angular) direction with the edge of the multi-layer stack of wafer W. In this case, bonding region sensor unit 110 comprises an optical element 210 being placed at the edge of the multi-layer stack of wafer W and being configured to deviate the path of the reflected electromagnetic radiation and direct the reflected electromagnetic radiation to reach bonding region sensor unit 110. Such optical elements may be for example any radiation deflection element such as an optical lens, a beam splitter, a mirror, a prism, or a reflective surface.

Figure 10B:
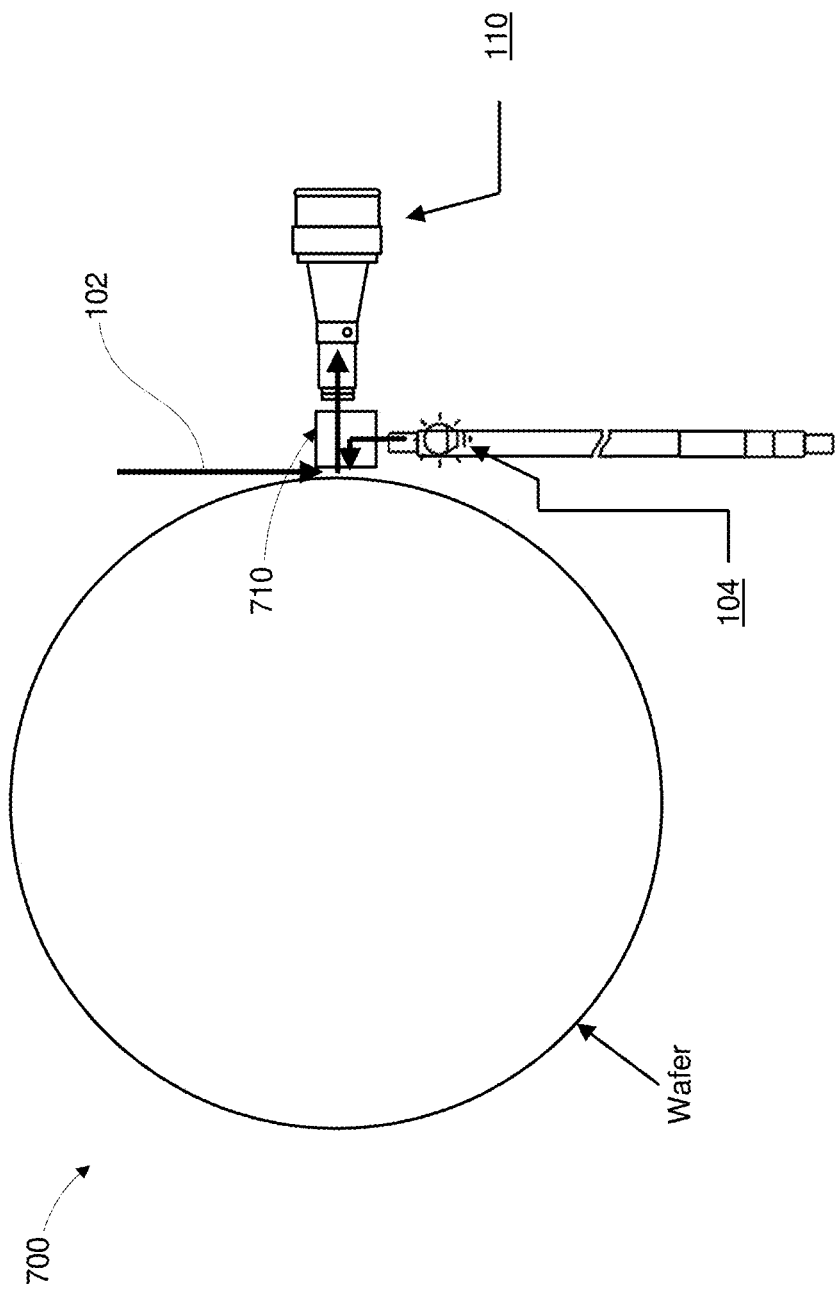
Figure 10C:
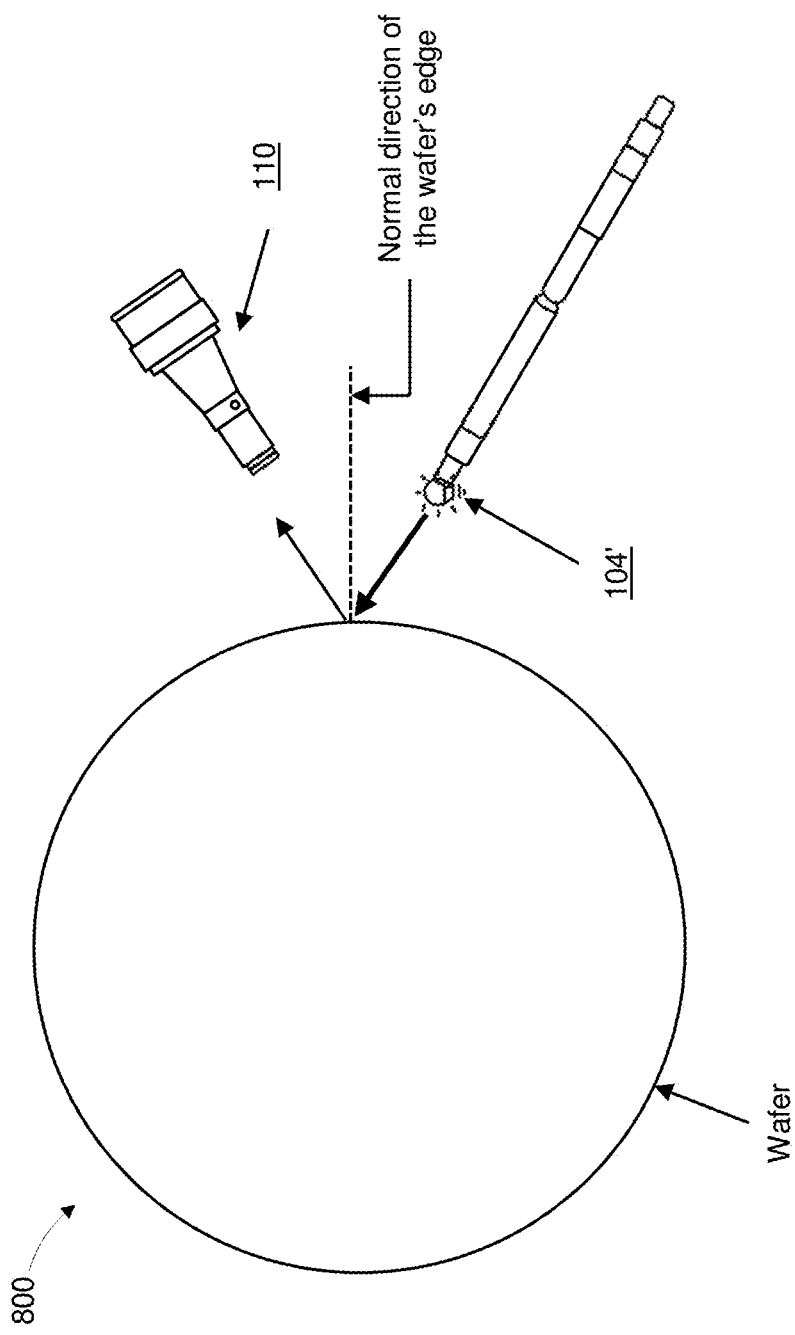

Reference is made to FIGS. 10B and 10C showing specific and non-limiting examples in which bright field illumination is used.

In the inspection tool system 700 of FIG. 10B, the bright field illumination 104' should be coaxial with the bonding region sensor's optical axis to enable simultaneous illumination and collection of reflected electromagnetic radiation. This may be implemented by using a beam splitter 710 being configured to direct the bright field illumination 104' towards to bonding region non-filled volume and the illumination radiation to the apex plane of the multilayer stack W.

In inspection tool system 800, bonding region sensor unit 110 includes a side sensor being positioned at a non-normal (i.e., angular) direction with the edge of the multi-layer stack of wafer W. Alternatively, the bonding region sensor unit may include an optical element 810 being configured and operable to deviate electromagnetic radiation reflected from wafer W towards the bonding region sensor unit 110. In this case, the bright field illumination 104' is oriented opposite to the bonding region sensor's optical axis to enable simultaneous illumination and collection of reflected electromagnetic radiation.

In some embodiments, the position of the bonding region sensor is determined according to the bonding region sensor's diameter. For example, the cross-sectional height of the bonding region sensor may be substantially identical to the diameter of the bonding region sensor.

Although not shown, the same description applied for a dark-field illumination having instead of bright field illumination 104' a dark field illumination element.

Figures 11A, 11B:
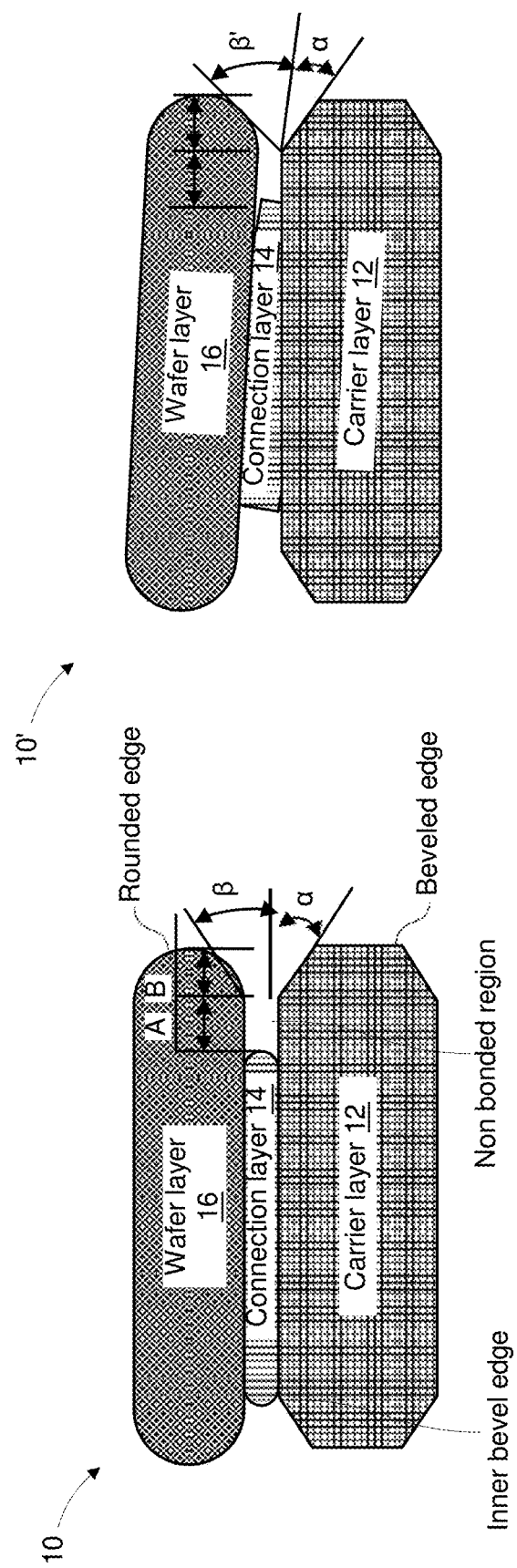

Reference is made to FIG. 11A showing a schematical cross-sectional view of multi-layer stack 10 of FIG. 1A including carrier layer 12, bonding/connection layer 14, and wafer layer 16. Wafer layer 16 may be made of silicon and carrier layer 12 may be made of glass such that a multi-layer stack may include a single layer of glass carrying a single layer of silicon. The present disclosure is not limited to any multi-layer configuration and the multi-layer may include any combination of layers such as a pair of silicon layers or a pair of glass layers. In this specific and non-limiting example, carrier layer 12 has an outer surface defining four beveled edges (i.e., a pair of beveled edges at each side of the layer). Wafer layer 16 has an outer surface defining two rounded edges (i.e., one rounded edge at each side of the layer). Bonding layer 14 has an outer surface defining two rounded edges (i.e., one rounded edge at each side of the layer). Since the diameter of the bonding layer 14 is smaller than the diameters of both carrier layer 12 and wafer layer 16, and the bonding layer 14 abuts the extremity of the carrier layer 12 at the left side of multi-layer stack 10 but not at the right side of multi-layer stack 10, a bonding region including an inner bevel edge is created at the left side, while at the right side a portion of carrier layer 12 is not covered by bonding layer 14 creating a bonding region including a non-bonded region. At the right side of multi-layer stack 10, the non-bonded region includes a first part A, being a linear volume portion formed in between carrier layer 12 and wafer layer 16 being in a spaced-apart arrangement one with the other, and a second part B being a non-linear volume portion defining an angular opening being formed in-between the beveled edge of carrier layer 12 and the rounded edge of wafer layer 16. The angular opening includes a first angle α being formed between the beveled edge of carrier layer 12 and its top surface and a second angle β being formed between the bottom surface of bonding layer 14 and a bottom beveled edge corresponding to the rounded edge of wafer layer 16.

FIG. 11B illustrates another possible configuration of a multi-layer stack 10' in which bonding layer 14' has an inclined top outer surface, changing the orientation of the wafer layer 16. Obtaining sensing data of the bonding region at the right side of multi-layer stack 10' and in particular of the angular opening being formed by angles α and β' may reveal the non-linearity of the top surface of bonding layer 14 and the problematic inclination of wafer layer 16.

FIG. 11C illustrates another possible configuration of a multi-layer stack 20 including a carrier layer 12, a first bonding layer 14A, a first wafer layer 16A, a second bonding layer 14B, and a second wafer layer 16B. Wafer layers 16A and 16B may be made of silicon and carrier layer 12 may be made of glass such that the multi-layer stack may include a single layer of glass carrying a pair of silicon layers. The present disclosure is not limited to any multi-layer configuration and the multi-layer may include any combination of layers such as a single layer of glass carrying a silicon layer having a glass layer on top of it, or three silicon layers. In this specific and non-limiting example, carrier layer 12 has an outer surface defining four beveled edges (i.e., a pair of beveled edges at each side of the layer). Wafer layers 16A and 16B have outer surfaces defining two rounded edges respectively (i.e., one rounded edge at each side of the layer). Bonding layers 14A and 14B has outer surfaces defining two rounded edges respectively (i.e., one rounded edge at each side of the layer). The inspection technique of the present disclosure has the capability to inspect a plurality of bonding regions in a multi-layer stack and to provide the bonding region dimensions, depth, and thickness as described above with respect to FIG. 9A.

FIG. 11D illustrates another possible configuration of a multi-layer stack 30 including a carrier layer 12, a bonding layer 14, and a wafer layer 16'. In this specific and non-limiting example, the thickness of wafer layer 16' is much smaller than the thickness of carrier layer 12. Moreover, the diameter of wafer layer 16' is also smaller than the diameter of carrier layer 12.

Similarly to the examples of FIGS. 11A-11C, carrier layer 12 has an outer surface defining four beveled edges, bonding layer 14 and wafer layer 16' have outer surfaces defining two rounded edges, respectively. FIG. 11E illustrates another possible configuration of a multi-layer stack 30' including a carrier layer 12, a bonding layer 14, and a wafer layer 16". In this specific and non-limiting example, the thickness of wafer layer 16" is much smaller than the thickness of carrier layer 12. Moreover, the diameter of wafer layer 16 is also larger than the diameter of carrier layer 12.

Similarly to the examples of FIGS. 11A-11D, carrier layer 12 has an outer surface defining four beveled edges, bonding layer 14 and wafer layer 16" have outer surfaces defining two rounded edges, respectively. The inspection technique of the present disclosure has also the capability to inspect a plurality of layers having different diameters and/or thicknesses and/or to identify geometrical difference(s) between the different layers.

FIG. 11F illustrates another possible configuration of a multi-layer stack 40 including a carrier layer 12, a first bonding layer 14A, a first wafer layer 16A', a second bonding layer 14B, and a second wafer layer 16B. In this specific and non-limiting example, the thickness of wafer layer 16A' is much smaller than the thickness of wafer layer 16B. Moreover, the diameter of wafer layer 16A' is also smaller than the diameter of wafer layer 16B. Carrier layer 12 has an outer surface defining four beveled edges, bonding layers 14A and 14B, and wafer layers 16A' and 16B have outer surfaces defining two rounded edges, respectively. The inspection technique of the present disclosure also enables the identification of geometrical difference(s) between the different layers.

FIG. 11G illustrates another possible configuration of a multi-layer stack 50 including a carrier layer 12', a first bonding layer 14A, a first wafer layer 16A", a second bonding layer 14B, and a second wafer layer 16B. In this specific and non-limiting example, the carrier layer 12' is made of silicon while in all the preceding examples of FIGS. 11A-11F, the carrier layer 12 was made of glass. The first wafer layer 16A" is, in this example, made of glass while in all the preceding examples of FIGS. 11A-11F, the wafer layer 16 or 16A was made of silicon. Also in this example, the thickness of wafer layer 16A" is smaller than the thickness of wafer layer 16B. Moreover, the diameter of wafer layer 16A" is also smaller than the diameter of wafer layer 16B.

Similarly to the examples of FIGS. 11A-11E, carrier layer 12 has an outer surface defining four beveled edges, bonding layers 14A and 14B, and wafer layers 16A" and 16B have outer surfaces defining two rounded edges, respectively. The inspection technique of the present disclosure has also the capability to inspect a plurality of wafer layers being made of different materials and having different diameters and/or thicknesses as well as a plurality of bonding regions in a multi-layer stack as described above with respect to FIG. 9A. In particular, this inspection technique also enables to identify abnormal geometrical configuration(s) such as the non-linear outer shape of the layer(s).

FIG. 11H illustrates another possible configuration of a multi-layer stack 60 including a carrier layer 12", a bonding layer 14, and a wafer layer 16'". In this specific and non-limiting example, the thickness of wafer layer 16" is much larger than the thickness of carrier layer 12" and the outer shape of wafer layer 16" has a non-linear top surface (e.g., curved outwardly). Moreover, the carrier layer 12" has an outer surface defining two beveled edges on the left side of the multi-layer stack 60 and two non-linear beveled edges on the right side of the multi-layer stack 60. Bonding layer 14 and wafer layer 16'" have outer surfaces defining two rounded edges, respectively. The inspection technique of the present disclosure has also the capability to inspect a plurality of layers having different outer shapes including different edges' shapes and/or diameters and/or thicknesses. In particular, this inspection technique also enables to identify abnormal geometrical configuration(s) such as the non-linear outer shape of the layer(s).

FIG. 11I illustrates another possible configuration of a multi-layer stack 70 including a carrier layer 12" having two non-linear beveled edges at the right side of the multi-layer stack 70 as in the example of FIG. 11H, a bonding layer 14 and a wafer layer 16"". In this specific and non-limiting example, each edge of wafer layer 16"" defines a non-linear rounded bottom surface (e.g., curved downwardly). Bonding layer 14 has an outer surface defining two rounded edges. The inspection technique of the present disclosure has also the capability to inspect a plurality of layers having different outer shapes including different edges shapes. In particular, this inspection technique also enables to identify abnormal geometrical edge configuration(s) such as a downwardly curved bottom surface of the edges.

Figure 11K:
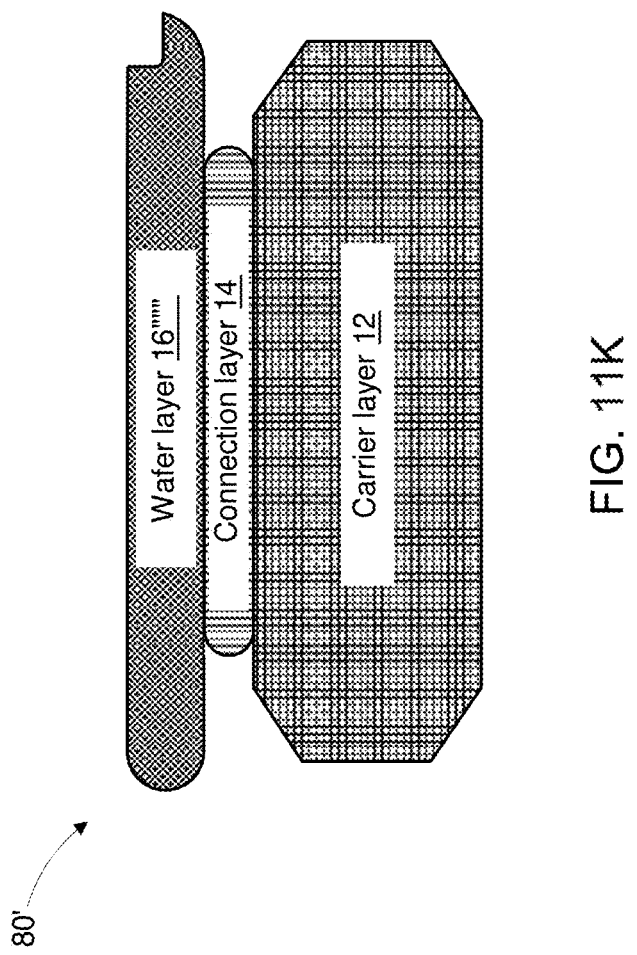

FIGS. 11J-11K illustrate two other possible configurations of the multi-layer stacks 80 and 80' including a carrier layer 12, a bonding layer 14, and wafer layers 16""' and 16"""' respectively. In these specific and non-limiting examples, the right edges of wafer layer 16""' and 16"""' defines truncated bottom and top portions, respectively.

Similarly to the examples of FIGS. 11A-11D, carrier layer 12 has an outer surface defining four beveled edges, and bonding layer 14 having an outer surface defining two rounded edges. The inspection technique of the present disclosure has also the capability to inspect a plurality of layers having different outer shapes including different edges shapes. In particular, this inspection technique also enables to identify abnormal geometrical edge configuration (s) such as truncated portions in the top surfaces of the edges.

Figure 12B:
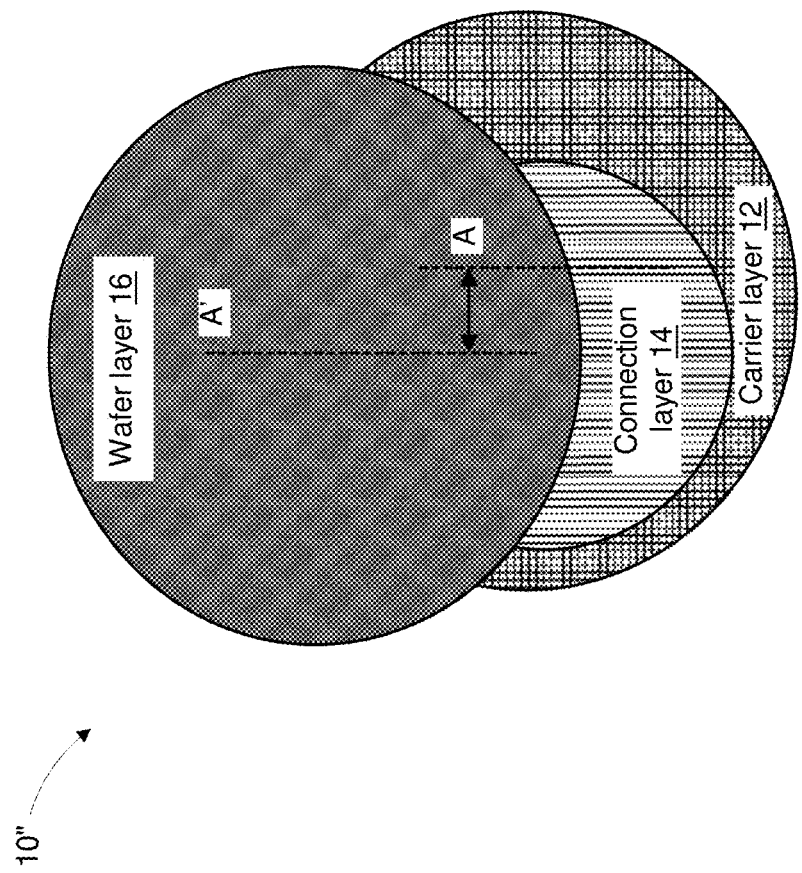
FIGS. 12A-12B show schematical top views of the same multi-layer stack having a different arrangement.
Figure 12A:
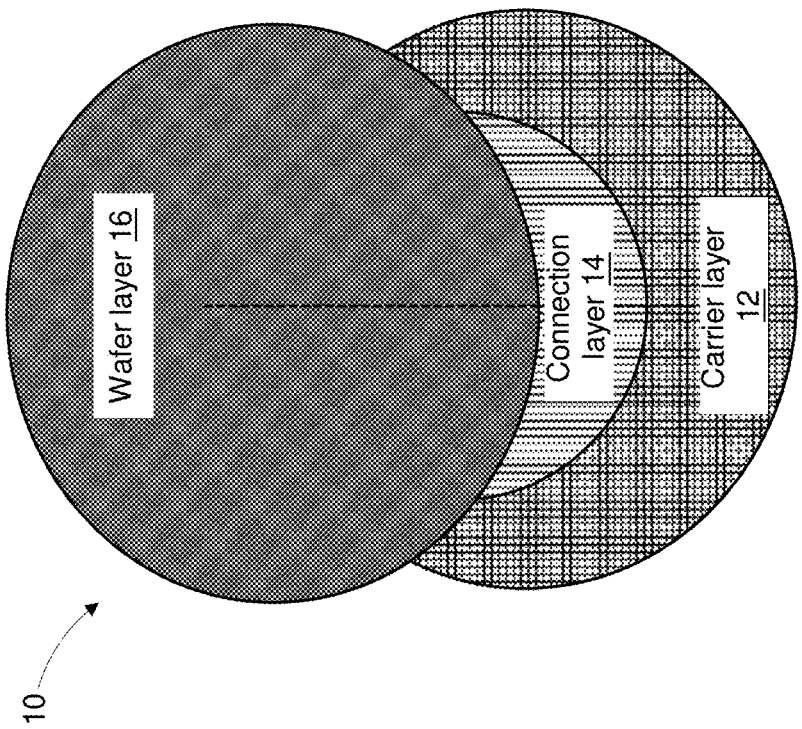
Figure 12C:
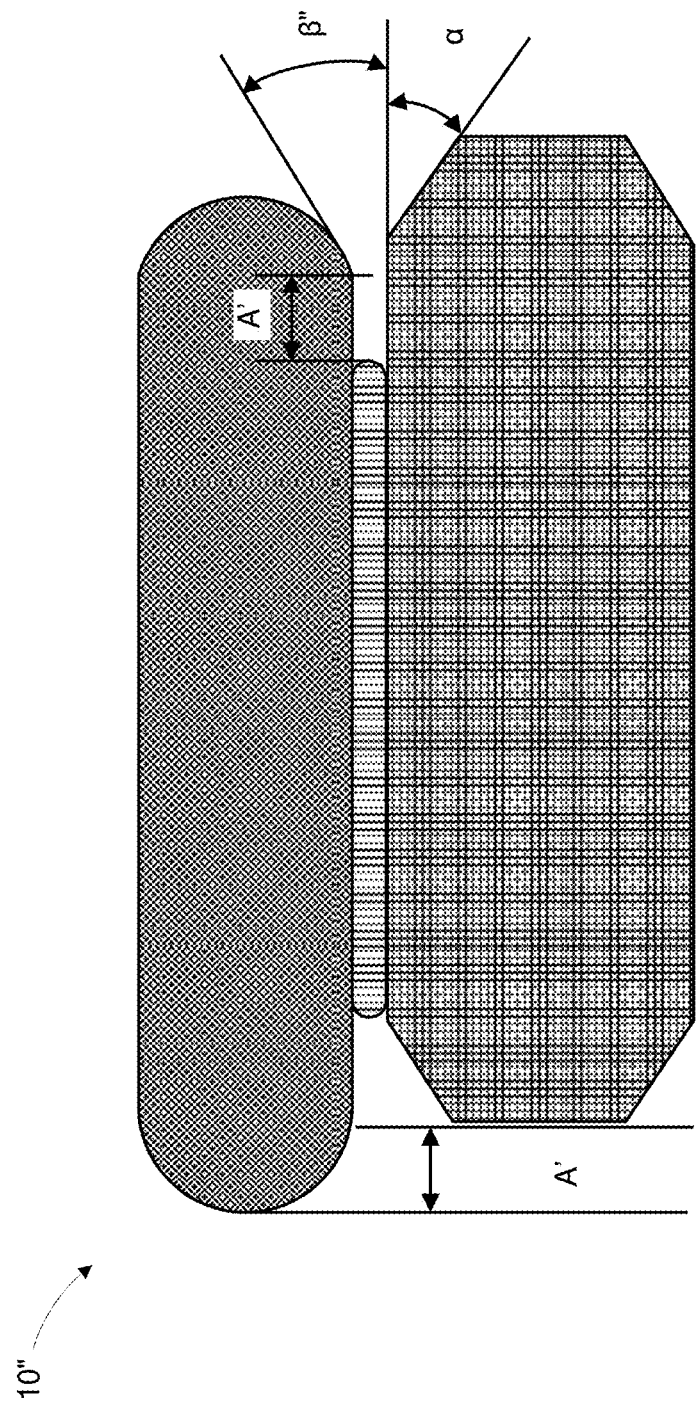
FIG. 12C shows a schematical cross-sectional view of the multi-layer stack arrangement of FIG. 12B.

As illustrated in FIG. 11A, a typical stack (i.e., multi-stack) configuration includes multiple layers with bonding layers in between. The bonding layer is generally a glue, a resin, or a material that holds the stack layers physically connected. FIG. 12A is a top view of the multi-layer configuration 10 of FIG. 11A in which the wafer layer 16 is arranged on top of the bonding layer 14 being arranged on top of the carrier layer 12 along an alignment axis A. FIG. 12B is a top view of a multi-stack configuration 10" in which the wafer layer 16 has been misaligned with respect to the bonding layer 14 along axis A'. The bonding layer 14 is arranged on top of the carrier layer 12 along the original alignment axis A. FIG. 12C shows a cross-sectional view of the multi-stack configuration 10", in which the misalignment and the non-concentricity of the wafer layer 16 with respect to carrier layer 12 are identified. The inspection of the bonding region and in particular of the angles α and β" enables to identify the misalignment of the layers one with respect to the other.

Figure 13A:
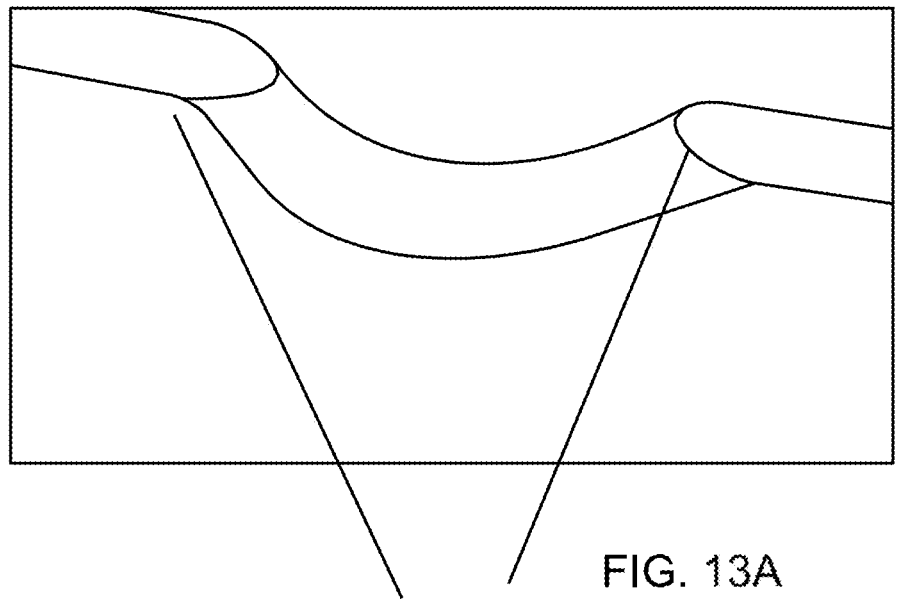
FIG. 13A shows a picture of a side view of a wafer notch and FIG. 13B shows a schematical top view of the wafer having a notch.
Figure 13B:
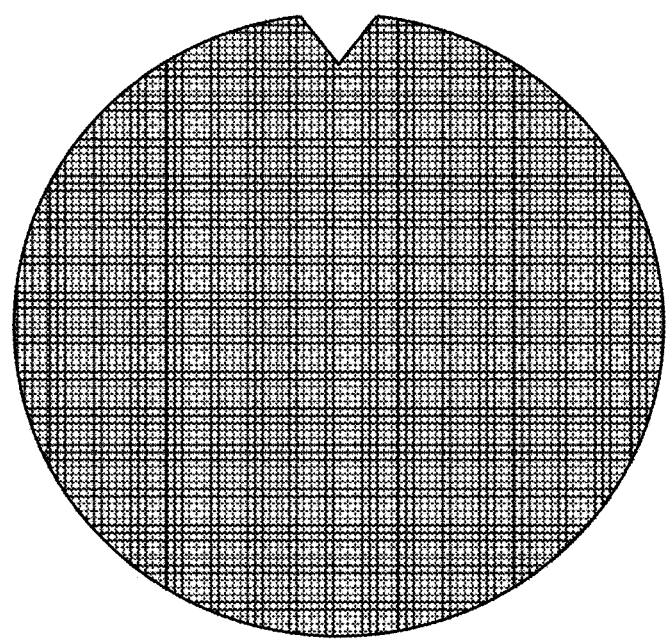

Most of the wafer inspection systems are using dedicated pre-aligning systems to define wafer notch/flat orientation. Reference is made to FIG. 13A showing a picture of a side view of a wafer notch and FIG. 13B shows a schematical top view of a wafer having a notch. The inspection tool system of the present disclosure may be used for wafer notch/flat orientation detection. FIG. 13C and FIG. 13D show a top view of a carrier layer 12'" having a notch and a flat, respectively. FIG. 13E and FIG. 13F show a top view of carrier layer 12'" on which a bonding layer 14'" having the same notch and flat has been deposited, respectively. The misalignment between carrier layer 12'" and bonding layer 14'" is clearly illustrated in the figures. The wafer edge area images obtained by using the inspection tool system of the present disclosure can be processed to detect the orientation of the wafer by detecting a notch or flat of the wafer. The location of the edge of the wafer also provides wafer position information. The detection of the notch or flat can be implemented by such means as deviation from circularity and pattern matching techniques. The edge of the wafer is expected to be circular and a flat (or a notch) provides a major deviation from this circular shape. By using the inspection tool system of the present disclosure, there is no need for a dedicated pre-aligning system and procedure required for wafer notch/flat orientation detection. In addition, it should be noted that the notch detection being related to glue residue in the notch area can interfere with the notch detection itself being performed by the top and or bottom cameras. In a multi-layer stack, notch dedication requires a bonding region sensor, regardless of glue residue, since the top and bottom cameras are not able to inspect all of the layers and/or all of the notches. The technique of the present disclosure enables to identify the glue residue in the notch.

Figure 14A:
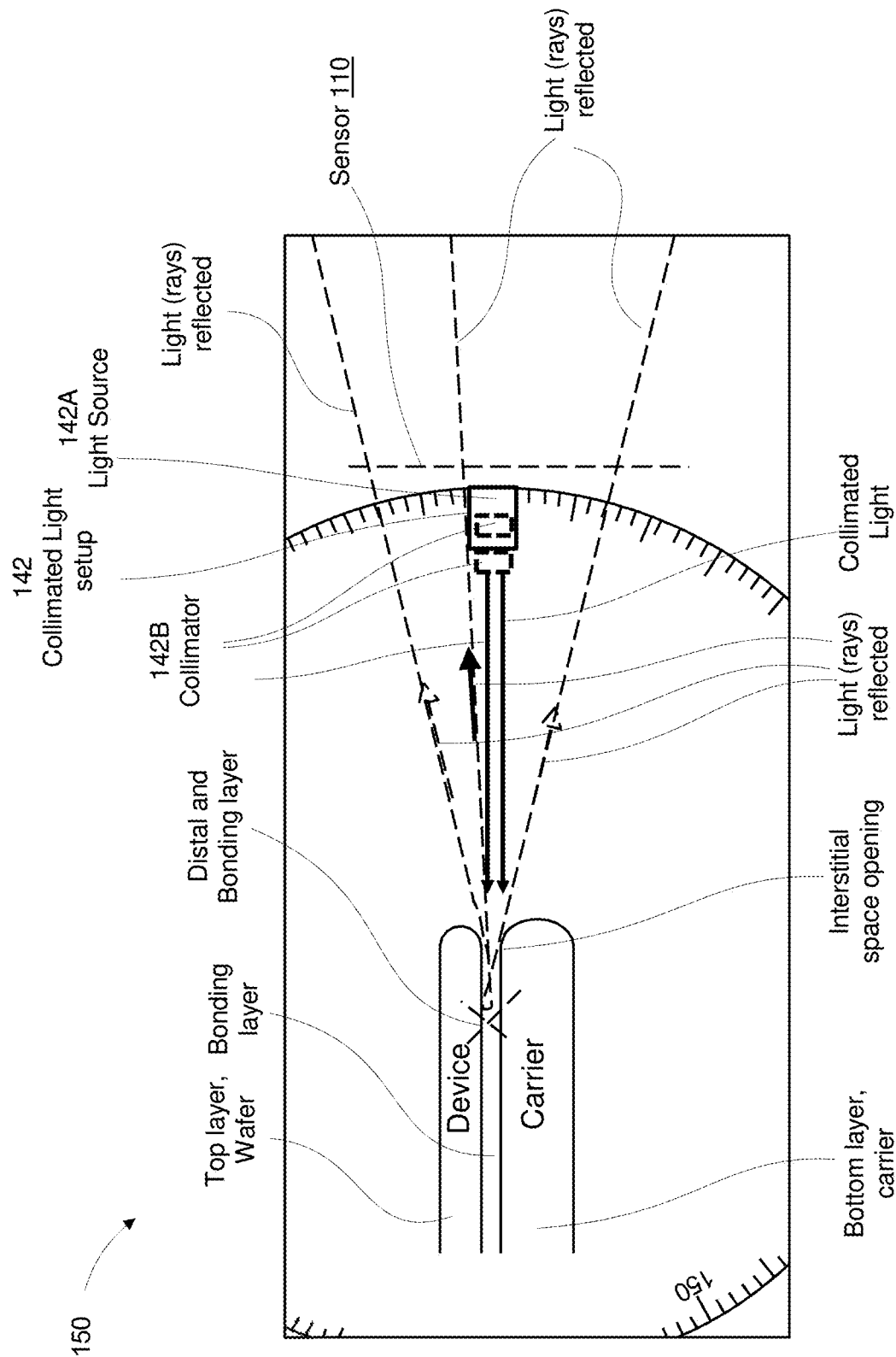
FIGS. 14A-14G show the results of light ray simulations being illuminated by different illumination configurations.
Figure 14B:
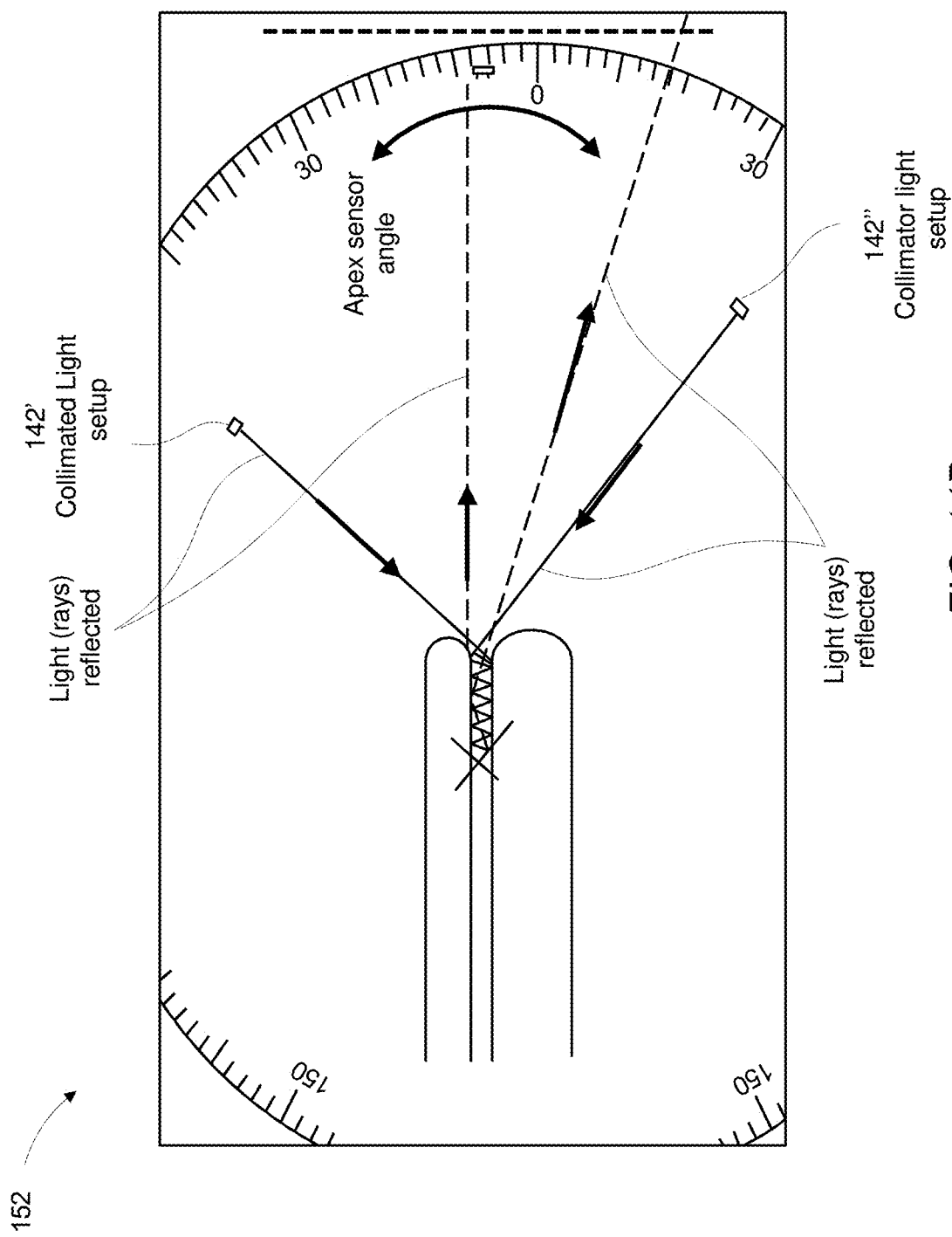
Figure 14C:
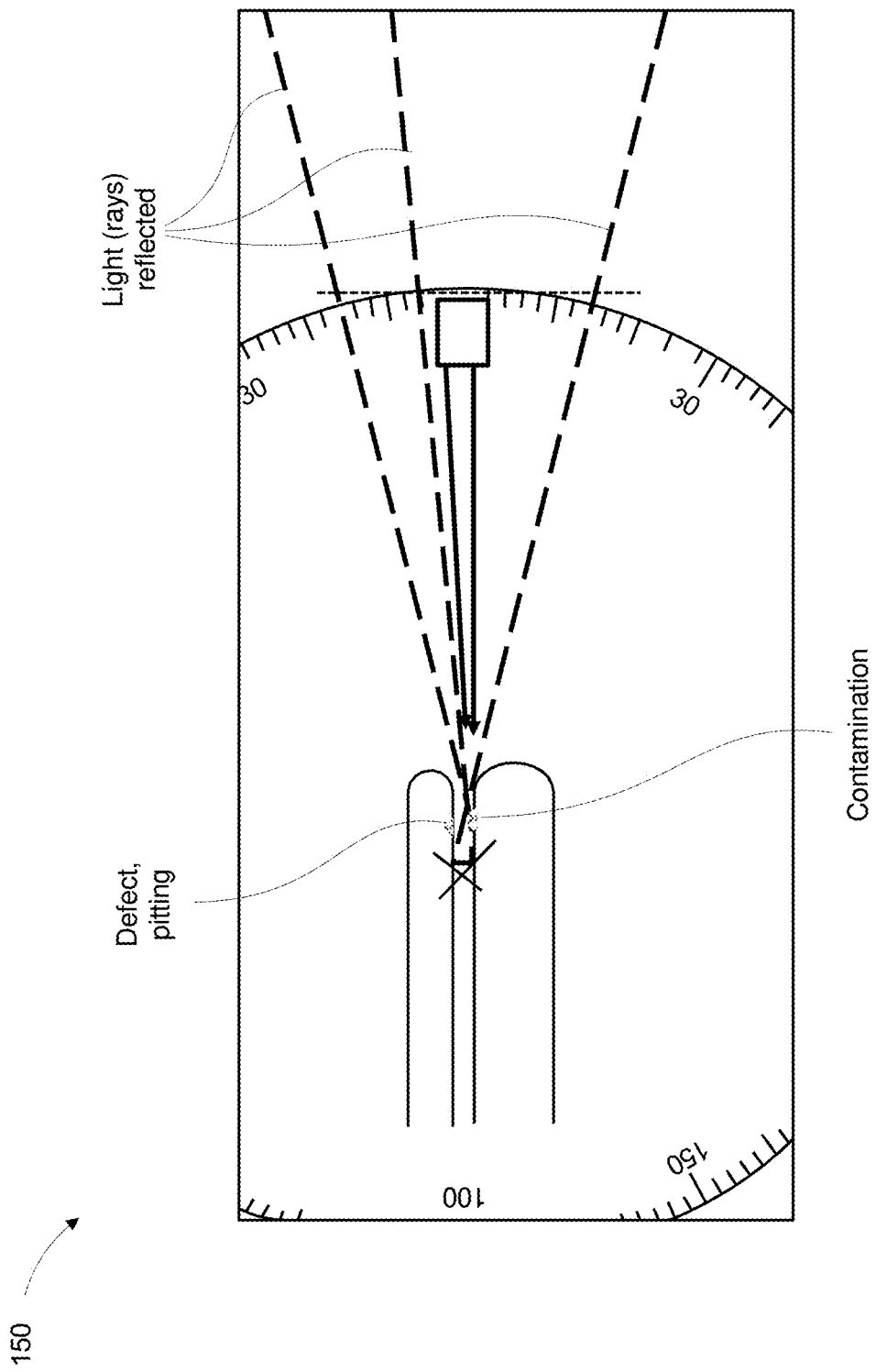
Figure 14E:
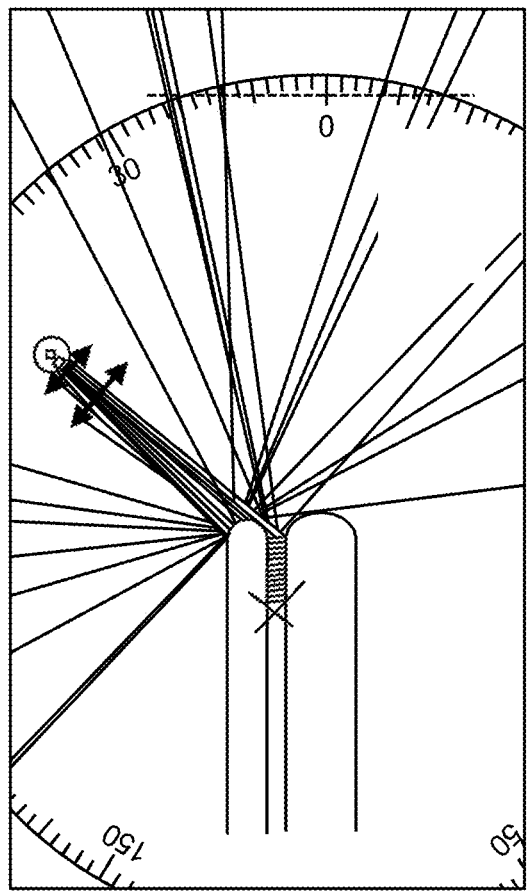
Figure 14D:
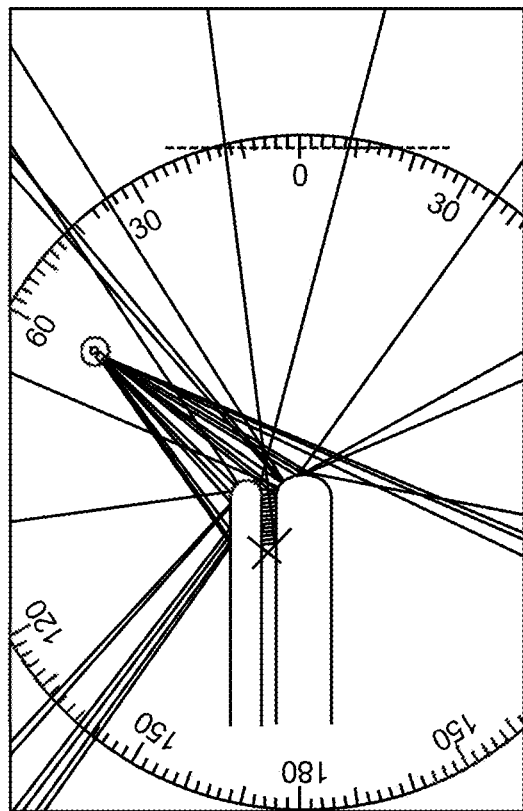
Figure 14G:
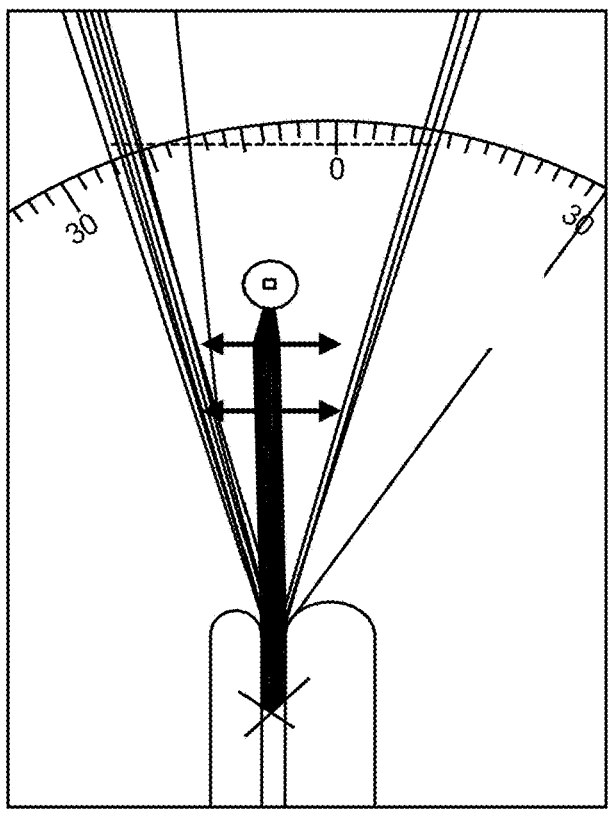
Figure 14F:
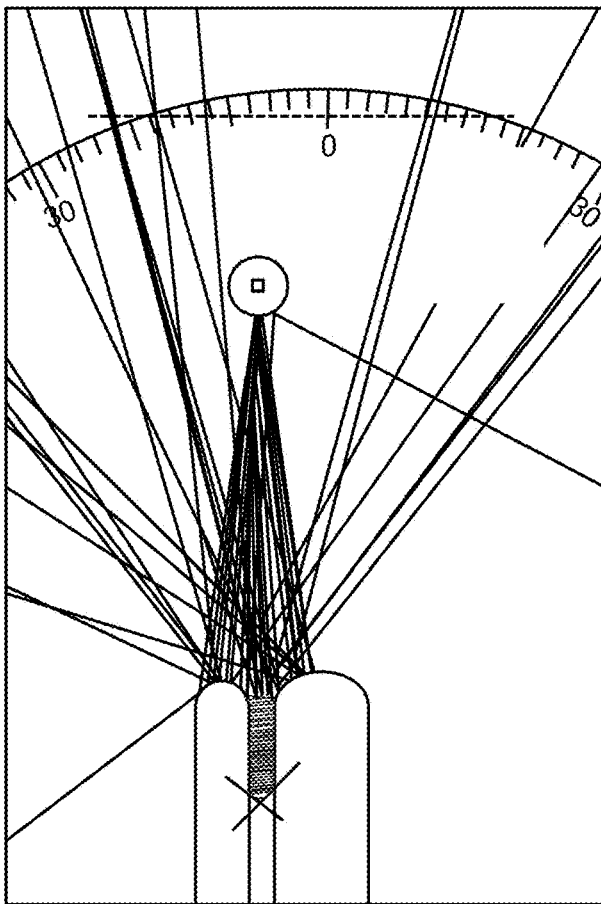

Reference is made to FIGS. 14A-14G showing the results of four different light ray simulations providing a pseudo-quantitative analysis. More specifically, FIG. 14A shows a simulation image presenting the top and bottom layers, the bonding layer including its distal end, and the interstitial space opening. In this specific and non-limiting example, a collimated light beam is directed towards the normal edge i.e., the interstitial space opening in the normal direction with the multi-stack's edge. Inspection tool system 150 may comprise any collimated light setup 142 emitting a collimated light beam including a light source 142A emitting a collimated beam (i.e., having an integrated collimator 142B) or a non-collimated light source being optically coupled to any collimator element 142B. The reflected light is collected by bonding region sensor unit 110. FIG. 14B shows a simulation of the same when the collimated beam(s) is directed toward the interstitial space opening in a non-normal (e.g., angular) direction with the multi-stack's edge. In this specific and non-limiting example, inspection tool system 152 may comprise a plurality of collimated light setup 142' and 142". Each collimated light setup 142' and 142" is configured and operable to generate and direct collimated beam(s) toward the interstitial space opening in a non-normal (e.g., angular) direction with the multi-stack's edge. FIG. 14C shows a simulation of a multi-stack having a defect (e.g., pitting) on the bottom surface of the top layer and contamination on the top surface of the bottom layer using inspection tool system 150 when the collimated beam(s) is directed towards the normal edge i.e., the interstitial space opening in a normal direction with the multi-stack's edge. FIG. 14D shows a simulation of a multi-stack being illuminated by a non-collimated beam(s). The non-collimated beam(s) is directed towards the interstitial space opening in a non-normal direction with the multi-stack's edge. FIG. 14E shows a simulation of the same multi-stack being illuminated by a collimated beam(s) being directed towards the interstitial space opening in a non-normal direction with the multi-stack's edge. FIG. 14F shows a simulation of a multi-stack being illuminated by a non-collimated beam(s). The non-collimated beam(s) is directed towards the interstitial space opening in a non-normal direction with the multi-stack's edge. FIG. 14G shows a simulation of the same multi-stack being illuminated by a collimated beam(s) being directed towards the normal edge i.e., the interstitial space opening in a normal direction with the multi-stack's edge.

The simulations provide information regarding the relative effect of some parameters, on the ability of light to enter the non-filled volume of the bonding region and to reflect out toward the bonding region sensor. The amount of light reflected onto the bonding region sensor may be quantified by the metric, P as illustrated in Table 1 below that presents the results of a comparative experiment with different configurations.

TABLE 1

| Light | Light source angle with respect to bonding region plane | Focusing means, e.g., optics | P |
| --- | --- | --- | --- |
| Non collimated | Angular | No | 1P |
|  |  | Yes | 3P |
|  | Near 0 angle | No | 4P |
|  |  | Yes | 11P |

As indicated in the table and in FIGS. 14A-14G, the P value is significantly larger when the light source is in the plane of the bonding region. The P value is significantly larger when the light is focused toward the bonding region non-filled volume. In the simulation, the light was focused on the midline/mid-height of the bonding region non-filled volume. The light can be focused on a point external to the bonding region opening or within the bonding region. The simulations above show that a collimated beam increases the P value. Moreover, a beam, with a diameter that is smaller than the bonding region thickness increases the P value. However, these correlations also depend on geometrical and material properties (e.g., refractive index, reflectance properties, etc.) and also on illumination flux properties (intensity, collimation quality, spectral distribution, etc.).

Figure 15A:
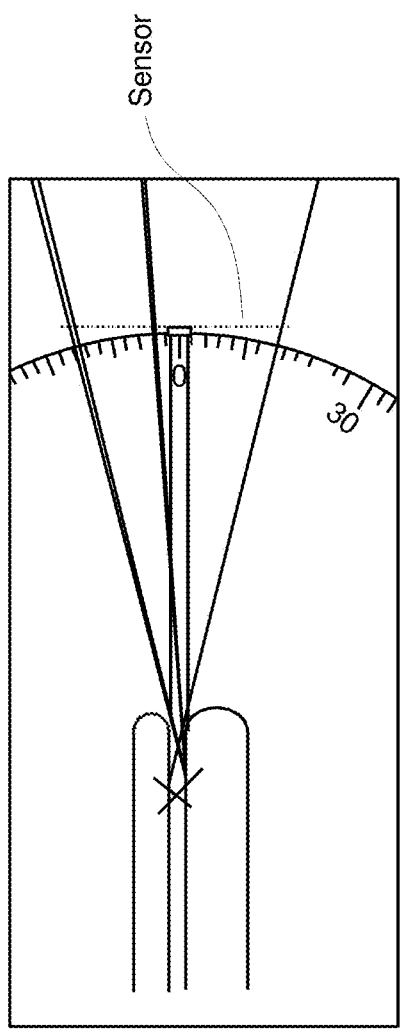
FIGS. 15A-15C show the results of light ray simulations for a multi-stack without any contamination (FIG. 15A), for a multi-stack having a defect (FIG. 15B), and a multi-stack having contamination (FIG. 15C)
Figure 15C:
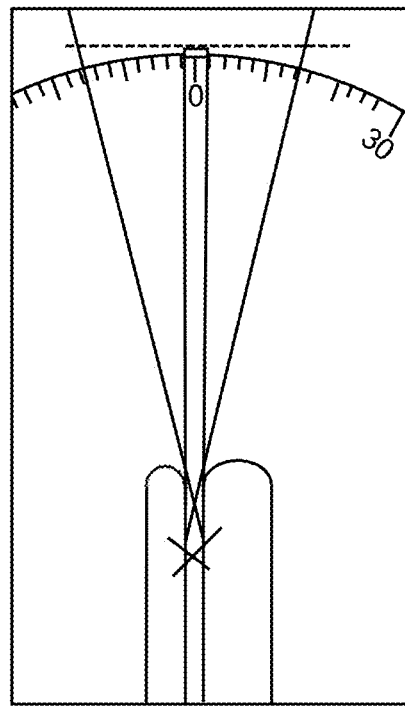
Figure 15B:
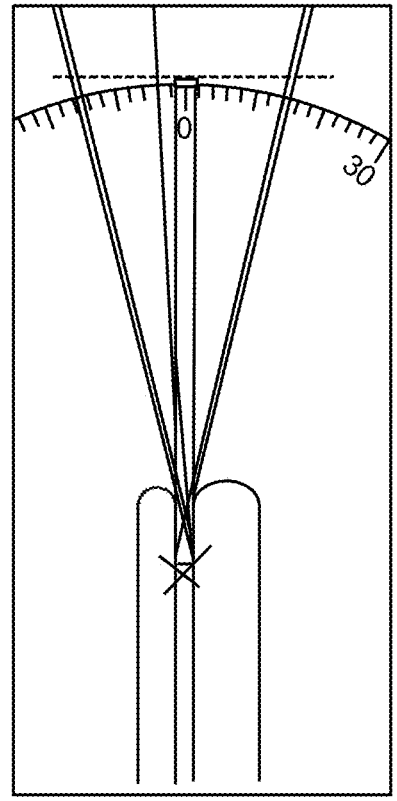

FIG. 15A shows a simulation of the multi-stack having no contamination being illuminated by a collimated beam(s) being directed towards the normal edge i.e., the interstitial space opening in a normal direction with the multi-stack's edge. In this specific and non-limiting example, the P value is 3P. FIG. 15B shows a simulation of the multi-stack having a defect (e.g., pitting) being inspected by an inspection tool system having the same configuration. In this specific and non-limiting example, the P value is 2.5P. FIG. 15C shows a simulation of the multi-stack having contamination being inspected by an inspection tool system having the same configuration. In this specific and non-limiting example, the P value is 1.5P. Therefore, it is clear that no contamination reflects much more light at the bonding region sensor. A defect or contamination decreases the P value. The measurement of the P value is this one way to identify a defect or contamination.

Figure 16:
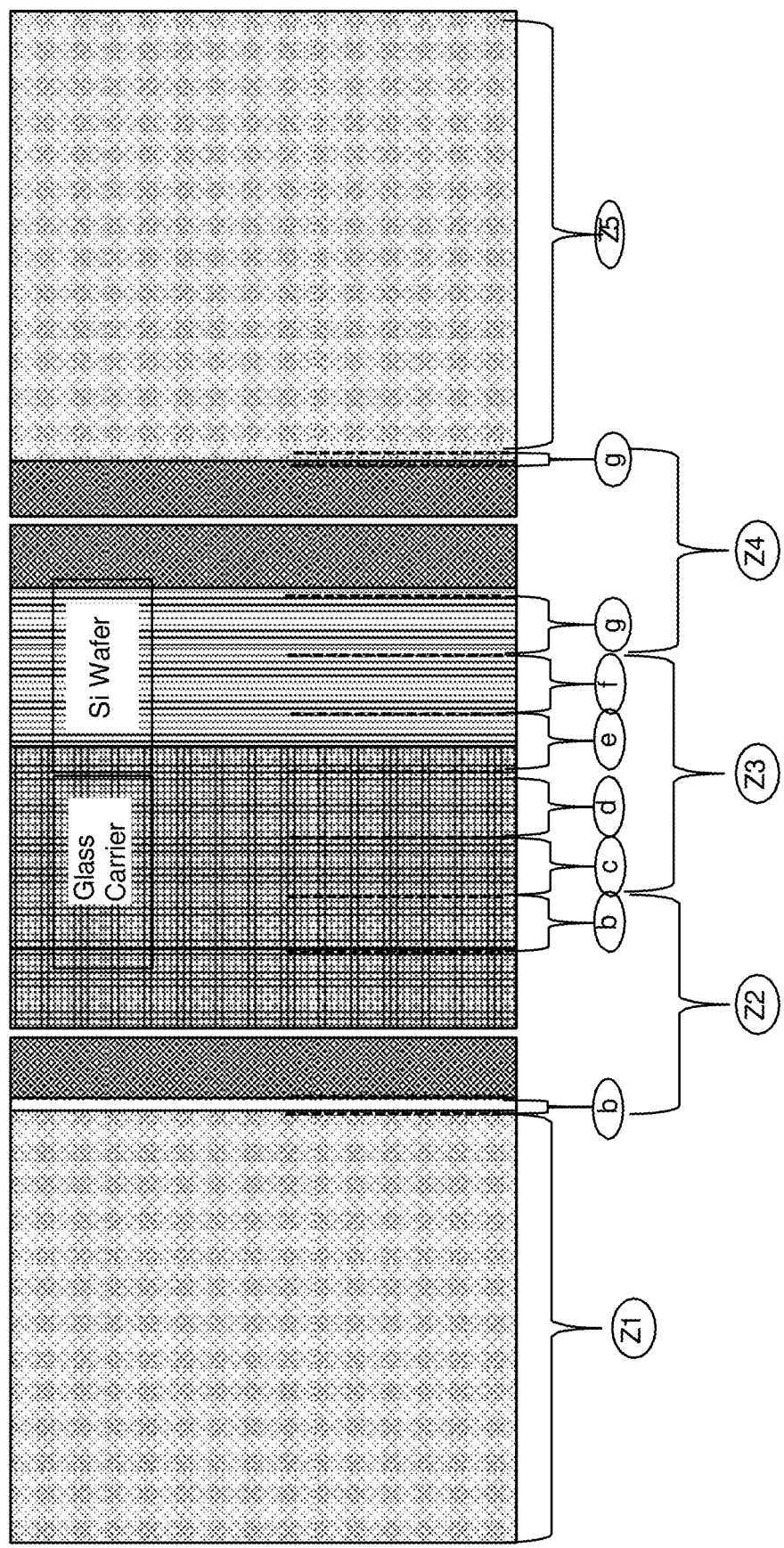
FIG. 16 shows a picture of a side view of a multi-stack acquired by using the inspection tool system according to some embodiments of the present disclosure.

Reference is made to FIG. 16 showing a picture of a side view of a multi-stack acquired by using the inspection tool system according to some embodiments of the present disclosure. The picture clearly shows the plurality of zones z1-z5 corresponding to the multi-layer stack edge zones and the plurality wafer edge zones b to g corresponding to the different stacked layer edge zones as defined above with respect to FIG. 7A. The technique of the present disclosure thus enables to provide a picture of the bonding region in which each region is a distinguishable picture to thereby identify layer data being related to each region at the level of the layer itself and/or for the multi-layer stack.

Figure 17:
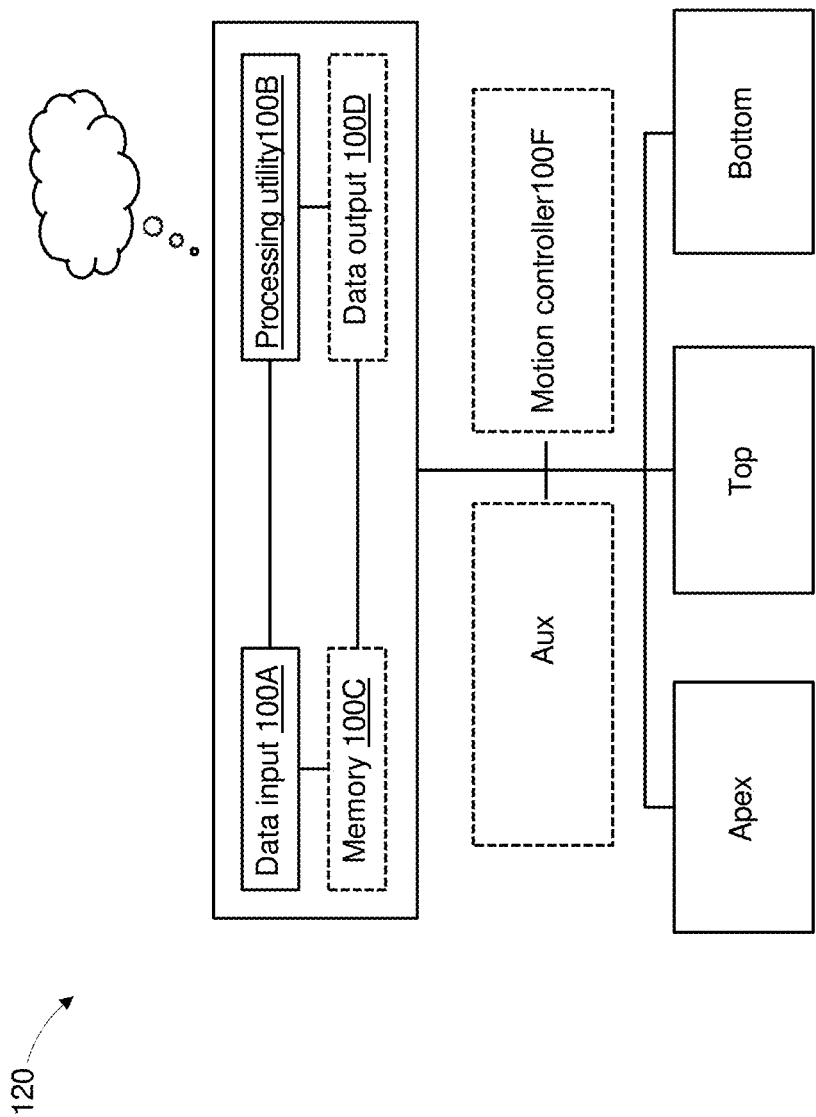
FIG. 17 is a block diagram representing the main functional parts of the processing unit according to some embodiments of the present disclosure.

Reference is made to FIG. 17 showing a general functional block diagram of a processing unit 120. In some embodiments, the processing unit 120 is configured in a cloud-based configuration and/or utilizes Internet-based computing so that parts of processing utility 100B, and/or memory 100C may reside in multiple distinct geographic locations. The processing unit 120 may comprise a general-purpose computer processor, which is programmed in software to carry out the functions described herein below. It may be implemented by any hardware being capable of receiving, accumulating, processing, analyzing, and storing data. Unless specifically stated otherwise, as apparent from the following discussions, it is appreciated that throughout the specification discussions utilizing terms such as "determining", "processing" or the like, refer to the action and/or processes of a computer that manipulate and/or transform data into other data. Also, operations in accordance with the teachings herein may be performed by a computer specially constructed for the desired purposes, or by a general-purpose computer specially configured for the desired purpose by a computer program stored in a computer-readable storage medium. The computerized system may include one or more processors and may also include additional units or components such as memory units, communication units, and the like. It should thus be understood that the term "processing unit" should be interpreted broadly, covering local controllers (data analyzers) in data communication with the sensor unit/system, as well as cloud computing-based system. The functionality of the processing unit may be executed by any type of computer—one or more servers, one or more computers, may be operated in a centralized or distributed manner. The processing unit 120 may be located in the inspection system, or in a central location, or being cloud-based. In some embodiments, the control unit may also comprise a motion control module being configured and operable to control the position of the different elements in the system. The processing unit 120 also includes a data input utility 100A including a communication module for receiving images from the bonding region sensor and may also include a data output utility 100D for relaying defect data and variations along the edge of wafer. Memory 100C (i.e., non-volatile computer-readable medium) 100C may be configured for storing the input/output data, in a database. The database may be a cloud-based system. Processing utility 100B is configured and operable to analyze at least one sensing data (e.g., images) and/or determine layer data to thereby identify different types of defect data and variations along the edge of the wafer.

Processing unit 120 may include a motion controller 100F being configured and operable to control the positioning of at least one of (i) at least some elements of the illumination setup, (ii) the bonding region sensor to be in the plane of the bonding region or (iii) the wafer stack and the bonding region to be in the plane of the light source and/or of the bonding region sensor. All the parts of the processing unit or some of them may be independent stand-alone modules or may be integrated into the different elements of the system such as the bonding region sensor or the illumination setup.

In some embodiments, processing unit 120 may be configured and operable to at least one of controlling the operation (start and end time and duration) of the light sources of each illumination setup and the synchronization between them (simultaneously, sequentially (with a certain time gap between them), overlapping . . . ). Therefore, according to another aspect of the present disclosure, there is a provided a processing unit to be used with an inspection system comprising a bonding region sensor and two illumination setups with different illumination beam properties, wherein each illumination setup comprises a light source operable simultaneously or sequentially in the following sequences:

One at a time, the light source of the first illumination setup is powered and operates for a certain duration and then the light source of the second illumination setup is powered and operates a certain duration. The two illumination sources are thus not powered at the same time.

In an embodiment, there is a time-gap between the ON state of the first illumination source and the ON state of the second illumination source. In an embodiment, the time-gap is effectively zero. In an embodiment, the time-gap is a certain time period.

In some embodiments, the two illumination sources are ON at the same time, for a certain duration. The first illumination source is ON for a first duration and the second illumination source is ON for a second duration. The start and end time of the first and second durations in which the illumination sources are ON does not coincide.

In some embodiments, the two illumination sources are both ON for the same duration. The start and end time of the duration in which the illumination sources are ON coincides.

In some embodiments, only one illumination source is ON at any given time. For example, in a system with N illumination sources, the first illumination source is ON for a certain duration, the second illumination source is ON for a certain duration, and so on.

The invention claimed is:

1. A semiconductor inspection tool system comprising:
a first illumination setup being configured and operable to generate at least one first illumination radiation and to direct the at least one first illumination radiation to at least one bonding region non-filled volume being formed between two layers of a multi-layer stack;
a second illumination setup being configured and operable to generate at least one second illumination radiation and to direct the at least one second illumination radiation at multi-layer stack edges, the at least one second illumination radiation being configured for illuminating at least a normal edge of at least one layer, wherein the second illumination setup has different radiation parameters than the first illumination setup; and
a bonding region sensor unit being configured and operable for collecting reflected electromagnetic radiation from a bonding region volume during more than one rotation of the multi-layer stack and generating at least one sensing data being indicative of the bonding region.

2. The semiconductor inspection tool system of claim 1, further comprises a processing unit being connectable to said bonding region sensor unit; wherein said processing unit is configured and operable to receive data indicative of the reflected electromagnetic radiation being collected during more than one rotation of the multi-layer stack.

3. The semiconductor inspection tool system of claim 2, wherein the processing unit is configured and operable to receive an output data being indicative of said more than one rotations and generate an image being indicative of at least one apex surface of a layer within the multi-layer stack including at least one bevel of a layer within the multi-layer stack.

4. The semiconductor inspection tool system of claim 3, wherein the processing unit is configured and operable to receive an output data being indicative of at least two rotations of the multi-layer stack being at different focus positions and generate an all-in-focus image being indicative of at least one section of the apex surface of the multi-layer stack.

5. The semiconductor inspection tool system of claim 2, wherein said processing unit comprises a control unit being configured and operable to control the positioning and the operation of at least one of (i) at least some elements of the at least first or second illumination setups, (ii) the bonding region sensor unit including at least one of the bonding region sensor or optical elements directing reflected radiation towards the bonding region sensor if any, or (iii) the multi-layer stack and the bonding region.

6. The semiconductor inspection tool system of claim 5, wherein the control unit is configured and operable to vary an exposure rate of the bonding region sensor unit and other exposure related parameters of the bonding region sensor unit or of the elements of the at least first or second illumination setups.

7. The semiconductor inspection tool system of claim 5, wherein the control unit is configured and operable to vary an exposure rate of the bonding region sensor unit and other exposure related parameters of the bonding region sensor unit and/or of the elements of the at least first or second illumination setups during the same or different rotations of said more than one rotations.

8. The semiconductor inspection tool system of claim 1, wherein said bonding region sensor unit comprises at least one of (i) an apex sensor being configured and operable to collect radiation reflected from at least one region including an apex region of a layer of a multi-layer stack, the reflected radiation being directed at a normal direction with the edge of the multi-layer stack of a wafer or (ii) a side sensor being configured and operable to collect reflected electromagnetic radiation from the bonding region being directed at a non-normal direction with the edge of the multi-layer stack of a wafer.

9. The semiconductor inspection tool system of claim 8, wherein the apex region defines at least one of the following regions: an apex surface in the bonding region non-filled volume, an apex surface in the non-bonded region, an apex surface on the distal edge of the bonding layer, a top bevel or a bottom bevel.

10. The semiconductor inspection tool system of claim 8, wherein the apex sensor is capable of being positioned facing a center of the multi-layer stack, such that the focal plane of the apex sensor is placed at one of the following positions: at the distal end of the bonding region volume, or at the distal end of the bonding region non-filled volume within the field of view of the apex sensor.

11. The semiconductor inspection tool system of claim 10, wherein the apex sensor is capable of being positioned such that the center of the field of view of the apex sensor is directed at the distal end of the bonding region volume.

12. The semiconductor inspection tool system of claim 8, wherein the apex sensor is configured and operable to collect radiation reflected from a top or bottom flat region.

13. The semiconductor inspection tool system of claim 8, wherein said side sensor is configured and operable to be positioned at an angle in the range up to about +/−80 deg with the normal direction.

14. The semiconductor inspection tool system of claim 1, further comprising an optical element being placed at the edge of the multi-layer stack and being configured and operable to deviate the path of the reflected electromagnetic radiation and direct the reflected electromagnetic radiation to reach said bonding region sensor unit.

15. The semiconductor inspection tool system of claim 14, wherein said optical element includes at least one of an optical lens, a beam splitter, a mirror, a prism, a reflective surface, light pipe or a fiber optic cable.

16. The semiconductor inspection tool system of claim 14, wherein said first illumination setup is oriented opposite to the bonding region sensor's optical axis with respect to the normal direction of the edge of the multi-layer stack of a wafer to enable concurrent illumination and collection of reflected electromagnetic radiation.

17. The semiconductor inspection tool system of claim 1, wherein said first illumination setup is configured and operable to generate at least one first illumination radiation having a main direction defining a non-zero angle with a bonding region center plane.

18. The semiconductor inspection tool system of claim 1, wherein at least one of said first illumination setup and said second illumination setup is arranged along an illumination arc.

19. The semiconductor inspection tool system of claim 1, wherein at least one of said first illumination setup and said second illumination setup comprises at least one guiding element connected to a light source; each of said at least one guiding element being configured and operable to direct the first or the second light radiation towards a certain bonding region of the multi-layer stack.

20. The semiconductor inspection tool system of claim 1, wherein at least one of said first illumination setup and said second illumination setup is configured and operable to generate a collimated light beam.

21. The semiconductor inspection tool system of claim 20, wherein each of at least one of said first illumination setup and said second illumination setup comprises at least one of a light source emitting at least one collimated light beam or a non-collimated light source being optically coupled to any collimator element.

22. The semiconductor inspection tool system of claim 21, wherein each of said at least one of said first illumination setup and said second illumination setup is configured and operable to direct the at least one collimated or non-collimated beams towards an interstitial space opening in a normal or non-normal direction with a multi-layer stack's edge.

23. The semiconductor inspection tool system of claim 1, wherein said bonding region sensor unit is configured and operable to collect reflected electromagnetic radiation from the bonding region volume being directed at a normal or non-normal direction with an edge of the multi-layer stack of wafer.

24. The semiconductor inspection tool system of claim 23, wherein said bonding region sensor unit is configured and operable to be positioned at at least one of the following positions: at an off-normal angle or to the side of at least one of the first or the second illumination setups.

25. A method for inspection comprising:
generating at least one first illumination radiation and directing the at least one first illumination radiation to at least one bonding region non-filled volume being formed between two layers of a multi-layer stack;
generating at least one second illumination radiation and directing the at least one second illumination radiation at multi-layer stack edges, the at least one second illumination radiation being configured for illuminating at least a normal edge of at least one layer, wherein the at least one second illumination radiation has different radiation parameters than the first illumination radiation;
collecting reflected electromagnetic radiation from a bonding region volume during more than one rotation of the multi-layer stack and generating at least one sensing data being indicative of the bonding region.

26. The method of claim 25, further comprising receiving an output data being indicative of said more than one rotations and generating an image being indicative of at least one apex surface of a layer with a multi-layer stack including at least one bevel of a layer within the multi-layer stack.

27. The method of claim 26, further comprising receiving an output data being indicative of at least two rotations being at different focus positions and generate an all-in-focus image being indicative of at least one section of the apex surface of the multi-layer stack.

28. The method of claim 27, further comprising varying an exposure rate of the bonding region sensor unit and other exposure related parameters of the bonding region sensor unit or of the elements of at least a first or second illumination setups during the same or different rotations.

29. The method of claim 28, wherein the collecting of the reflected electromagnetic radiation from the bonding region volume comprises collecting radiation reflected from at least one region including an apex region of a layer of the multi-layer stack.

30. The method of claim 29, wherein the apex region defines at least one of the following regions: an apex surface in the bonding region non-filled volume, an apex surface in the non-bonded region, an apex surface on the distal edge of the bonding layer, a top bevel or a bottom bevel.

31. The method of claim 30, wherein generating the at least one first illumination radiation and collecting the reflected electromagnetic radiation from a bonding region volume are performed substantially simultaneously.

* * * * *